US008754399B2

(12) United States Patent
Tanaka et al.

(10) Patent No.: US 8,754,399 B2
(45) Date of Patent: Jun. 17, 2014

(54) ORGANIC ELECTROLUMINESCENCE ELEMENT, ORGANIC ELECTROLUMINESCENCE DEVICE, ORGANIC EL DISPLAY DEVICE, AND ORGANIC EL LIGHTING

(71) Applicants: Futoshi Tanaka, Kanagawa (JP); Kazuki Okabe, Kanagawa (JP); Atsushi Takahashi, Kanagawa (JP)

(72) Inventors: Futoshi Tanaka, Kanagawa (JP); Kazuki Okabe, Kanagawa (JP); Atsushi Takahashi, Kanagawa (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 13/736,423

(22) Filed: Jan. 8, 2013

(65) Prior Publication Data

US 2013/0134402 A1 May 30, 2013

Related U.S. Application Data

(63) Continuation of application No. PCT/JP2011/065598, filed on Jul. 7, 2011.

(30) Foreign Application Priority Data

Jul. 8, 2010 (JP) ................................. 2010-155918

(51) Int. Cl.
 *H01L 31/02* (2006.01)
(52) U.S. Cl.
 USPC .......... 257/13; 257/40; 257/79; 257/E33.061; 257/E51.018
(58) Field of Classification Search
 USPC ......................................... 257/13, 40, 51.018
 See application file for complete search history.

(56) References Cited

U.S. PATENT DOCUMENTS

| 6,121,727 | A * | 9/2000 | Kanai et al. ................... 313/504 |
| 6,812,638 | B2 * | 11/2004 | Wakimoto et al. ............ 313/505 |
| 7,038,372 | B2 * | 5/2006 | Yuki et al. ..................... 313/504 |
| 7,045,953 | B2 * | 5/2006 | Nakayama et al. ........... 313/504 |
| 7,128,982 | B2 | 10/2006 | Oshiyama et al. |
| 7,431,624 | B2 * | 10/2008 | Maeda et al. ..................... 445/6 |

(Continued)

FOREIGN PATENT DOCUMENTS

| JP | 2004-6287 | 1/2004 |
| JP | 2005-26210 | 1/2005 |

(Continued)

OTHER PUBLICATIONS

International Search Report issued Aug. 16, 2011 in Application No. PCT/JP2011/065598 (With English Translation).

*Primary Examiner* — Michael Lebentritt
(74) *Attorney, Agent, or Firm* — Oblon, Spivak, McClelland, Maier & Neustadt, L.L.P.

(57) ABSTRACT

The present invention relates to an organic electroluminescence element which comprises an anode, a luminescent layer, two or more electron transport layers and a cathode, in this order, wherein at least one of the two or more electron transport layers adjoins the luminescent layer, the luminescent layer contains a luminescent material and a charge transport material, the electron transport layer which adjoins the luminescent layer contains a charge transport material, the charge transport material contained in the luminescent layer and the charge transport material contained in the electron transport layer which adjoins the luminescent layer may be the same material or may be different material, and the specific electron affinities EA1, EA2 and EA3, and the specific work function WF satisfy the specific relationship.

10 Claims, 1 Drawing Sheet

(56) References Cited

U.S. PATENT DOCUMENTS

| | | | |
|---|---|---|---|
| 7,724,796 B2* | 5/2010 | Forrest et al. | 372/46.01 |
| 2003/0015805 A1* | 1/2003 | Wakimoto et al. | 257/794 |
| 2006/0105202 A1 | 5/2006 | Kitamura | |
| 2006/0263636 A1 | 11/2006 | Ohsawa et al. | |
| 2007/0015008 A1 | 1/2007 | Oshiyama et al. | |
| 2008/0054794 A1 | 3/2008 | Hatanaka et al. | |
| 2009/0033211 A1 | 2/2009 | Tanabe et al. | |
| 2009/0079338 A1* | 3/2009 | Mori et al. | 313/504 |
| 2009/0128024 A1* | 5/2009 | Fukuoka et al. | 313/504 |
| 2010/0051902 A1* | 3/2010 | Hiura et al. | 257/13 |
| 2011/0101401 A1 | 5/2011 | Aratani et al. | |
| 2011/0298360 A1 | 12/2011 | Ohsawa et al. | |
| 2012/0018709 A1* | 1/2012 | Terao | 257/40 |
| 2013/0020562 A1* | 1/2013 | Iida et al. | 257/40 |

FOREIGN PATENT DOCUMENTS

| | | |
|---|---|---|
| JP | 2006-173588 | 6/2006 |
| JP | 2006-352102 | 12/2006 |
| JP | 2007-266160 | 10/2007 |
| JP | 2007-302630 | 11/2007 |
| JP | 2008-502124 | 1/2008 |
| JP | 2008-294200 | 12/2008 |
| JP | 2010-108921 | 5/2010 |
| WO | WO 2008/146800 A1 | 12/2008 |
| WO | WO 2009/154168 | 12/2009 |

* cited by examiner

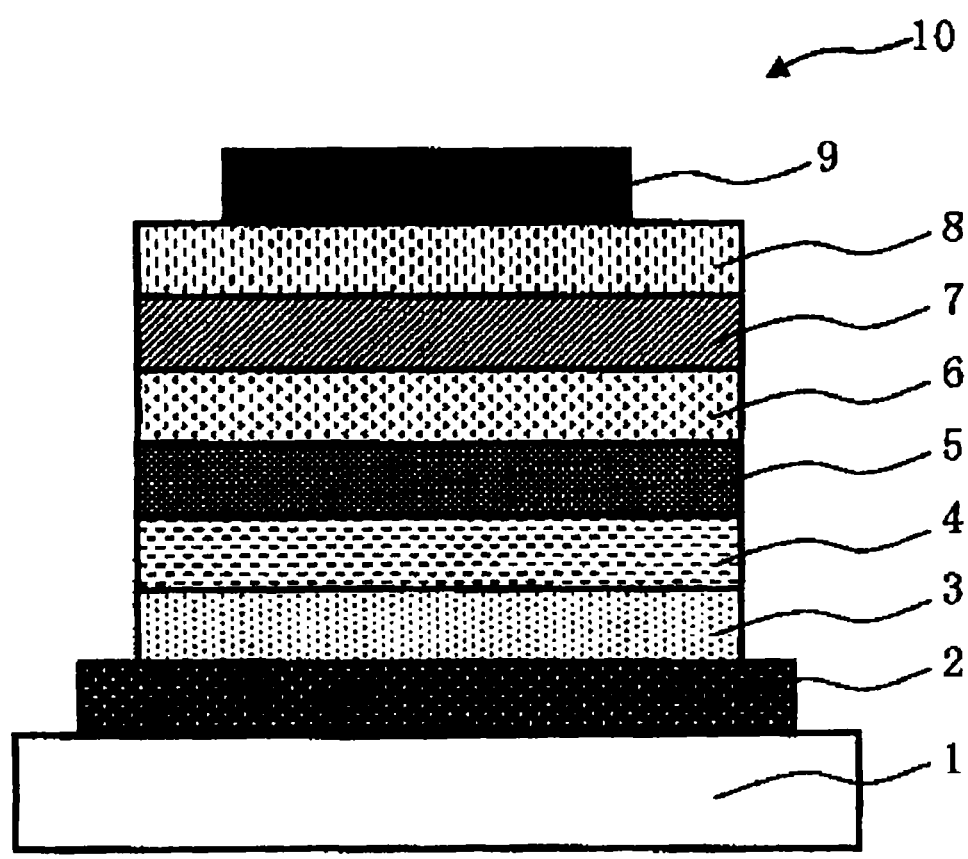

ORGANIC ELECTROLUMINESCENCE ELEMENT, ORGANIC ELECTROLUMINESCENCE DEVICE, ORGANIC EL DISPLAY DEVICE, AND ORGANIC EL LIGHTING

TECHNICAL FIELD

The present invention relates to an organic electroluminescence element and an organic electroluminescence device, an organic EL display device, and an organic EL lighting which each include the element.

BACKGROUND ART

Organic electroluminescence elements are being developed enthusiastically in order to use the elements in applications such as displays and lightings. An organic electroluminescence element is usually configured at least of a pair of electrodes and an organic luminescent layer interposed therebetween. The organic electroluminescence element emits light usually by the following mechanism. An electric field is applied between the electrodes and, as a result, electrons and holes are injected respectively from the cathode and the anode into the luminescent layer, where the electrons recombine with the holes to yield excitons, which cause the element to emit light.

However, since the charge injection into the luminescent layer necessitates a large amount of energy, a high voltage is necessary for causing the organic electroluminescence element to luminesce at a high luminance. In addition, the life of the element is short.

Under these circumstances, patent document 1 discloses a technique in which a plurality of electron transport layers are disposed between a luminescent layer and an electrode and the electron affinity of each layer is regulated so as to satisfy [(electron affinity of the luminescent layer)<(electron affinity of the electron transport layer which adjoins the luminescent layer)<(electron affinity of the electron transport layer which is the second layer from the luminescent layer)< . . . (electron affinity of the electron transport layer which is the n-th layer from the luminescent layer)], thereby enhancing charge injection and improve operation durability.

PRIOR-ART DOCUMENT

Patent Document

Patent Document 1: JP-A-2006-173588

SUMMARY OF THE INVENTION

Problems that the Invention is to Solve

However, with the technique disclosed in patent document 1, it has still been impossible to obtain an organic electroluminescence element having sufficient performance. There is a desire for development of an organic electroluminescence element which has a longer life and a higher efficiency. A subject for the invention is to provide an organic electroluminescence element having a long life and a high luminescent efficiency and to provide an organic electroluminescence device, an organic EL display device, and an organic EL lighting which include the element.

Means for Solving the Problems

The present inventors diligently made investigations in order to overcome the problems. As a result, the inventors have unexpectedly found that an organic electroluminescence element having a longer life and a higher luminescent efficiency is obtained not by a configuration that satisfies [(absolute value of the electron affinity of the luminescent layer)< (absolute value of the electron affinity of the electron transport layer which adjoins the luminescent layer)], which has hitherto been thought to be effective, but by a configuration that satisfies both [(absolute value of the electron affinity of the luminescent layer)≥(absolute value of the electron affinity of the electron transport layer which adjoins the luminescent layer)] and [(absolute value of the work function of the cathode)≥(absolute value of the electron affinity of the electron transport layer located on the most cathode side)]. The invention has been thus completed.

Namely, a first gist of the invention is an organic electroluminescence element which comprises an anode, a luminescent layer, two or more electron transport layers and a cathode, in this order, wherein at least one of the two or more electron transport layers adjoins the luminescent layer, the luminescent layer contains a luminescent material and a charge transport material, the electron transport layer which adjoins the luminescent layer contains a charge transport material, the charge transport material contained in the luminescent layer and the charge transport material contained in the electron transport layer which adjoins the luminescent layer may be the same material or may be different material, when an electron affinity of the charge transport material which serves to transport electrons, among the charge transport materials contained in the luminescent layer, is expressed by EA1, and an electron affinity of the charge transport material which is the highest in an absolute value of electron affinity, among the charge transport materials contained in the electron transport layer that adjoins the luminescent layer, is expressed by EA2, then EA1 and EA2 satisfy the relationship represented by the following expression (1), and when an electron affinity of the charge transport material which is the highest in an absolute value of electron affinity, among the charge transport materials contained in the electron transport layer located on the most cathode side among the two or more electron transport layers, is expressed by EA3, and a work function of the cathode is expressed by WF, then EA3 and WF satisfy the relationship represented by the following expression (2):

$$0.00 \text{ eV} \leq |EA1| - |EA2| \leq 0.20 \text{ eV} \qquad \text{Expression (1)}$$

$$-1.60 \text{ eV} \leq |WF| - |EA3| \leq 1.60 \text{ eV}. \qquad \text{Expression (2)}$$

A second gist of the invention is the organic electroluminescence element according to the first gist, wherein the electron affinity EA1 and the electron affinity EA2 satisfy the relationship represented by the following expression (3):

$$0.00 \text{ eV} \leq |EA1| - |EA2| \leq 0.20 \text{ eV}. \qquad \text{Expression (3)}$$

A third gist of the invention is the organic electroluminescence element according to the first or second gist, wherein the electron affinity EA3 and the work function WF satisfy the relationship represented by the following expression (4):

$$0.00 \text{ eV} \leq |WF| - |EA3| \leq 1.60 \text{ eV}. \qquad \text{Expression (4)}$$

A fourth gist of the invention is the organic electroluminescence element according to any one of the first gist to the third gist, wherein the electron transport layer which adjoins the luminescent layer contains a charge transport material that is different from the charge transport material contained in the luminescent layer.

A fifth gist of the invention is the organic electroluminescence element according to any one of the first gist to the fourth gist, wherein the luminescent layer is a layer formed by a wet film formation method.

A sixth gist of the invention is an organic electroluminescence device which comprises a substrate and, disposed thereon, two or more organic electroluminescence elements that have a different color of luminescence from each other, wherein at least one of the organic electroluminescence elements is the organic electroluminescence element according to any one of the first gist to the fifth gist.

A seventh gist of the invention is the organic electroluminescence device according to the sixth gist, wherein all of the organic electroluminescence elements are the organic electroluminescence element according to any one of claims 1 to 5.

An eighth gist of the invention is the organic electroluminescence device according to the sixth or seventh gist, wherein the electron transport layers adjoining the luminescent layer in at least two of the organic electroluminescence elements are identical.

A ninth gist of the invention is an organic EL display which comprises the organic electroluminescence element according to any one of the first gist to the fifth gist.

A tenth gist of the invention is an organic EL lighting which comprises the organic electroluminescence element according to any one of the first gist to the fifth gist.

Effects of the Invention

According to the invention, an organic electroluminescence element having a long life and a high luminescent efficiency is provided.

Since the organic electroluminescence element of the invention has a high current efficiency and a long working life, the element is thought to be applied to flat-panel displays (e.g., displays for OA (office automation) computers and wall-mounting TVs), light sources which take advantage of the feature of a surface light emitter (e.g., the light sources of copiers and the backlights of liquid-crystal displays or instruments), display panels, and marker lamps. This organic electroluminescence element hence has a high technical value.

BRIEF DESCRIPTION OF THE DRAWING

FIG. 1 is a sectional view which diagrammatically shows an example of the structure of an organic electroluminescence element of the invention.

MODES FOR CARRYING OUT THE INVENTION

The invention will be explained below in detail. However, the invention should not be construed as being limited to the following explanation, and can be variously modified unless the modifications depart from the spirit of the invention.

[Organic Electroluminescence Element]

The organic electroluminescence element of the invention is an organic electroluminescence element at least including an anode, a luminescent layer, two or more electron transport layers, and a cathode in this order, and is characterized in that at least one of the electron transport layers adjoins the luminescent layer, the luminescent layer contains a luminescent material and one or more charge transport materials, the electron transport layer which adjoins the luminescent layer contains one or more charge transport materials, and the charge transport materials contained in the luminescent layer and the charge transport materials contained in the electron transport layer which adjoins the luminescent layer may be the same materials or may be different materials, that when the electron affinity of the charge transport material which serves to transport electrons, among the charge transport materials contained in the luminescent layer, is expressed by EA1 and the electron affinity of the charge transport material which is the highest in the absolute value of electron affinity, among the charge transport materials contained in the electron transport layer that adjoins the luminescent layer, is expressed by EA2, then EA1 and EA2 satisfy the relationship represented by the following expression (1), and that when the electron affinity of the charge transport material which is the highest in the absolute value of electron affinity, among the charge transport materials contained in the electron transport layer located on the most cathode side among the electron transport layers, is expressed by EA3 and the work function of the cathode is expressed by WF, then EA3 and WF satisfy the relationship represented by the following expression (2).

$$0.00 \text{ eV} \leq |EA1| - |EA2| \leq 0.20 \text{ eV} \qquad \text{Expression (1)}$$

$$-1.60 \text{ eV} \leq |WF| - |EA3| \leq 1.60 \text{ eV} \qquad \text{Expression (2)}$$

Incidentally, the term electron affinity is hereinafter often abbreviated to "EA".

The organic electroluminescence element of the invention has two or more electron transport layers. The term electron transport layer means a layer of a dielectric which has the property of transporting electrons. The electron transport layers are constituted of one or more compounds which, between the electrodes to which an electric field is being applied, can efficiently transport electrons injected from the cathode, toward the luminescent layer. There are cases where among the electron transport layers, the electron transport layer which adjoins the luminescent layer is referred to simply as "adjoining electron transport layer", and the electron transport layer located on the most cathode side is referred to simply as "cathode-side electron transport layer".

Incidentally, the term electron injection layer means a layer of an electrical non-conductor which has the property of injecting electrons from the cathode into an electron transport layer, and means a layer which is different from an electron transport layer according to the invention. The term cathode means the electrode which is the counter electrode for the anode.

[Charge Transport Material Serving to Transport Electrons]

The term "charge transport material serving to transport electrons" has the following meaning. In the case where the luminescent layer contains two or more charge transport materials, a single-layer film of each charge transport material is examined for charge mobility by the time-of-flight (ToF) method, and the ratio of the amount of charges Q(e) detected during the measurement of electron mobility to the amount of charges Q(h) detected during the measurement of hole mobility [Q(e)/Q(h)] is determined. That term means the material which is the highest in the ratio Q(e)/Q(h).

<Ratio Between Detected-Charge Amounts, Q(e)/Q(h)>

The ratio between detected-charge amounts, Q(e)/Q(h), in a charge mobility examination made by the ToF method can be determined in the following manner.

A film of the charge transport material to be examined and a film of a counter electrode are formed on a translucent electrode, and this structure is sealed to thereby produce a test sample. For forming a film of the charge transport material, either a wet method or a dry method may be used so long as a satisfactory amorphous film is obtained. The film of the charge transport material may have any thickness so long as the distance from the region where charge separation occurs during the charge mobility examination to the counter electrode is sufficiently long and this distance does not affect the evaluation of charge-transporting properties. Specifically, the thickness of the film is preferably 500 nm or larger, more preferably 1,000 nm or larger.

Next, an electric field having a given strength is applied so that the translucent electrode serves as an anode and the counter electrode as a cathode. It is preferred that the field strength should be high from the standpoint that the influence of the natural diffusion of charges which move within the film is slight. Meanwhile, it is preferred that the field strength should be low from the standpoint that the effect of drawing charges to the counter electrode is not too high and it is easy to accurately evaluate the loss of charges, etc. Specifically, the field strength is preferably 90 kV/cm or higher, more preferably 120 kV/cm or higher, and is preferably 360 kV/cm or less, more preferably 310 kV/cm or less.

The test sample in this state is irradiated from the translucent-electrode side with the monochromatic light emitted by a pulsed laser. The sample to be examined for the ratio between detected-charge amounts is examined for hole charge amount Q(h) and electron charge amount Q(e) under the same conditions with respect to the field strength during the laser light irradiation, the excitation wavelength and pulse duration of the laser light, and the quantity of light per pulse. It is preferred that the quantity of light per pulse should be small, from the standpoint that the possibility of too highly estimating the charge-transporting properties because of generation of excess charges is low. Specifically, it is preferred that the quantity of light per pulse should be 30 µJ or less.

When the film of the charge transport material is irradiated with light, charge separation occurs in a translucent-electrode-side part of the film and holes move toward the counter electrode. The value of the resultant electric current is measured using an oscilloscope or the like to thereby calculate the hole charge amount Q(h). Next, an electric field having a given strength is applied so that the translucent electrode serves as a cathode and the counter electrode as an anode, and the same operation is conducted to thereby calculate the electron charge amount Q(e). By determining a ratio between these, the ratio between detected-charge amounts [Q(e)/Q(h)] can be determined.

By conducting the examination of hole charge amount Q(h) and the examination of electron charge amount Q(e) under the same conditions with respect to the field strength during the laser light irradiation, the excitation wavelength and pulse duration of the laser light, and the quantity of light (excitation energy) per pulse, the examination of hole charge amount Q(h) and the examination of electron charge amount Q(e) are made to generate the same amount of charges upon charge separation. Consequently, the ratio between detected-charge amounts [Q(e)/Q(h)] is an index which indicates that which of holes and electrons are more apt to be transmitted by the material. Namely, the larger the detected-charge amount ratio [Q(e)/Q(h)], the more the material is apt to transmit electrons. As described above, when the luminescent layer according to the invention contains a plurality of charge transport materials, then the material which is the highest in Q(e)/Q(h), which is the ratio between the amount of charges detected during the measurement of hole mobility and the amount of charges detected during the measurement of electron mobility that are determined when a single-layer film of the charge transport material is examined for charge mobility by the ToF method, can be regarded as a material which serves to transport electrons.

<Work Function of Cathode Material>

The work function of a cathode material can generally be determined by photoelectron spectroscopy. In a measurement by photoelectron spectroscopy, monochromatic ultraviolet light or X rays are irradiated upon a sample in an ultra-high vacuum of the lower half of $10^{-8}$ Torr to $10^{-10}$ Torr, and the electrons which are ejected from the metal surface are detected with a photoelectron multiplier or the like. The energy used to excite the sample is correlated with the number of detected electrons. Thus, the work function of the cathode material can be determined. In particular, with respect to the work functions of elemental materials, a report was made by Michaeison and Hrbert B. in 1977 (*J. Appl. Phys.*, 48. 4729 (1977)). A specific explanation is given on aluminum as an example. At a vacuum of $10^{-9}$ to $10^{-10}$ Torr, aluminum is vapor-deposited on quartz which is a pedestal for measurement, thereby forming a thin film of clean amorphous aluminum. At the ultra-high vacuum, a high-pressure mercury lamp is used as a light source and monochromatic light is taken out with a monochromator and irradiated upon the sample surface. The number of electrons which are ejected from the sample surface is counted and correlated with the energy of the light source, thereby calculating the work function to be 4.28 eV. With respect to the work functions of other metals, e.g., silver, gold, and nickel, the values of 4.26 eV for silver, 5.10 eV for gold, and 5.15 eV for nickel are known as quite common values.

[Mechanism]

As described above, the organic electroluminescence element of the invention is characterized in that the absolute value |EA1| of the EA of the charge transport material which serves to transport electrons, among the charge transport materials contained in the luminescent layer, is not less than the absolute value |EA2| of the EA of the charge transport material which is the highest in the absolute value of EA, among the charge transport materials contained in the adjoining electron transport layer. Preferably, |EA1| is larger than |EA2|. The mechanism by which this configuration brings about effects is presumed to be as follows.

In conventional elements in which the EA of the charge transport material contained in the luminescent layer (EA1) is lower than the EA of the charge transport material contained in the adjoining electron transport layer (EA2), i.e., |EA1|−|EA2|<0 eV, electron accumulation attributable to the EA gap occurs at the interface between the luminescent layer and the adjoining electron transport layer. The electrons thus accumulated cause hole accumulation on the luminescent-layer side of the interface between the luminescent layer and the adjoining electron transport layer, and further cause exciplex generation at the interface, etc. The charges thus generated are thought not only to deteriorate the luminescent material or charge transport material in the vicinity of the interface and shorten the life of the element but also to cause inhibition of exciton generation and extinction of excitons in the luminescent layer. As a result, it becomes impossible to efficiently extract the luminescence produced by the luminescent layer in the vicinity of the interface.

In contrast, in the organic electroluminescence element of the invention, since |EA2| is equal to or smaller than |EA1|, the amount of electrons which accumulate at the interface between the luminescent layer and the adjoining electron transport layer is small and the decrease in element life and the decrease in luminescent efficiency which occur for the reason described above can be diminished. Thus, an organic electroluminescence element which has a longer life and a higher luminescent efficiency can be obtained.

Meanwhile, in the case where |EA1|−|EA2| is not larger than the upper limit of expressions (1) and (3), the difference in EA between the luminescent layer and the adjoining electron transport layer is small and charges are smoothly transferred. As a result, a deterioration due to electron accumulation is less apt occur. Consequently, |EA1|−|EA2| is regulated to 0.20 eV or less.

The organic electroluminescence element of the invention is further characterized in that the difference between the absolute value of the work function (WF) of the cathode and the absolute value of the EA of the charge transport material (EA3) which is the highest in the absolute value of electron affinity, among the charge transport materials contained in the cathode-side electron transport layer, is not larger than a given value. The mechanism by which this configuration brings about effects is presumed to be as follows.

When |EA1| and |EA2| satisfy the relationship represented by expression (1) and |WF|−|EA3| is from −1.60 eV to 1.60 eV, then the barrier to electron injection from the cathode into the cathode-side electron transport layer is small and electrons are efficiently injected. However, in case where expression (1) or (2) is not satisfied, the amount of electrons which accumulate at the interface between the luminescent layer and the adjoining electron transport layer is large disadvantageously. Consequently, when expressions (1) and (2) are simultaneously satisfied, electrons efficiently enter the luminescent layer and electron accumulation is less apt to occur in the vicinity of the luminescent layer. Thus, the element can have a long life and an excellent luminescent efficiency.

<Electron Affinity>

In the invention, the electron affinity (EA) of a charge transport material is a value calculated from both a band gap (Eg) calculated from an absorption spectrum of a single-layer film thereof and the value of ionization potential (IP) which will be described later, using the following equation.

$$EA = IP - Eg$$

<Method for Measuring Ionization Potential (IP)>

The ionization potential (IP) of a charge transport material can be measured by using a commercial ionization potential measuring apparatus such as "AC-1" or "AC-3", both manufactured by Riken Keiki Co., Ltd., or "PCR-101" or "PCR-201", both manufactured by OPTEL Co., Ltd.

A sample to be examined for ionization potential (IP) can be produced by forming a film of the charge transport material on an ITO substrate by a wet or dry method. Examples of the wet film formation method include a method in which the charge transport material is dissolved in an organic solvent, e.g., xylene or toluene, and a film is formed therefrom by spin coating. Examples of the dry film formation method include vacuum deposition.

<Method for Measuring Band Gap (Eg)>

Band gap (Eg) is obtained through an examination of a thin-film absorption spectrum obtained with an absorptiometer for the ultraviolet-visible region. Specifically, tangents to the thin-film absorption spectrum are drawn from the base line in the shorter-wavelength-side rising part of the absorption spectrum, and the wavelength W (nm) corresponding to the intersection of the two tangents is determined. The band gap (Eg) is determined from the wavelength (W) using the following equation.

$$Eg = 1240 \div W$$

For example, in the case where the wavelength corresponding to the intersection is 470 nm, the value of Eg is 1240÷470=2.63 (eV).

A measurement of the energy which indicates the band gap may be made with an apparatus capable of obtaining an absorption spectrum, and is not particularly limited in the kind of apparatus, etc. However, "F4500", manufactured by Hitachi, Ltd., or the like can, for example, be used.

A sample to be examined for the energy which indicates the band gap can be produced by forming a film of the charge transport material on a glass substrate by a wet or dry method. Examples of the wet film formation method include a method in which the charge transport material is dissolved in an organic solvent, e.g., xylene or toluene, and a film is formed therefrom by spin coating. Examples of the dry film formation method include vacuum deposition.

[Luminescent Layer]

The luminescent layer possessed by the organic electroluminescence element of the invention contains at least one luminescent material (material having the property of luminescing) and one or more charge transport materials. The luminescent layer may contain a luminescent material as a dopant material and a charge transport material, e.g., a hole transport material or an electron transport material, as a host material. Furthermore, the luminescent layer may contain other ingredients unless these ingredients considerably lessen the effects of the invention. In the case where the luminescent layer is formed by a wet film formation method, it is preferred to use materials which each have a low molecular weight.

{Luminescent Material}

As the luminescent material, use can be made of any desired known material which is in use as a luminescent material for organic electroluminescence elements, without particular limitations. A substance which emits light having desired wavelengths and which has a satisfactory luminescent efficiency may be used. The luminescent material may be either a fluorescent material or a phosphorescent material. From the standpoint of inner-quantum efficiency, however, a phosphorescent material is preferred. A combination of one or more fluorescent materials and one or more phosphorescent materials may also be used. For example, a fluorescent material is used for blue and phosphorescent materials are used for green and red.

It is preferred to reduce the symmetry and stiffness of the molecule of a luminescent material or to introduce an oleophilic substituent, e.g., an alkyl group, for the purpose of improving solubility in the solvent to be used for preparing a composition for luminescent-layer formation to be used when the luminescent layer is formed by a wet film formation method.

One luminescent material may be used alone, or any desired two or more luminescent materials may be used in combination in any desired proportion.

<Fluorescent Materials>

Examples of the fluorescent material, of the luminescent materials, are given below. However, the fluorescent material should not be construed as being limited to the following examples.

Examples of fluorescent materials which give blue luminescence (blue fluorescent colorants) include naphthalene, chrysene, perylene, pyrene, anthracene, coumarin, p-bis(2-phenylethenyl)benzene, arylamines, and derivatives thereof. Preferred of these are anthracene, chrysene, pyrene, arylamines, derivatives thereof, and the like.

Examples of fluorescent materials which give green luminescence (green fluorescent colorants) include quinacridone, coumarin, aluminum complexes such as $Al(C_9H_6NO)_3$, and derivatives thereof.

Examples of fluorescent materials which give yellow luminescence (yellow fluorescent colorants) include rubrene, perimidone, and derivatives thereof.

Examples of fluorescent materials which give red luminescence (red fluorescent colorants) include DCM (4-(dicyanomethylene)-2-methyl-6-(p-dimethylaminostyrene)-4H-pyran) type compounds, benzopyran, rhodamine, xanthenes such as benzothioxanthene and azabenzothioxanthene, and derivatives thereof.

Preferred as the arylamine derivatives shown above as materials which give blue fluorescence, more specifically, are compounds represented by the following formula (X), from the standpoints of the luminescent efficiency and working life of the element, etc.

[Chem. 1]

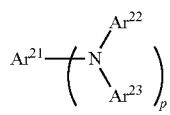
(X)

(In the formula, $Ar^{21}$ represents a substituted or unsubstituted, fused aromatic ring group having 10-40 nuclear carbon atoms; $Ar^{22}$ and $Ar^{23}$ each independently represent a substituted or unsubstituted, monovalent aromatic hydrocarbon ring group having 6-40 carbon atoms; and p represents an integer of 1-4.)

An aromatic ring group in the invention may be either an aromatic hydrocarbon ring group or a heteroaromatic ring group.

Examples of the $Ar^{21}$ include naphthalene, phenanthrene, fluoranthene, anthracene, pyrene, perylene, coronene, chrysene, picene, diphenylanthracene, fluorene, triphenylene, rubicene, benzanthracene, phenylanthracene, bisanthracene, dianthracenylbenzene, or dibenzanthracene each having a free valence of 1. The term free valence herein means a valence which is capable of combining with another free valence as described in Yūki-kagaku/Sei-kagaku Meimei-hō (Jō) (revised version, second edition, Nankodo Co., Ltd., 1992).

Preferred examples of such arylamine derivatives as fluorescent materials are shown below, but the fluorescent material according to the invention should not be construed as being limited to the following examples. Hereinafter, "Me" represents methyl, and "Et" represents ethyl.

[Chem. 2]

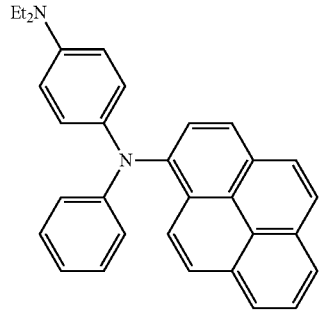

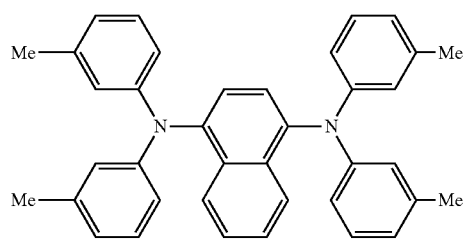

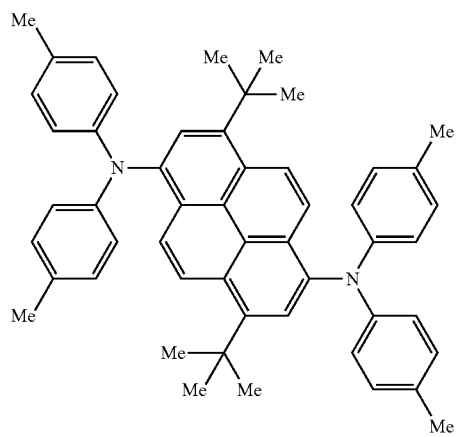

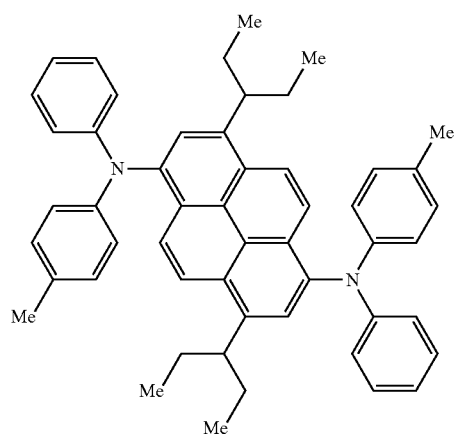

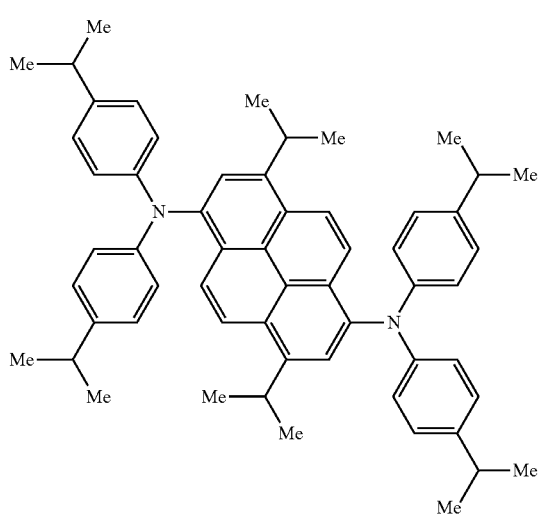

11
-continued
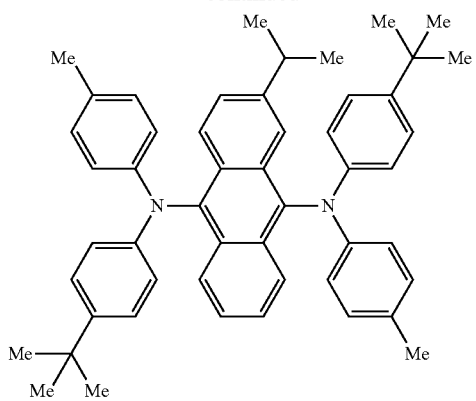
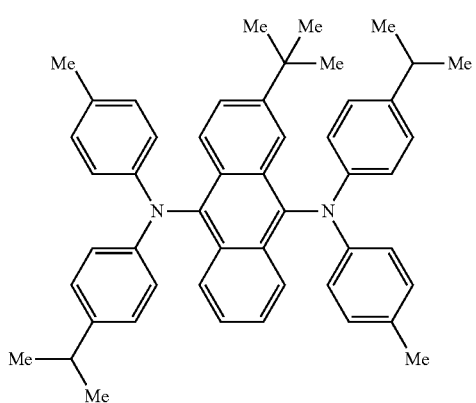
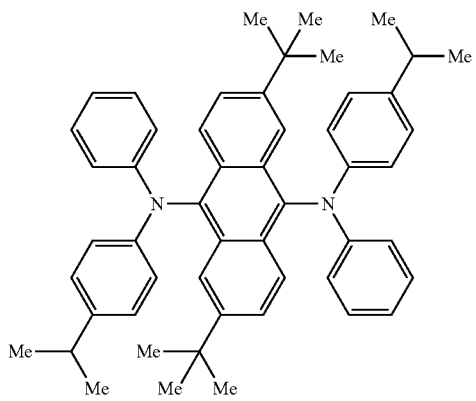
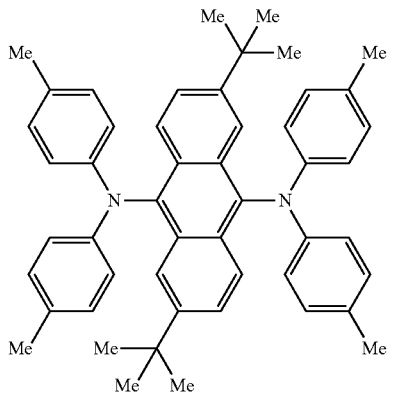
12
-continued
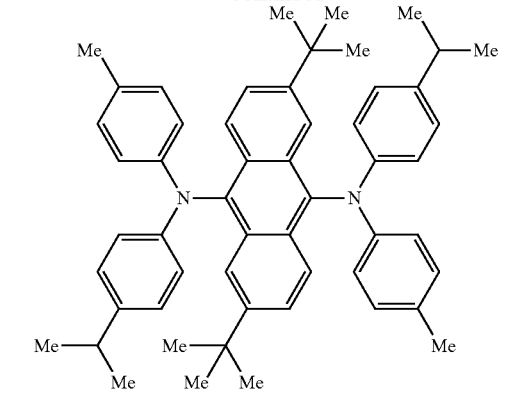
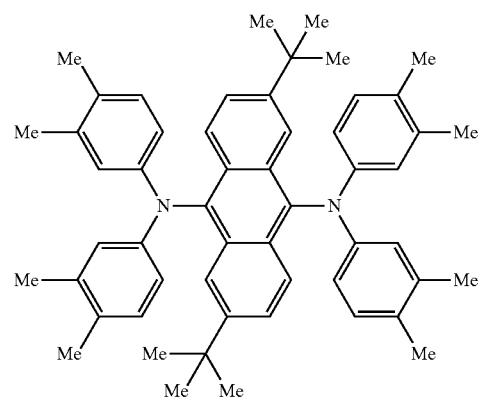
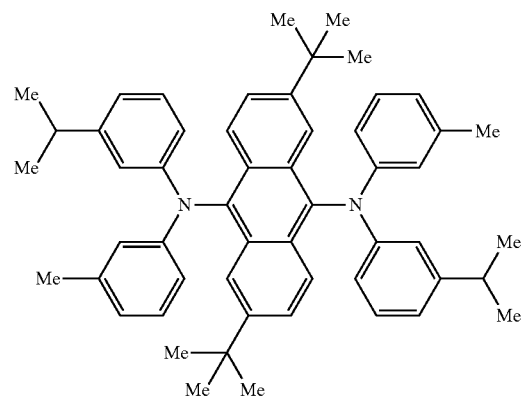
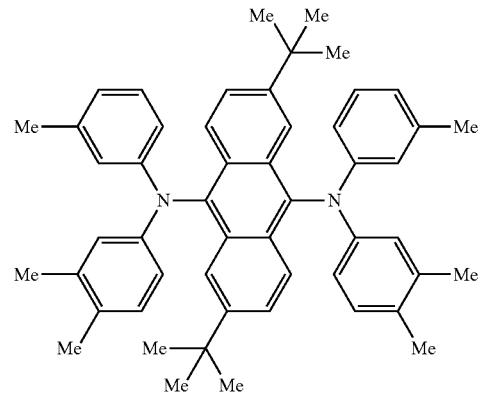

[Chem. 3]
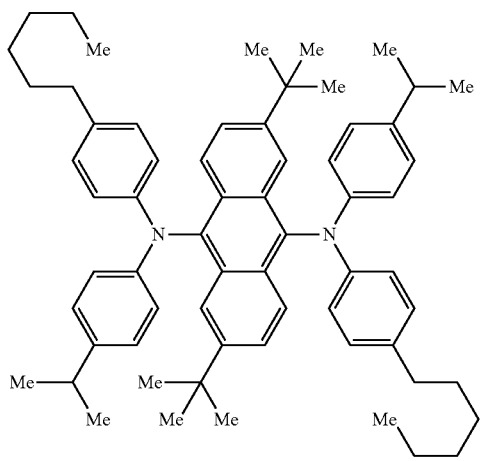
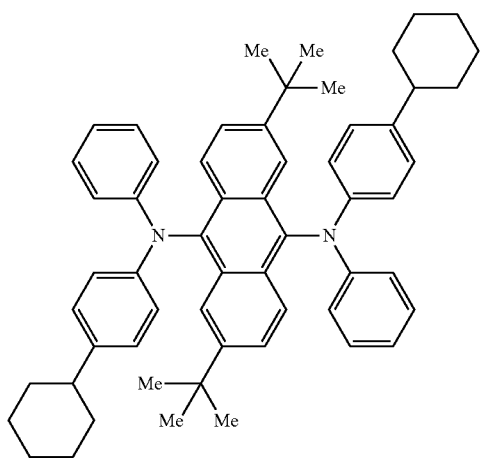
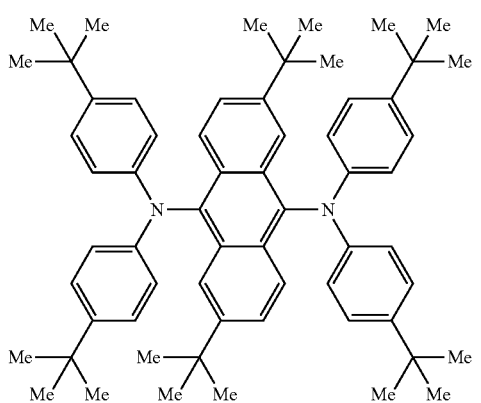
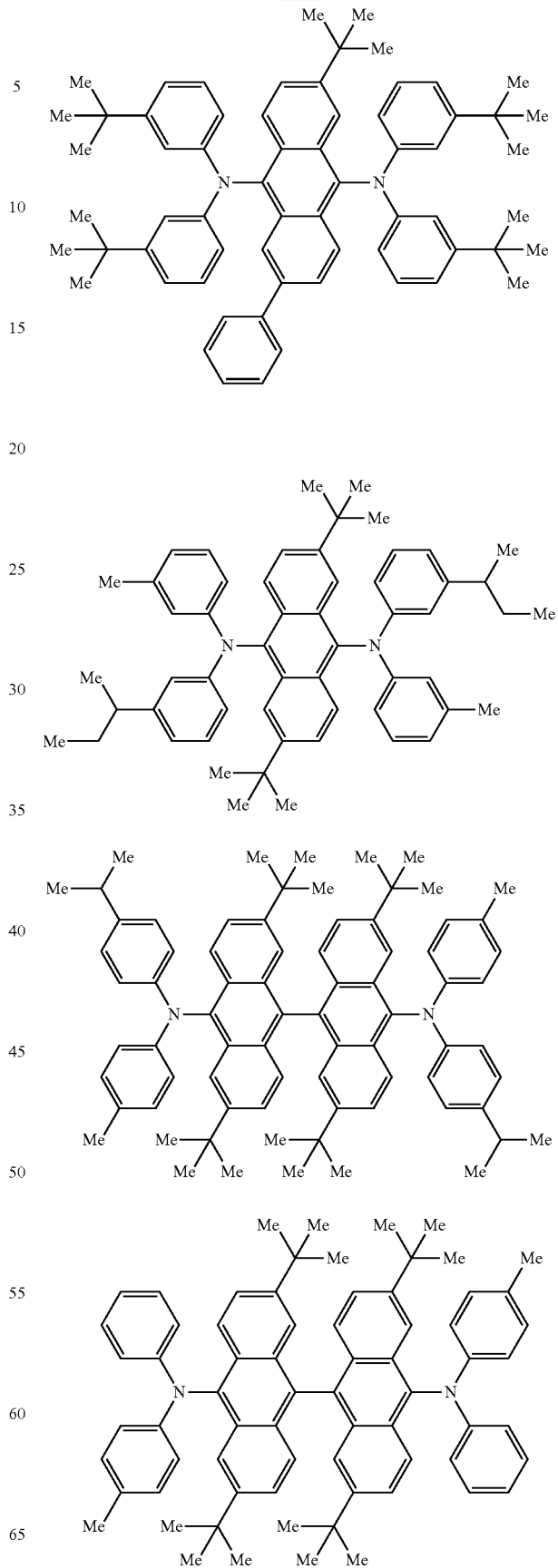

-continued
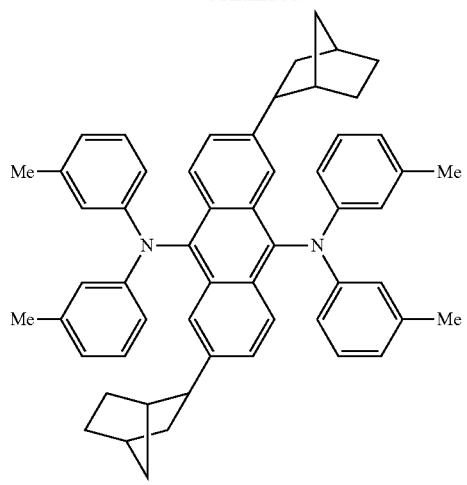
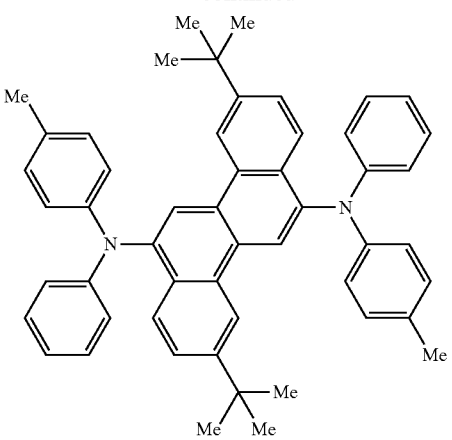
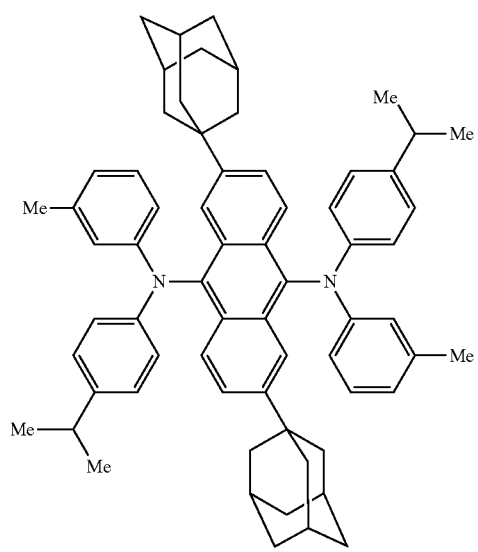
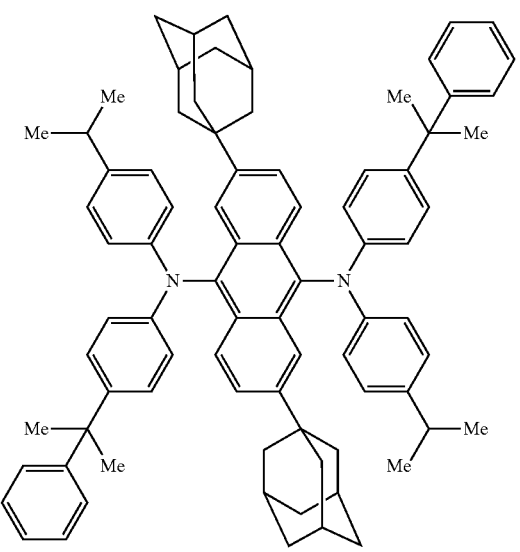
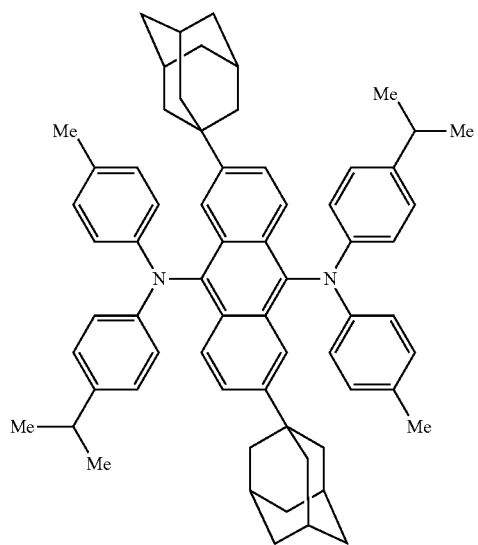
[Chem. 4]
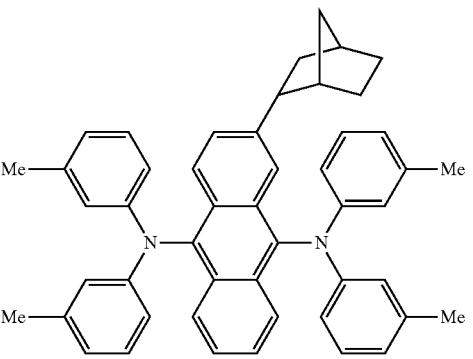

17
-continued
18
-continued
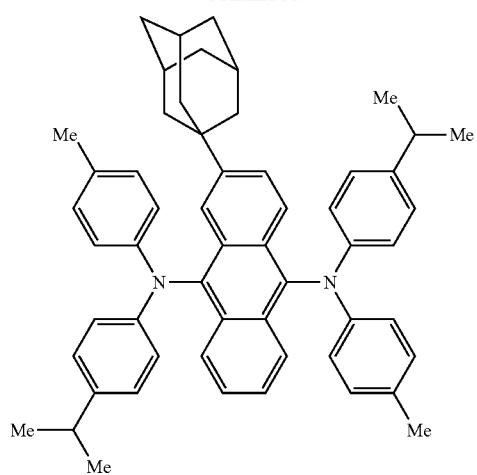
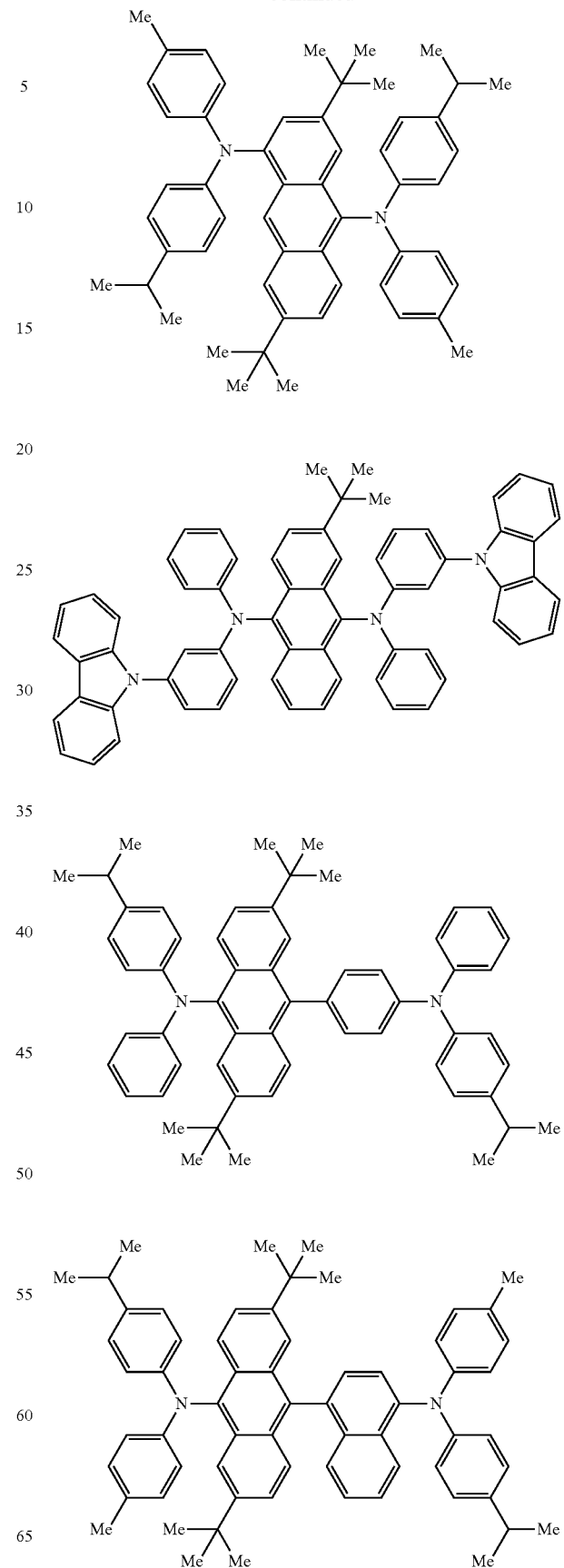

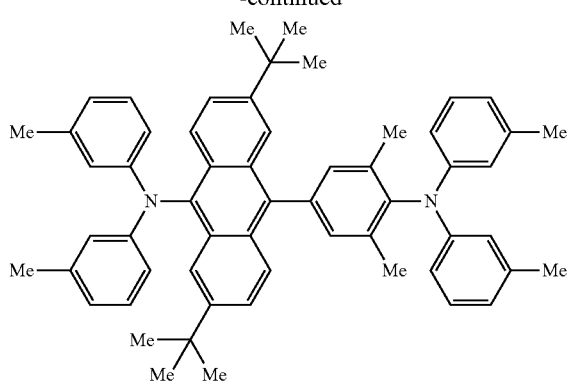
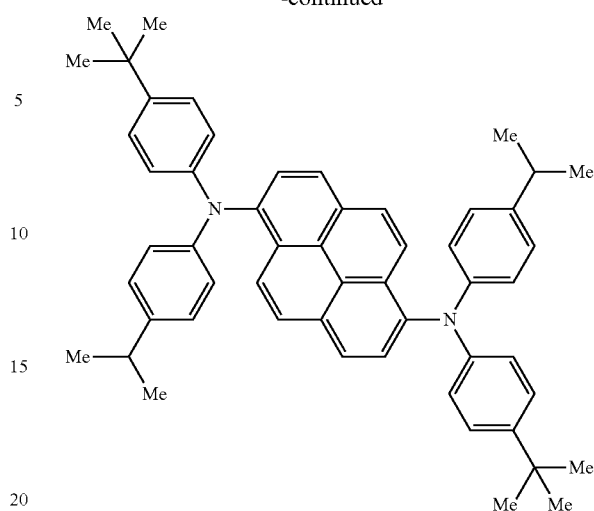
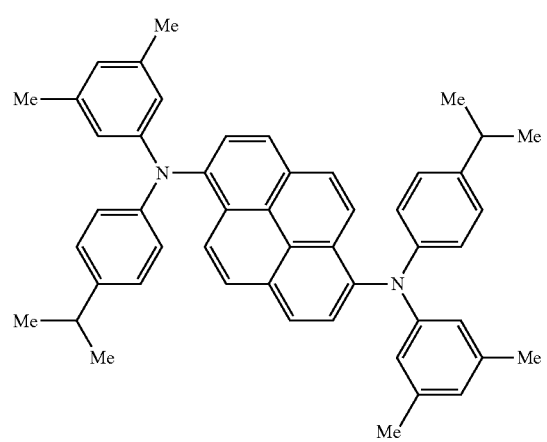
[Chem. 5]
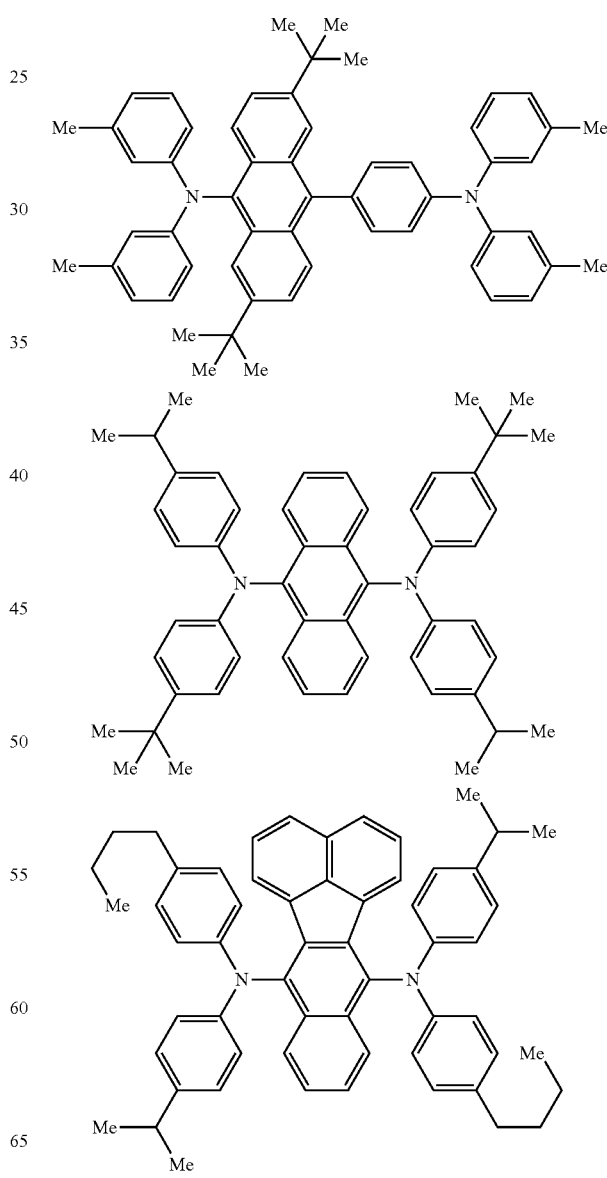
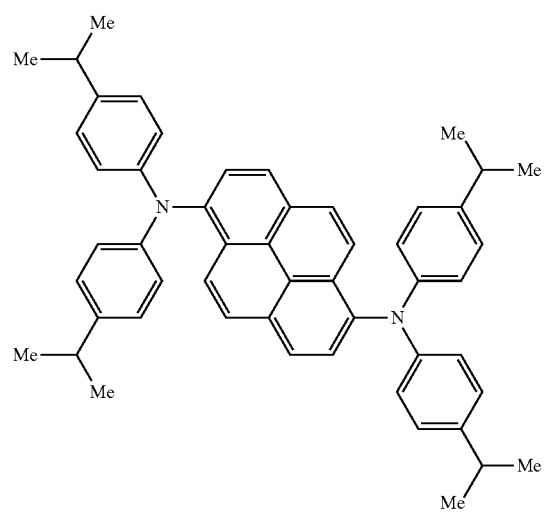

-continued

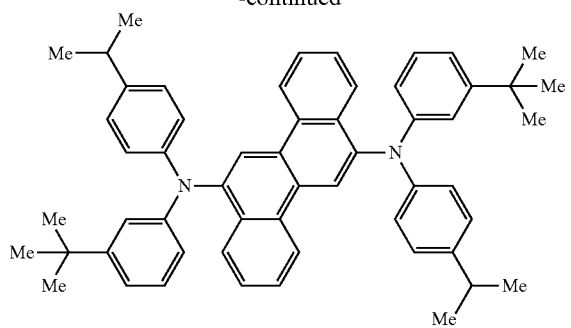

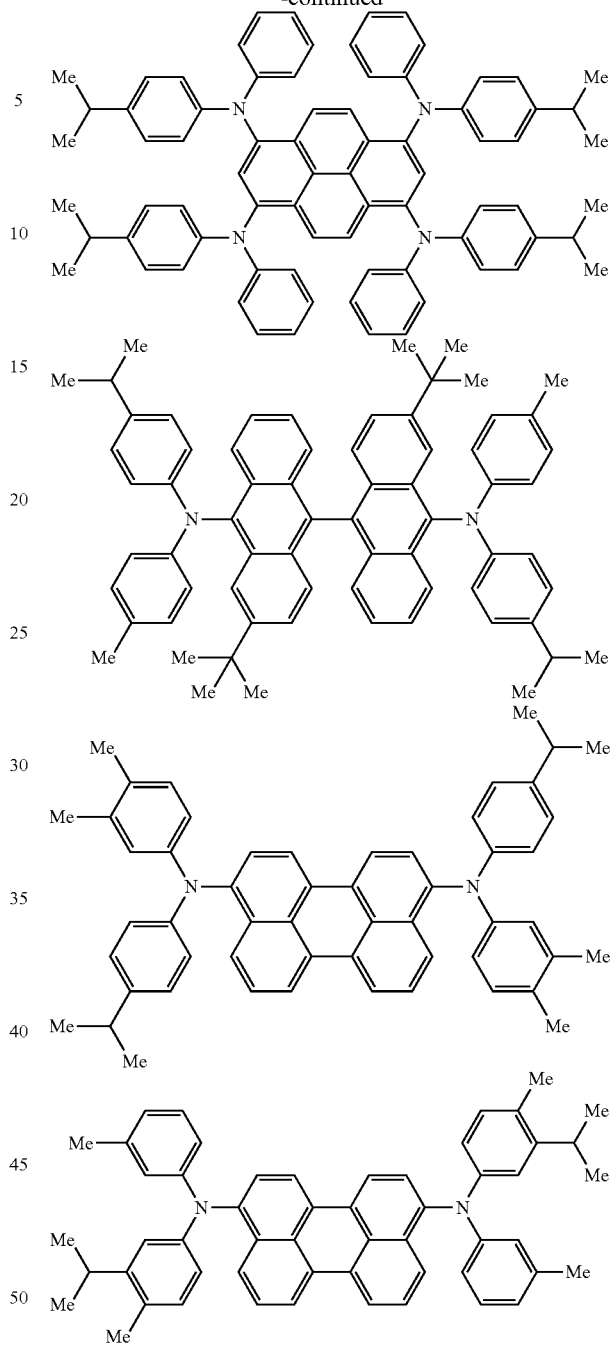

<Phosphorescent Materials>

Examples of the phosphorescent material include Werner or organometallic complexes each including as the central metal a metal selected from Group-7 to Group-11 of the long-form periodic table (hereinafter the term "periodic table" means the long-form periodic table unless otherwise indicated).

Preferred examples of the metal selected from Groups 7 to 11 of the periodic table include ruthenium, rhodium, palladium, silver, rhenium, osmium, iridium, platinum, and gold. More preferred of these is iridium or platinum.

The ligands of the complexes preferably are ligands each configured of a (hetero)aryl group and, bonded thereto, pyridine, pyrazole, phenanthroline, or the like, such as a (hetero)

arylpyridine ligand and a (hetero)arylpyrazole ligand. Especially preferred are a phenylpyridine ligand and a phenylpyrazole ligand. The term (hetero)aryl herein represents an aryl group or a heteroaryl group.

Specific examples of such phosphorescent materials include tris(2-phenylpyridine)iridium, tris(2-phenylpyridine)ruthenium, tris(2-phenylpyridine)palladium, bis(2-phenylpyridine)platinum, tris(2-phenylpyridine)osmium, tris(2-phenylpyridine)rhenium, octaethylplatinum porphyrin, octaphenylplatinum porphyrin, octaethylpalladium porphyrin, and octaphenylpalladium porphyrin.

Especially preferred examples of phosphorescent organometallic complexes as phosphorescent materials include compounds represented by the following formula (III) or formula (IV).

$$ML_{(q-j)}L'_j \quad \text{(III)}$$

(In formula (III), M represents a metal, and q represents the valence of the metal. Furthermore, L and L' represent a bidentate. Symbol j represents a number of 0, 1, or 2.)

[Chem. 6]

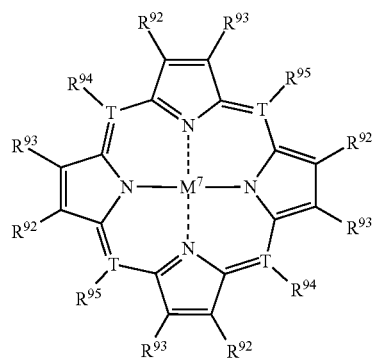

(IV)

(In formula (IV), $M^7$ represents a metal, and T represents a carbon atom or a nitrogen atom. $R^{92}$ to $R^{95}$ each independently represent a substituent. However, when T is a nitrogen atom, $R^{94}$ and $R^{95}$ are absent.)

First, the compounds represented by formula (III) are explained below.

In formula (III), M represents any desired metal. Preferred examples thereof include the metals enumerated above as examples of the metal selected from Groups 7 to 11 of the periodic table.

The bidentate L in formula (III) represents a ligand which has the following partial structure.

[Chem. 7]

L:

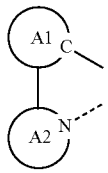

In the partial structure of L, ring A1 represents an aromatic ring group which may have a substituent. An aromatic ring group in the invention may be either an aromatic hydrocarbon ring group or a heteroaromatic ring group.

Examples of the aromatic hydrocarbon ring group include a 5- or 6-membered monocycle having a free valence of 1 or a fused ring which is composed of two to five 5- or 6-membered rings fused together and which has a free valence of 1.

Specific examples of the aromatic hydrocarbon ring group include a benzene ring, naphthalene ring, anthracene ring, phenanthrene ring, perylene ring, tetracene ring, pyrene ring, benzpyrene ring, chrysene ring, triphenylene ring, acenaphthene ring, fluoranthene ring, and fluorene ring which each have a free valence of 1.

Examples of the heteroaromatic ring group include a 5- or 6-membered monocycle having a free valence of 1 or a fused ring which is composed of two to four 5- or 6-membered rings fused together and which has a free valence of 1.

Specific examples thereof include a furan ring, benzofuran ring, thiophene ring, benzothiophene ring, pyrrole ring, pyrazole ring, imidazole ring, oxadiazole ring, indole ring, carbazole ring, pyrroloimidazole ring, pyrrolopyrazole ring, pyrrolopyrrole ring, thienopyrrole ring, thienothiophene ring, furopyrrole ring, furofuran ring, thienofuran ring, benzisooxazole ring, benzisothiazole ring, benzimidazole ring, pyridine ring, pyrazine ring, pyridazine ring, pyrimidine ring, triazine ring, quinoline ring, isoquinoline ring, cinnoline ring, quinoxaline ring, phenanthridine ring, perimidine ring, quinazoline ring, quinazolinone ring, and azulene ring which each have a free valence of 1.

In the partial structure of L, ring A2 represents a nitrogen-containing heteroaromatic ring group which may have a substituent.

Examples of the nitrogen-containing heteroaromatic ring group include a 5- or 6-membered monocycle having a free valence of 1 or a fused ring which is composed of two to four 5- or 6-membered rings fused together and which has a free valence of 1.

Specific examples thereof include a pyrrole ring, pyrazole ring, imidazole ring, oxadiazole ring, indole ring, carbazole ring, pyrroloimidazole ring, pyrrolopyrazole ring, pyrrolopyrrole ring, thienopyrrole ring, furopyrrole ring, thienofuran ring, benzisooxazole ring, benzisothiazole ring, benzimidazole ring, pyridine ring, pyrazine ring, pyridazine ring, pyrimidine ring, triazine ring, quinoline ring, isoquinoline ring, quinoxaline ring, phenanthridine ring, perimidine ring, quinazoline ring, and quinazolinone ring which each have a free valence of 1.

Examples of the substituent which may be possessed by ring A1 or ring A2 include halogen atoms, alkyl groups, alkenyl groups, alkoxycarbonyl groups, alkoxy groups, aryloxy groups, dialkylamino groups, diarylamino groups, carbazolyl, acyl groups, haloalkyl groups, cyano, and aromatic hydrocarbon ring groups. Ring A1 which is a nitrogen-containing heteroaromatic ring group and ring A2 each may have an aromatic hydrocarbon ring group as a substituent.

In formula (III), the bidentate L' represents a ligand which has any of the following partial structures, wherein "Ph" represents phenyl.

[Chem. 8]

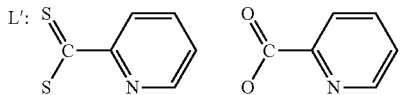

-continued

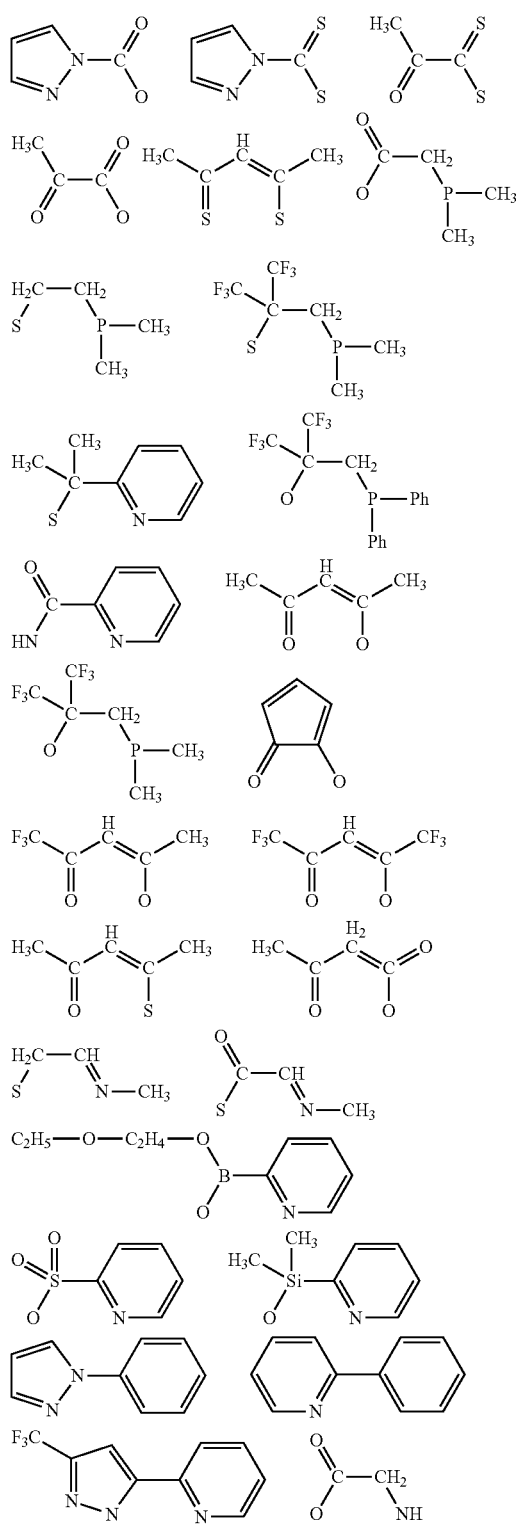

Preferred examples of L' among these are the following ligands from the standpoint of the stability of the complex.

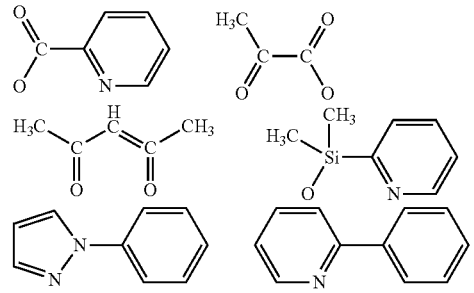

More preferred examples of the compounds represented by formula (III) include compounds represented by the following formulae (IIIa), (IIIb), and (IIIc).

[Chem. 10]

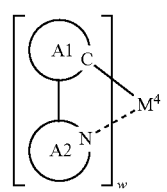

(IIIa)

(In formula (IIIa), $M^4$ represents the same metal as M; w represents the valence of the metal; ring A1 represents an aromatic hydrocarbon ring group which may have a substituent; and ring A2 represents a nitrogen-containing heteroaromatic ring group which may have a substituent.)

[Chem. 11]

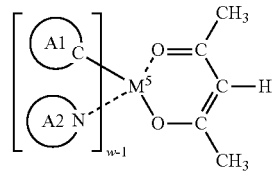

(IIIb)

(In formula (IIIb), $M^5$ represents the same metal as M; w represents the valence of the metal; ring A1 represents an aromatic ring group which may have a substituent; and ring A2 represents a nitrogen-containing heteroaromatic ring group which may have a substituent.)

[Chem. 12]

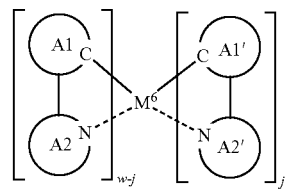

(IIIc)

(In formula (IIIc), $M^6$ represents the same metal as M; w represents the valence of the metal; j represents 0, 1, or 2; ring A1 and ring A1' each independently represent an aromatic ring group which may have a substituent; and ring A2 and ring A2' each independently represent a nitrogen-containing heteroaromatic ring group which may have a substituent.)

In formulae (IIIa) to (IIIc), preferred examples of the aromatic ring groups represented by ring A1 and ring A1' include phenyl, biphenyl, naphthyl, anthryl, thienyl, furyl, benzothienyl, benzofuryl, pyridyl, quinolyl, isoquinolyl, and carbazolyl.

In formulae (IIIa) to (IIIc), preferred examples of the nitrogen-containing heteroaromatic ring groups represented by ring A2 and ring A2' include pyridyl, pyrimidyl, pyrazyl, triazyl, benzothiazole, benzoxazole, benzimidazole, quinolyl, isoquinolyl, quinoxalyl, and phenanthridyl.

Examples of the substituents which may be possessed by the aromatic ring groups represented by ring A1 and ring A1' in formulae (IIIa) to (IIIc) and by the nitrogen-containing heteroaromatic ring groups represented by ring A2 and ring A2' in the formulae include halogen atoms, alkyl groups, alkenyl groups, alkoxycarbonyl groups, alkoxy groups, aryloxy groups, dialkylamino groups, diarylamino groups, carbazolyl, acyl groups, haloalkyl groups, and cyano.

These substituents may have been bonded to each other to form a ring. An example is the case in which a substituent possessed by ring A1 is bonded to a substituent possessed by ring A2 or a substituent possessed by ring A1' is bonded to a substituent possessed by ring A2', thereby forming one fused ring. Examples of such a fused ring include a 7,8-benzoquinoline group.

More preferred examples of the substituents of ring A1, ring A1', ring A2, and ring A2', among those, include alkyl groups, alkoxy groups, aromatic hydrocarbon ring groups, cyano, halogen atoms, haloalkyl groups, diarylamino groups, and carbazolyl.

Preferred examples of $M^4$ to $M^6$ in formulae (IIIa) to (IIIc) include ruthenium, rhodium, palladium, silver, rhenium, osmium, iridium, platinum, or gold.

Specific examples of the organometallic complexes represented by formulae (III) and (IIIa) to (IIIc) include the following. However, the organometallic complexes should not be construed as being limited to the following compounds.

[Chem. 13]

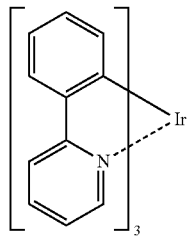
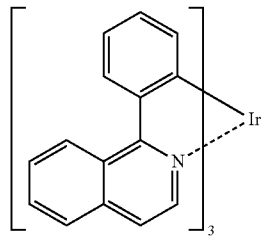
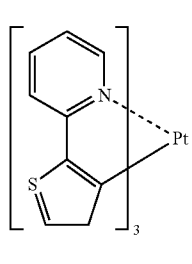
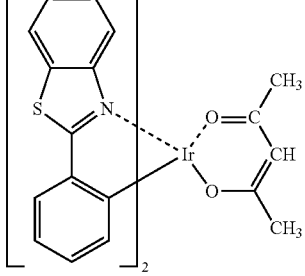

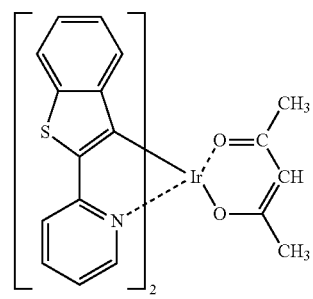

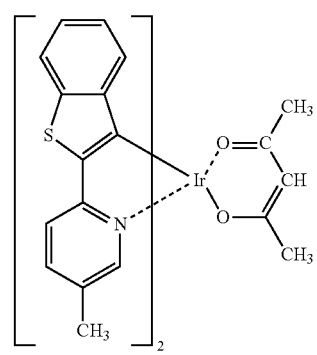

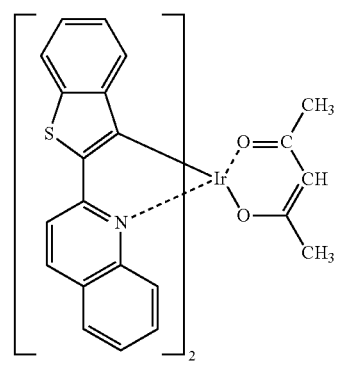

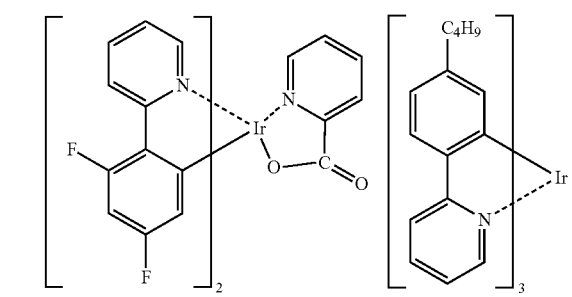
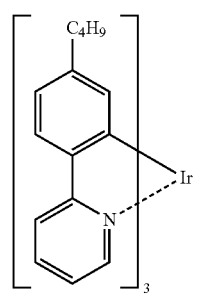

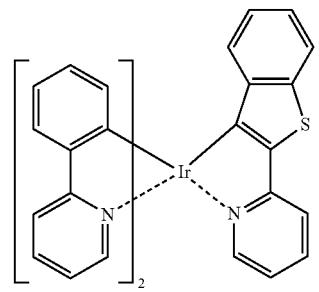

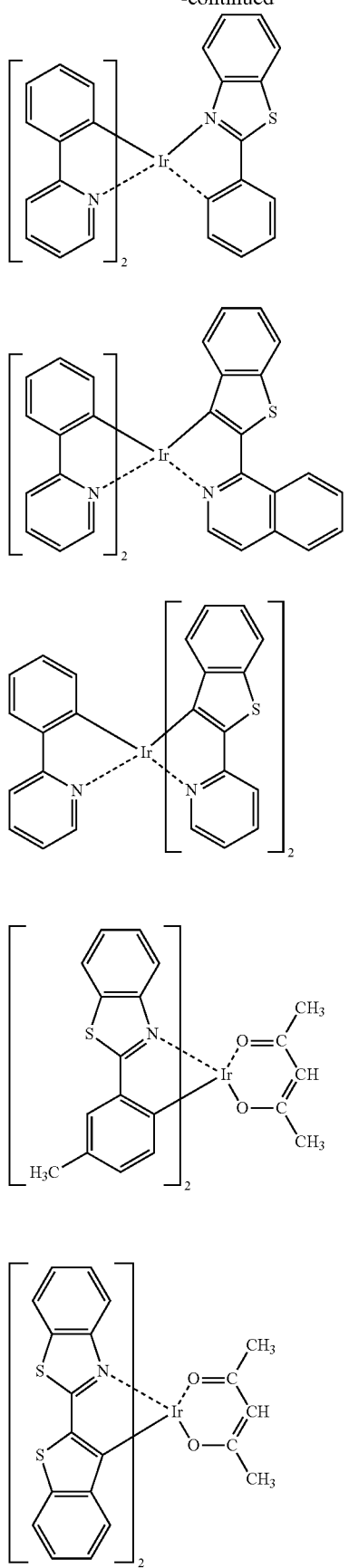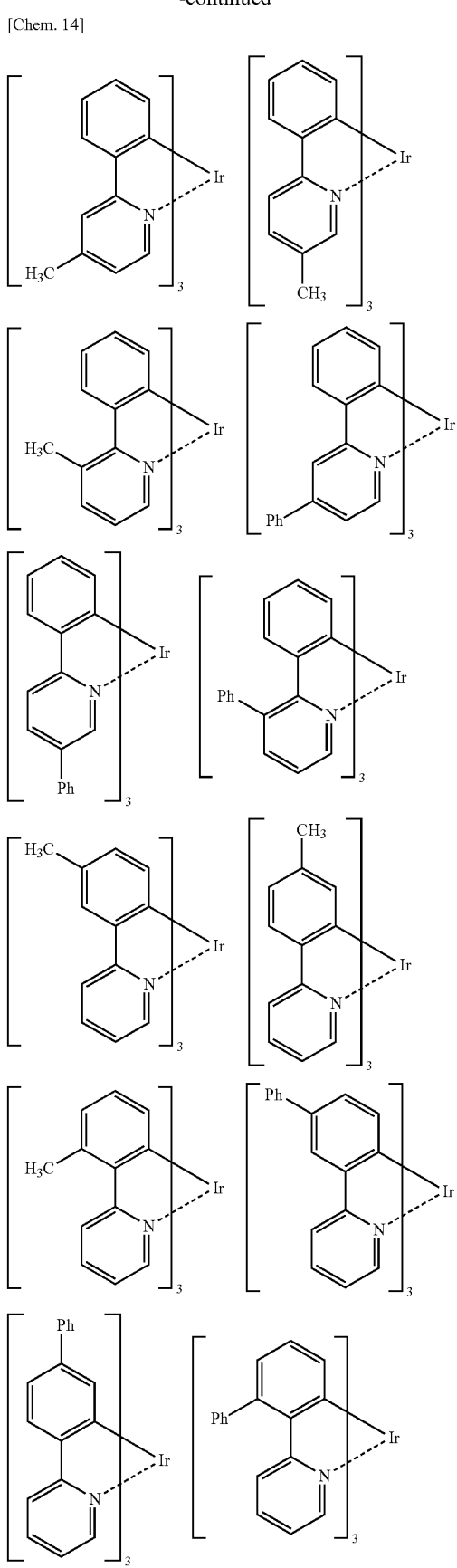

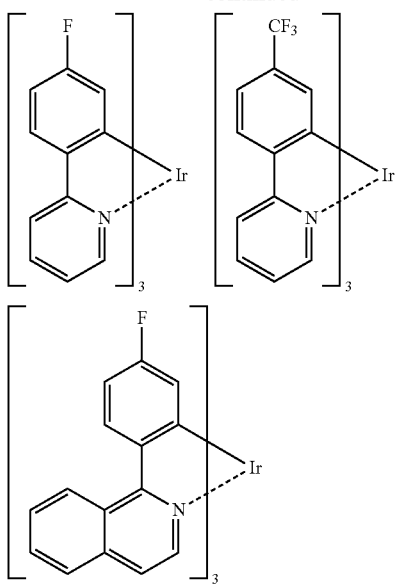

Especially preferred of the organometallic complexes represented by formula (III) are compounds which have, as the ligand L and/or L', a 2-arylpyridine-based ligand, i.e., a 2-arylpyridine, a 2-arylpyridine having any desired substituent, or a 2-arylpyridine to which any desired group has been fused.

The compounds described in International Publication No. 2005/019373 can also be used as a luminescent material.

Next, the compounds represented by formula (IV) are explained.

In formula (IV), $M^7$ represents a metal. Examples thereof include the metals enumerated above as metals selected from Groups 7 to 11 of the periodic table. Preferred examples of $M^7$, among those, include ruthenium, rhodium, palladium, silver, rhenium, osmium, iridium, platinum, or gold. Especially preferred examples, among these, include divalent metals such as platinum and palladium.

In formula (IV), $R^{92}$ and $R^{93}$ each independently represent a hydrogen atom, halogen atom, alkyl group, aralkyl group, alkenyl group, cyano, amino, acyl group, alkoxycarbonyl group, carboxyl, alkoxy group, alkylamino group, aralkylamino group, haloalkyl group, hydroxyl, aryloxy group, or aromatic ring group.

When T is a carbon atom, $R^{94}$ and $R^{95}$ each independently represent a substituent which is the same as any of the substituents enumerated above as examples of $R^{92}$ and $R^{93}$. When T is a nitrogen atom, $R^{94}$ and $R^{95}$ are absent.

$R^{92}$ to $R^{95}$ may further have substituents. When $R^{92}$ to $R^{95}$ have substituents, there are no particular limitations on the kinds thereof. The substituents may be any desired groups.

Furthermore, any desired two or more of $R^{92}$ to $R^{95}$ may be bonded to each other to form a ring.

Specific examples (T-1 and T-10 to T-15) of the organometallic complexes represented by formula (IV) are shown below. However, the organometallic complexes should not be construed as being limited to the following examples. In the following chemical formulae, "Me" represents methyl and "Et" represents ethyl.

[Chem. 15]

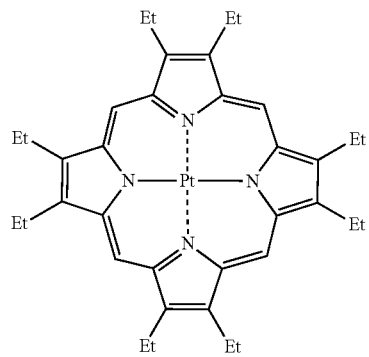

(T-1)

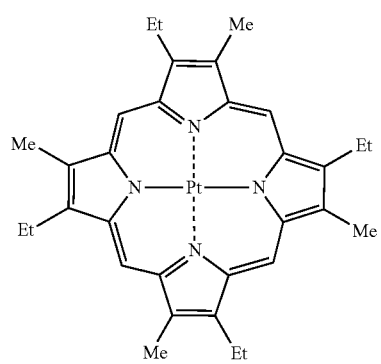

(T-10)

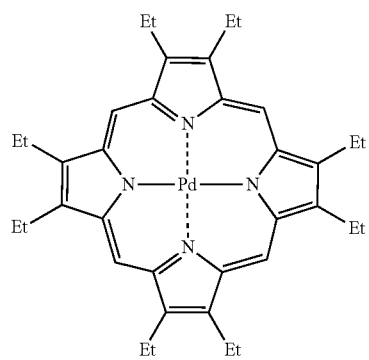

(T-11)

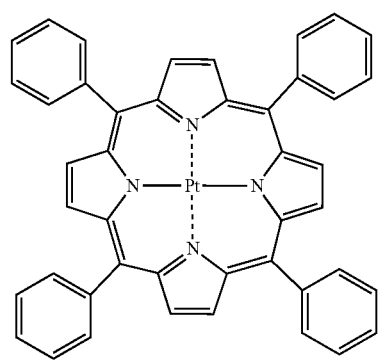

(T-12)

-continued (T-13)

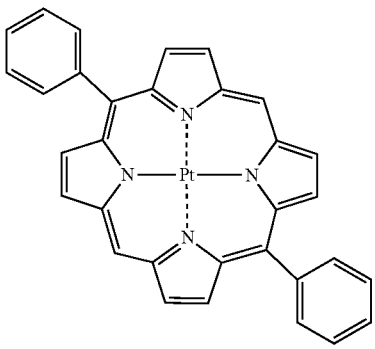

(T-14)

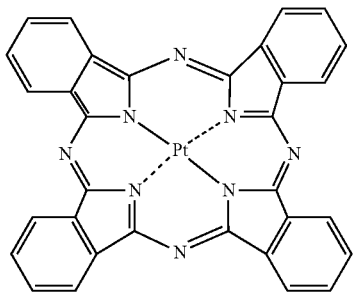

(T-15)

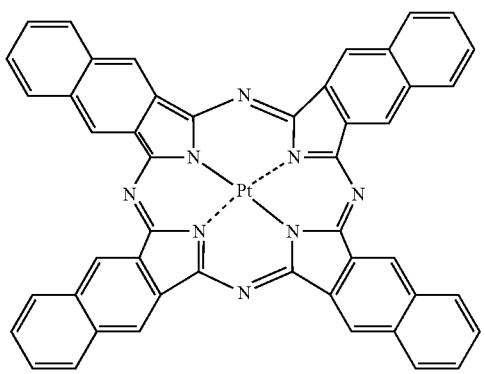

One of these luminescent materials may be used alone, or any desired two or more thereof may be used in combination in any desired proportion.

<Molecular Weight>

The luminescent material in the invention may have any desired molecular weight unless the effects of the invention are considerably lessened thereby. The molecular weight of the luminescent material in the invention is preferably 10,000 or less, more preferably 5,000 or less, even more preferably 4,000 or less, especially preferably 3,000 or less. The molecular weight of the luminescent material in the invention is generally 100 or higher, preferably 200 or higher, more preferably 300 or higher, even more preferably 400 or higher.

It is preferred that the molecular weight of the luminescent material should be high, from the standpoints that this luminescent material is high in glass transition temperature, melting point, decomposition temperature, etc. and the luminescent layer material and the luminescent layer formed therefrom have excellent heat resistance and that a decrease in film quality due to gas generation, recrystallization, molecule migration, etc., an increase in impurity concentration which accompanies pyrolysis of the material, and the like are less apt to occur. On the other hand, it is preferred that the molecular weight of the luminescent material should be low, from the standpoint that this organic compound is easy to purify and is apt to dissolve in solvents.

It is desirable that the luminescent layer according to the invention should contain a luminescent material in an amount of generally 0.01% by weight or more, preferably 0.05% by weight or more, more preferably 0.1% by weight or more. It is desirable that the luminescent layer should contain the luminescent material in an amount of generally 35% by weight or less, preferably 20% by weight or less, more preferably 10% by weight or less. In the case where two or more luminescent materials are used in combination, it is preferred to incorporate these luminescent materials so that the total content thereof is within that range.

{Charge Transport Material}

It is preferred that in the luminescent layer of the organic electroluminescence element, the luminescent material should receive charges or energy from a host material having charge-transporting ability and luminesce. Consequently, the luminescent layer usually contains a charge transport material which is usable, for example, as this host material. Charge transport materials include compounds having the property of transporting holes (often referred to as hole transport materials or hole-transporting compounds) and compounds having the property of transporting electrons (often referred to as electron transport materials or electron-transporting compounds). The luminescent layer may contain both a hole transport material and an electron transport material, or may contain either. In the case where the luminescent layer contains a compound having the property of transporting holes but contains no compound having the property of transporting electrons, the compound having the property of transporting holes may be made to transport electrons in the luminescent layer.

Examples of the charge transport material include aromatic amine compounds, phthalocyanine compounds, porphyrin compounds, thiophene compounds, benzylphenyl compounds, fluorene compounds, hydrazone compounds, silazane compounds, silanamine compounds, phosphamine compounds, quinacridone compounds, triphenylene compounds, carbazole compounds, pyrene compounds, anthracene compounds, phenanthroline compounds, quinoline compounds, pyridine compounds, triazine compounds, oxadiazole compounds, and imidazole compounds.

One of these charge transport materials may be used alone, or any desired two or more thereof may be used in combination in any desired proportion.

It is preferred that the electron transport material should be a compound which has a unit having the property of transporting an electron. The unit having the property of transporting an electron (electron transport unit) is a structure (unit) which has excellent durability in terms of electrons and has the property of transporting an electron. In the case where the luminescent layer contains two or more charge transport materials, the compound having this electron transport unit is apt to be the electron transport material described above which serves to transport electrons.

The term electron transport unit as used in the invention means a unit which an electron is apt to enter and in which the electron that has entered is apt to be stabilized. For example, in a pyridine ring or the like, the ring is slightly deficient in electron because of the nitrogen atom and is apt to receive an electron, and the electron which has entered the ring is delocalized and thereby becomes stable on the pyridine ring.

Examples of the structure of the unit having the performance described above include a monocycle or fused ring which includes a heteroatom having an sp$^2$ hybridized orbital.

Preferred as the heteroatom are nitrogen, oxygen, sulfur, and selenium because such heteroatoms are apt to form an sp² hybridized orbital, are highly stable to electrons, and have the high ability to transport electrons. Especially preferred is nitrogen. It is preferred that the number of heteroatoms having an sp² hybridized orbital which are possessed by the charge transport material should be large, from the standpoint that such charge transport material has high electron-transporting properties.

Examples of the electron transport unit are shown below, but the unit should not be construed as being limited to the following examples.

Specific examples of the electron transport unit include a quinoline ring, quinazoline ring, quinoxaline ring, phenanthroline ring, pyridine ring, pyrimidine ring, pyridazine ring, pyrazine ring, triazine ring, thiadiazole ring, benzothiadiazole ring, quinolinol metal complex, phenanthroline metal complex, hexaazatriphenylene structure, and tetracyano benzoquinoline structure. Preferred examples among these are a quinoline ring, quinazoline ring, quinoxaline ring, phenanthroline ring, pyridine ring, pyrimidine ring, pyridazine ring, pyrazine ring, triazine ring, and the like, because these units are highly stable to electrons and have high electron-transporting properties. Preferred of these, from the standpoint of excellent electrical stability, are a quinoline ring, quinazoline ring, pyridine ring, pyrimidine ring, triazine ring, 1,10-phenanthroline ring, and the like.

In the case where the electron transport unit is either a monocycle which is a 6-membered ring containing a nitrogen atom or a fused ring which is composed of such 6-membered rings fused together, it is preferred that this monocycle or fused ring has been substituted with an aromatic ring at each of the o- and p-positions to the nitrogen atom(s).

The reason for this is as follows. The o-positions and p-position in a 6-membered ring which contains a nitrogen atom are active sites, and substitution with an aromatic ring group at each of these positions results in electron delocalization. As a result, the electrons become more stable.

Incidentally, in the case where the electron transport unit is a fused ring composed of 6-membered rings each containing a nitrogen atom, a configuration suffices in which the unit has been substituted with aromatic ring groups at those o- and p-positions to each nitrogen atom which do not form part of the fused ring.

More preferred examples of the electron transport material are organic compounds having a derivative of any of the rings shown under the following group (b) (electron transport units), because these compounds are highly stable to electrons and have high electron-transporting properties.
Group (b)

[Chem. 16]

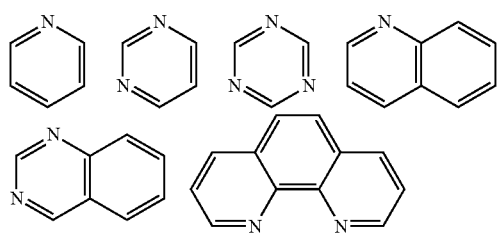

(Each of the rings included in group (b) has been substituted with an aromatic ring group at each of the o- and p-positions to the nitrogen atom(s).)

There are no particular limitations on the aromatic ring group with which the hydrogen atom on each of the 2-, 4-, and 6-position carbon atoms in the same ring with respect to the nitrogen atom, in group (b), has been replaced. Namely, the aromatic ring group may be an aromatic hydrocarbon ring group or a heteroaromatic ring group. However, it is preferred that the aromatic ring group should be an aromatic hydrocarbon ring group, from the standpoint that this group has excellent durability in terms of electrical oxidation. The number of carbon atoms of the aromatic ring group is preferably 6-30. In the case where the aromatic ring group is a fused ring, the number of the aromatic rings which have been fused together is preferably 2-4.

Preferred examples of the substituents which may be possessed by the ring structures included in group (b) include halogen atoms, alkyl groups which have 1-10 carbon atoms and may further have a substituent, alkenyl groups which have 2-10 carbon atoms and may further have a substituent, or monovalent aromatic hydrocarbon ring groups which have 6-30 carbon atoms and may further have a substituent.

Examples of electron transport materials having a low molecular weight include 2,5-bis(1-naphthyl)-1,3,4-oxadiazole (BND), 2,5-bis(6'-(2',2"-bipyridyl))-1,1-dimethyl-3,4-diphenylsilole (PyPySPyPy), bathophenanthroline (BPhen), 2,9-dimethyl-4,7-diphenyl-1,10-phenanthroline (BCPs; bathocuproine), 2-(4-biphenylyl)-5-(p-tert-butylphenyl)-1,3,4-oxadiazole (tBu-PBD), and 4,4'-bis(9-carbazole)biphenyl (CBP).

In the luminescent layer, one electron transport material may be used alone, or any desired two or more electron transport materials may be used in combination in any desired proportion.

It is preferred that the hole transport material should be a compound which has a unit having the property of transporting a hole. The unit having the property of transporting a hole (hole transport unit) is a structure (unit) which has excellent durability in terms of holes and has the property of transporting a hole.

The term hole transport unit as used in the invention means a unit which has an ionization potential that facilitates hole extraction from the luminescent layer and which is stable to holes.

The ionization potential that facilitates hole extraction from the luminescent layer is generally 5.4 eV or higher, preferably 5.5 eV or higher, more preferably 5.6 eV or higher, and is generally 6.3 eV or lower, preferably 6.2 eV or lower, more preferably 6.1 eV or lower.

The expression "being stable to holes" means that the hole transport unit is less apt to be decomposed even in a radical state. This means that a radical cation is delocalized to thereby render the unit stable even in the radical state.

Examples of the structure of the unit having the performance described above include a structure which contains a heteroatom having an sp³ orbital or an aromatic fused ring in which the number of carbon atoms is 4n.

Examples of the hole transport unit are shown below, but the hole transport unit should not be construed as being limited to the following examples.

Specific examples of the hole transport unit include a carbazole ring, phthalocyanine ring, naphthalocyanine structure, porphyrin structure, triarylamine structure, triarylphosphine structure, benzofuran ring, dibenzofuran ring, pyrene ring, phenylenediamine structure, pyrrole ring, benzidine structure, aniline structure, diarylamine structure, imidazolidinone structure, and pyrazole ring. From the standpoints of excellent stability to holes and high hole-transporting properties, a carbazole ring, benzofuran ring, dibenzofuran ring, pyrene ring, and triarylamine structure are preferred of these, and a carbazole ring, benzofuran ring, dibenzofuran ring, and pyrene ring are more preferred. Especially preferred are a carbazole ring and a pyrene ring.

More preferred examples of the hole transport material are organic compounds having a derivative of any of the rings shown under the following group (a) (hole transport units), because these compounds have excellent stability to holes and high hole-transporting properties.

Group (a)

[Chem. 17]

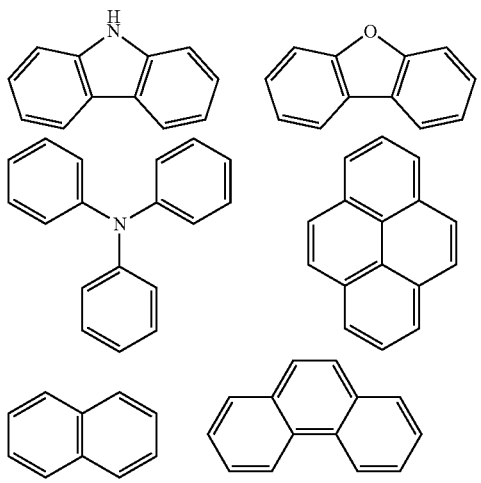

These ring structures may have substituents, and preferred examples of the substituents include halogen atoms, alkyl groups which have 1-10 carbon atoms and may further have a substituent, alkenyl groups which have 2-10 carbon atoms and may further have a substituent, or monovalent aromatic hydrocarbon ring groups which have 6-30 carbon atoms and may further have a substituent.

More specifically, examples of hole transport materials having a low molecular weight include: aromatic amine compounds which contain two or more tertiary amines and have two or more fused aromatic rings bonded as substituents to nitrogen atoms and which are represented by 4,4'-bis[N-(1-naphthyl)-N-phenylamino]biphenyl (JP-A-5-234681); aromatic amine compounds having a starburst structure, such as 4,4',4"-tris(1-naphthylphenylamino)triphenylamine (*Journal of Luminescence*, Vol. 72-74, p. 985, 1997); an aromatic amine compound constituted of a tetramer of triphenylamine (*Chemical Communications*, p. 2175, 1996); and fluorene compounds such as 2,2',7,7'-tetrakis(diphenylamino)-9,9'-spirobifluorene (*Synthetic Metals*, Vol. 91, p. 209, 1997). Furthermore, it is also possible to use the compounds which will be shown later as (Hole Transport Materials having low Molecular Weight) under [Hole Injection Layer].

In the luminescent layer, one hole transport material may be used alone, or any desired two or more hole transport materials may be used in combination in any desired proportion.

<Molecular Weight>

The charge transport material in the invention may have any desired molecular weight unless the effects of the invention are considerably lessened thereby. The molecular weight of the charge transport material in the invention is generally 10,000 or less, preferably 5,000 or less, more preferably 4,000 or less, even more preferably 3,000 or less. The molecular weight of the charge transport material in the invention is generally 100 or higher, preferably 200 or higher, more preferably 300 or higher, even more preferably 400 or higher.

Use of a charge transport material having a molecular weight within that range is preferred from the following and other standpoints. This charge transport material is high in glass transition temperature, melting point, decomposition temperature, etc., and the luminescent layer material and the luminescent layer formed therefrom have satisfactory heat resistance. Furthermore, a decrease in film quality due to recrystallization, molecule migration, etc., an increase in impurity concentration which accompanies pyrolysis of the material, and the like are less apt to occur, and the element has excellent performance. In addition, this charge transport material is easy to purify.

<Electron Affinity (EA)>

The luminescent layer may contain one charge transport material, such as any of those described above, as the only charge transport material, or may contain two or more charge transport materials. In the case where two or more charge transport materials are contained in the luminescent layer, it is desirable that the EA of the charge transport material which serves to mainly transport electrons (electron transport material) should be higher than the EA of the charge transport material which serves to mainly transport holes (hole transport material). The reason for this is as follows. In general, when a plurality of charge transport materials are contained in the same layer, electrons are apt to be carried by a material having a large value of EA. Consequently, use of a charge transport material having a large value of EA as an electron transport material makes it possible to produce an element which has a high luminescent efficiency and a long life.

It is preferred that the absolute value of the EA of the charge transport material, |EA1|, which serves to transport electrons and is contained in the luminescent layer according to the invention should be large from the standpoint that this compound is apt to be in a stable state when electrons are present at an energy level for electron transport. Meanwhile, it is preferred that the value of |EA1| should be small from the standpoint that troubles such as the inhibition of charge transport or transfer and of exciton generation by the formation of stable radical anions are less apt to arise. Specifically, the value of |EA1| is preferably 2.40 eV or higher, more preferably 2.50 eV or higher, and is desirably 3.30 eV or lower, preferably 3.20 eV or lower.

There frequently are cases where charge transport materials tend to have the following correlations between chemical structure and |EA|. For example, in the case of materials which each have, as the center, a 6-membered monocycle having aromaticity, the value of |EA| tends to increase in the order of benzene ring (no heteroatom)<pyridine ring (one heteroatom)<pyrimidine ring (two heteroatoms)<triazine ring (three heteroatoms). In the case of fused rings each composed of aromatic rings of the same structure, the value of |EA| tends to increase in the order of benzene ring (monocycle)<naphthalene ring (dicyclic fused ring)<anthracene ring (tricyclic fused ring)<chrysene ring (tetracyclic fused ring).

It is desirable that the luminescent layer according to the invention should contain a charge transport material in an amount of generally 65% by weight or more, preferably 80% by weight or more, more preferably 90% by weight or more. It is desirable that the luminescent layer should contain the charge transport material in an amount of generally 99.99% by weight or less, preferably 99.95% by weight or less, more preferably 99.9% by weight or less. In the case where two or more charge transport materials are used in combination, it is {Formation of Luminescent Layer}

It is preferred that the luminescent layer according to the invention should be formed by a wet film formation method because the efficiency of material utilization is high and because the luminescent layer is apt to mingle moderately with the hole transport layer to be formed on the anode side thereof, thereby bringing about satisfactory suitability for hole injection.

The term wet film formation method as used in the invention means a method in which a film is formed using a wet film formation method, i.e., a coating-fluid application method, such as, for example, spin coating, dip coating, die coating, bar coating, blade coating, roll coating, spray coating, capillary coating, ink-jet printing, nozzle printing, screen printing, gravure printing, or flexographic printing, and the resultant coating film is dried to form a film. Preferred of these film formation methods are spin coating, spray coating, ink-jet printing, and nozzle printing.

In the case where the luminescent layer is to be formed by a wet film formation method, the layer is formed by forming a film using a composition for luminescent-layer formation usually prepared by dissolving the luminescent material and charge transport material described above and the other materials that will be described later, which are used according to need, in an appropriate solvent.

The solvent to be used for forming the luminescent layer by a wet film formation method is not particularly limited so long as the materials, e.g., a luminescent material and a charge transport material, to be used for forming the luminescent layer satisfactorily dissolve or disperse therein.

With respect to the dissolving properties of the solvent, it is preferred that the luminescent material and the charge transport material should be soluble therein at 25° C. and 1 atm each in an amount of generally 0.01% by weight or more, preferably 0.05% by weight or more, more preferably 0.1% by weight or more.

Examples of the solvent are shown below, but the solvent should not be construed as being limited to the following examples unless the effects of the invention are lessened.

Examples of the solvent include: alkanes such as n-decane, cyclohexane, ethylcyclohexane, decalin, and bicyclohexane; aromatic hydrocarbons such as toluene, xylene, metysilene, cyclohexylbenzene, tetramethylcyclohexanone, and tetralin; halogenated aromatic hydrocarbons such as chlorobenzene, dichlorobenzene, and trichlorobenzene; aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, 2,4-dimethylanisole, and diphenyl ether; aromatic esters such as phenyl acetate, phenyl propionate, methyl benzoate, ethyl benzoate, propyl benzoate, and n-butyl benzoate; alicyclic ketones such as cyclohexanone, cyclooctanone, and fenchone; alicyclic alcohols such as cyclohexanol and cyclooctanol; aliphatic ketones such as methyl ethyl ketone and dibutyl ketone; aliphatic alcohols such as butanol and hexanol; and aliphatic ethers such as ethylene glycol dimethyl ether, ethylene glycol diethyl ether, and propylene glycol 1-monomethyl ether acetate (PGMEA).

Preferred of these solvents are alkanes and aromatic hydrocarbons.

One of these solvents may be used alone, or any desired two or more thereof may be used in combination in any desired proportion.

From the standpoint of obtaining a more even film, it is preferred that the solvent should be vaporized and removed at an adequate rate from the liquid film immediately after the film formation. It is therefore desirable that the solvent should have a boiling point of generally 80° C. or higher, preferably 100° C. or higher, more preferably 120° C. or higher. It is desirable that the boiling point of the solvent should be generally 270° C. or lower, preferably 250° C. or lower, more preferably 230° C. or lower.

{Makeup of Composition for Luminescent-Layer Formation}

It is desirable that the composition for luminescent-layer formation according to the invention should contain a luminescent material in an amount of generally 0.01% by weight or more, preferably 0.05% by weight or more, more preferably 0.1% by weight or more. It is also desirable that the composition should contain the luminescent material in an amount of generally 20% by weight or less, preferably 10% by weight or less, more preferably 5% by weight or less.

It is desirable that the composition for luminescent-layer formation according to the invention should contain a charge transport material in an amount of generally 0.1% by weight or more, preferably 0.5% by weight or more, more preferably 1% by weight or more. It is also desirable that the composition should contain the charge transport material in an amount of generally 20% by weight or less, preferably 10% by weight or less, more preferably 5% by weight or less.

It is desirable that the ratio of the content of the luminescent material to the content of the charge transport material (weight ratio of luminescent material/charge transport material) in the composition for luminescent-layer formation should be generally 0.01 or larger, preferably 0.03 or larger. It is also desirable that the ratio of the content of the luminescent material to the content of the charge transport material (weight ratio of luminescent material/charge transport material) in the composition for luminescent-layer formation should be generally 0.5 or less, preferably 0.2 or less.

The content of the solvent in the composition for luminescent-layer formation according to the invention is not limited unless the effects of the invention are considerably lessened thereby. It is preferred that the content of the solvent in the composition for luminescent-layer formation should be high, from the standpoint that this composition has a low viscosity and has excellent applicability in film formation. Meanwhile, low solvent contents are preferred from the standpoint that it is easy to efficiently form a thick film through solvent removal after film formation, making the film formation easy. Specifically, it is desirable that the content of the solvent per 100 parts by weight of the composition for luminescent-layer formation should be preferably 10 parts by weight or more, more preferably 50 parts by weight or more, especially preferably 80 parts by weight or more. It is also desirable that the content of the solvent should be preferably 99.95 parts by weight or less, more preferably 99.9 parts by weight or less, especially preferably 99.8 parts by weight or less. In the case where a mixture of two or more solvents is used in the composition for luminescent-layer formation, it is preferred to regulate the total amount of these solvents so as to satisfy that range.

The composition for luminescent-layer formation according to the invention may be configured so as to contain various additives, e.g., a leveling agent and an antifoamer, for the purpose of improving the film-forming properties thereof.

It is preferred that the solid concentration, i.e., the total amount of the luminescent material, hole transport material, electron transport material, etc., in the composition for luminescent-layer formation according to the invention should be low, from the standpoint that unevenness in film thickness is less apt to result. Meanwhile, high solid concentrations are preferred from the standpoint that the film is less apt to have defects. Specifically, it is desirable that the solid concentration thereof should be generally 0.01% by weight or higher and be generally 70% by weight or less.

A luminescent layer is usually formed by applying such a composition for luminescent-layer formation to a layer which is to underlie the luminescent layer (usually, the underlying layer is the hole injection layer or hole transport layer which will be described later) to form a film of the composition by a wet film formation method and then drying the resultant coating film to remove the solvent.

{Film Thickness}

The luminescent layer may have any desired thickness unless the effects of the invention are considerably lessened thereby. However, large thicknesses are preferred from the standpoint that the film is less apt to have defects. Meanwhile, small thicknesses are preferred from the standpoint that it is easy to attain a reduction in operating voltage. Specifically, it is desirable that the thickness thereof should be generally 3 nm or larger, preferably 5 nm or larger, and be generally 200 nm or less, preferably 100 nm or less.

Incidentally, two or more luminescent layers may have been disposed in the organic electroluminescence element. In the case where the element includes two or more luminescent layers, the conditions for each layer are as described above. However, with respect to the requirement concerning EA in relation to the adjoining electron transport layer, a configuration in which only the luminescent layer which adjoins an electron transport layer on the cathode side thereof satisfies the requirement suffices.

[Adjoining Electron Transport Layer]

The adjoining electron transport layer is a layer which is constituted of a dielectric having the property of transporting electrons and which has been disposed between the luminescent layer and the cathode so as to adjoin the luminescent layer. It is preferred that the adjoining electron transport layer should have electron-transporting properties, by which electrons injected from the cathode are transported to the luminescent layer, and further have either hole blocking property, by which holes transported to the luminescent layer are prevented from leaking out toward the cathode side, or hole buffering property, by which excitons generated in the luminescent layer are prevented from diffusing. There are no limitations on methods for forming the adjoining electron transport layer. Consequently, the layer can be formed by a wet film formation method, vapor deposition, or another method. The adjoining electron transport layer may have any desired thickness unless the effects of the invention are considerably lessened thereby. However, the thickness thereof is generally 0.3 nm or larger, preferably 0.5 nm or larger, and is generally 100 nm or less, preferably 50 nm or less.

{Charge Transport Material}

In the invention, the adjoining electron transport layer is required to have electron-transporting properties, a durability of electron current, and a durability of hole current. Consequently, it is preferred that an organic compound which has both a unit having the property of transporting an electron and a unit having the property of transporting a hole should be used as a charge transport material for forming the adjoining electron transport layer. As stated hereinabove, the hole transport unit is a structure which has excellent durability in terms of holes and has the property of transporting a hole. The electron transport unit is a structure which has excellent durability in terms of electrons and has the property of transporting an electron. Namely, it is preferred that a charge transport material having excellent durability in terms of electrical oxidation/reduction should be contained in the adjoining electron transport layer according to the invention.

The number of hole transport units and electron transport units which are possessed by the charge transport material contained in the adjoining electron transport layer is not particularly limited so long as the charge transport material has both hole-transporting properties and electron-transporting properties. However, it is preferred that the number thereof should be large, from the standpoint of attaining high charge-transporting properties. Meanwhile, from the standpoint of ease of purification, it is preferred that the number thereof should be small. Specifically, the number of hole transport units and the number of electron transport units each are preferably 1 or larger, and are preferably 10 or less, more preferably 5 or less.

With respect to the proportion of the number of hole transport units to the number of electron transport units, the numbers thereof may be the same or the number of either units may be larger than the number of the other units. It is, however, preferred that the number of electron transport units should be larger than the number of hole transport units. When the number of either units is larger than the number of the other units as in the above case, then the difference therebetween is preferably 1 or larger, and is preferably 5 or less, more preferably 3 or less.

The structures which may be possessed by the hole transport units and electron transport units and preferred examples thereof are as shown hereinabove.

A hole transport unit and an electron transport unit may have been bonded to each other in any manner so long as these units exhibit hole-transporting properties and electron-transporting properties, respectively. Specifically, the two units may have been directly bonded to each other, or may have been bonded through a linking group interposed therebetween.

Preferred examples of the linking group through which a hole transport unit is bonded to an electron transport unit are an alkylene group which may have a substituent, an alkenylene group which may have a substituent, a divalent aromatic hydrocarbon ring group which may have a substituent, and the like.

The number of carbon atoms of the alkylene group is preferably 1 or larger, and is preferably 10 or less, more preferably 8 or less. Specific examples include methylene, 1,2-ethylene, 1,3-propylene, 1,4-butylene, 1,5-pentylene, and 1,8-octylene. Preferred of these are methylene and 1,2-ethylene from the standpoint of ease of synthesis.

The number of carbon atoms of the alkenylene group is preferably 2 or larger, and is preferably 10 or less, more preferably 6 or less. Specific examples include 1,2-vinylene, 1,3-propenylene, 1,2-propenylene, and 1,4-butenylene. The vinylene is preferred of these because this group brings about an enlarged conjugate plane due to an improvement in molecular planeness and this is apt to result in charge delocalization and an improvement in stability.

The number of carbon atoms of the divalent aromatic hydrocarbon ring group is preferably 6 or larger, and is preferably 30 or less. In the case where the divalent aromatic hydrocarbon ring group has a fused ring, the number of rings which have been fused together is preferably 5 or less. Namely, it is preferred that the divalent group should be a monocycle, a di- to pentacyclic fused ring, or a divalent group composed of two or more monocycles or such fused rings linked to each other. In the case where there are a plurality of aromatic hydrocarbon rings, the number of the rings is preferably 2-8, more preferably 2-5, from the standpoint of high ring stability. Specific examples of the divalent aromatic hydrocarbon ring group include a benzene ring, naphthalene ring, phenanthrene ring, anthracene ring, triphenylene ring, chrysene ring, naphthacene ring, perylene ring, and coronene ring which each have a free valence of 2. Preferred of these are a benzene ring, naphthalene ring, anthracene ring, triphenylene ring, and the like which each have a free valence of 2, from the standpoint of high ring stability.

Especially preferred examples of the divalent aromatic hydrocarbon ring group are shown by the following structural formulae S1 to S15, but the invention should not be construed as being limited to the following examples.

[Chem. 18]

S1
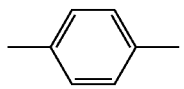

S2
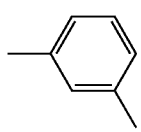

S3
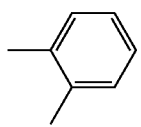

S4
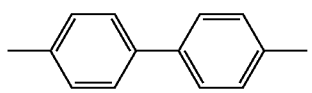

S5
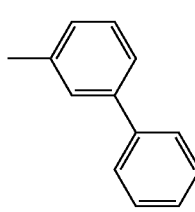

S6
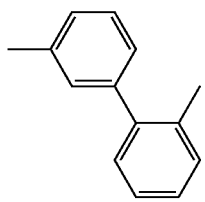

S7
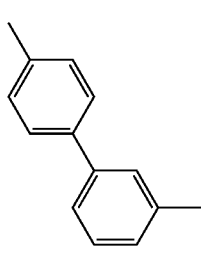

S8
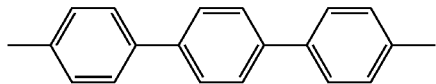

-continued

S9
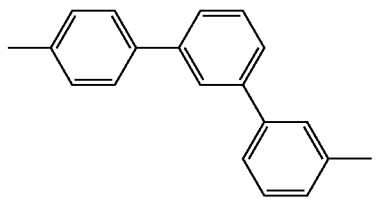

S10
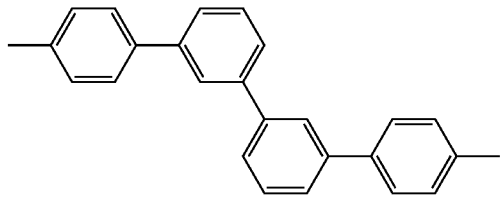

S11
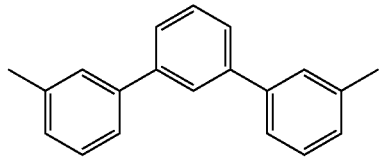

S12
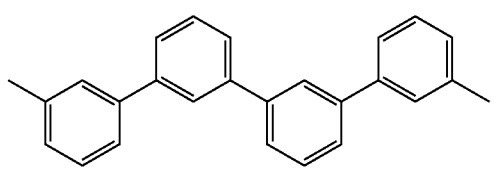

S13
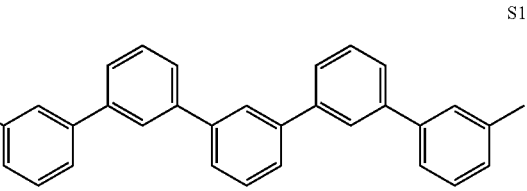

S14
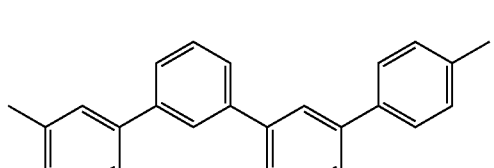

S15
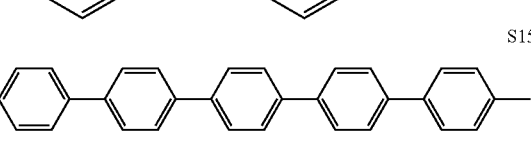

The linking group may have a substituent or may have no substituent. However, it is preferred that the linking group should have no substituent, from the standpoints of attaining a decrease in molecular crystallinity due to an improvement in stability to electrons and thereby facilitating an improvement in the stability of the film. Meanwhile, from the standpoint of the electrical stability of the compound, it is preferred that the linking group should have a substituent. In the case where the linking group has a substituent, it is preferred that the substituent should be an alkyl group, aromatic hydrocarbon ring group, heteroaromatic ring group, alkoxy group, (hetero)aryloxy group, alkylthio group, (hetero)arylthio group, cyano, or the like (the term "(hetero)aryl" herein means both "aryl" and "heteroaryl"). Preferred of these is an alkyl group from the standpoint of the stability of the compound. When the linking group has an alkyl group as a substituent, the linking group in this case is a group which is not an alkylene group. When the linking group has an aromatic hydrocarbon ring group as a substituent, the linking group in this case is a group which is not an aromatic hydrocarbon ring group.

The number of carbon atoms of the alkyl group is preferably 1 or larger, and is preferably 20 or less. Specific examples include methyl, ethyl, propyl, isopropyl, butyl, isobutyl, sec-butyl, tert-butyl, hexyl, octyl, cyclohexyl, decyl, and octadecyl. Methyl, ethyl, and isopropyl are preferred of these, because the starting materials are easily available and it is easy to synthesize the compound at low cost. Especially preferred are methyl and ethyl.

The number of carbon atoms of the aromatic hydrocarbon ring group as a substituent is preferably 6 or larger, and is preferably 25 or less. Specific examples of the aromatic hydrocarbon ring group as a substituent include: phenyl and naphthyl groups such as 1-naphthyl and 2-naphthyl; phenanthyl groups such as 9-phenanthyl and 3-phenanthyl and anthryl groups such as 1-anthryl, 2-anthryl, and 9-anthryl; naphthacenyl groups such as 1-naphthacenyl and 2-naphthacenyl; chrysenyl groups such as 1-chrysenyl, 2-chrysenyl, 3-chrysenyl, 4-chrysenyl, 5-chrysenyl, and 6-chrysenyl; and pyrenyl groups such as 1-pyrenyl, triphenylenyl groups such as 1-triphenylenyl, coronenyl groups such as 1-coronenyl, and biphenyl groups such as 4-biphenyl and 3-biphenyl. Preferred of these, from the standpoint of the stability of the compound, are phenyl, 2-naphthyl, 3-biphenyl, and the like. Phenyl is especially preferred from the standpoint of ease of purification.

The number of carbon atoms of the heteroaromatic ring group as a substituent is preferably 3 or larger, and is preferably 20 or less. Examples of the aromatic hydrocarbon ring group as a substituent include: thienyl groups such as 2-thienyl; furyl groups such as 2-furyl; imidazolyl groups such as 2-imidazolyl; carbazolyl groups such as 9-carbazolyl; pyridyl groups such as 2-pyridyl; and triazinyl groups such as 1,3,5-triazin-2-yl. From the standpoint of stability, carbazolyl groups are preferred of these, and 9-carbazolyl is especially preferred. The number of carbon atoms of the alkoxy group is preferably 1 or larger, and is preferably 20 or less. Specific examples include methoxy, ethoxy, isopropyloxy, cyclohexyloxy, and octadecyloxy.

The number of carbon atoms of the (hetero)aryloxy group is preferably 3 or larger, and is preferably 20 or less. Specific examples include phenoxy, 1-naphthyloxy, 9-anthranyloxy, and 2-thienyloxy.

The number of carbon atoms of the alkylthio group is preferably 1 or larger, and is preferably 20 or less. Specific examples include methylthio, ethylthio, isopropylthio, and cyclohexylthio.

The number of carbon atoms of the (hetero)arylthio group is preferably 3 or larger, and is preferably 20 or less. Specific examples include phenylthio, 1-naphthylthio, 9-anthranylthio, and 2-thienylthio.

Preferred examples of the charge transport material contained in the adjoining electron transport layer are compounds having structures represented by the following general formulae (5) to (7).

$$(A)_m\text{-}(L)_l\text{-}(B)_n \quad (5)$$

$$(B)\text{-}(L\text{-}A)_x \quad (6)$$

$$(A)\text{-}(L\text{-}B)_y \quad (7)$$

(In the formulae, symbol A represents a hole transport unit which has 1-30 carbon atoms and may have a substituent; B represents an electron transport unit which has 1-30 carbon atoms and may have a substituent; L represents a hydrocarbon group which has 1-30 carbon atoms and may have a substituent; l represents an integer of 0-3; and m and n each represent an integer of 1-4. In the case where l, m, and/or n is 2 or larger, the multiple L's, A's, or B's each may be the same or different. Symbols x and y represent an integer of 1-4; in the case where x or y is an integer of 2 or larger, the multiple L-A groups or L-B groups each may be the same or different.)

Incidentally, A in general formula (5) and A in general formula (6) each represent a monovalent group, and A in general formula (7) represents a y-valent group. Likewise, B in general formula (5) and B in general formula (7) each represent a monovalent group, and B in general formula (6) represents an x-valent group. Furthermore, $(L)_l$ in general formula (5) represent a group having the valence of m+n, and L in general formula (6) and L in general formula (7) each represent a divalent group.

It is preferred that A should be the hole transport unit described above in detail, B should be the electron transport unit described above in detail, and L should be the linking group described above in detail. Specific examples thereof and preferred modes thereof also are the same. It is especially preferred that L should be a saturated hydrocarbon group which has 1-10 carbon atoms and may have a substituent, an unsaturated hydrocarbon group having 2-10 carbon atoms, or an aromatic hydrocarbon ring group having 6-30 carbon atoms.

The structures of formulae (5) to (7) each are "A-L-B", specifically when l, m, and n in formula (5) are 1, x in formula (6) is 1, and y in formula (7) is 1. Formulae (5) to (7) respectively have, for example, the structures of the following formulae (5') to (7').

[Chem. 19]

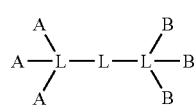

(5')

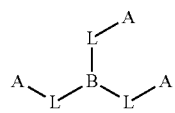

(6')

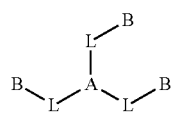

(7')

Compounds which are preferred as the charge transport material for forming the adjoining electron transport layer are enumerated below.

[Chem. 20]
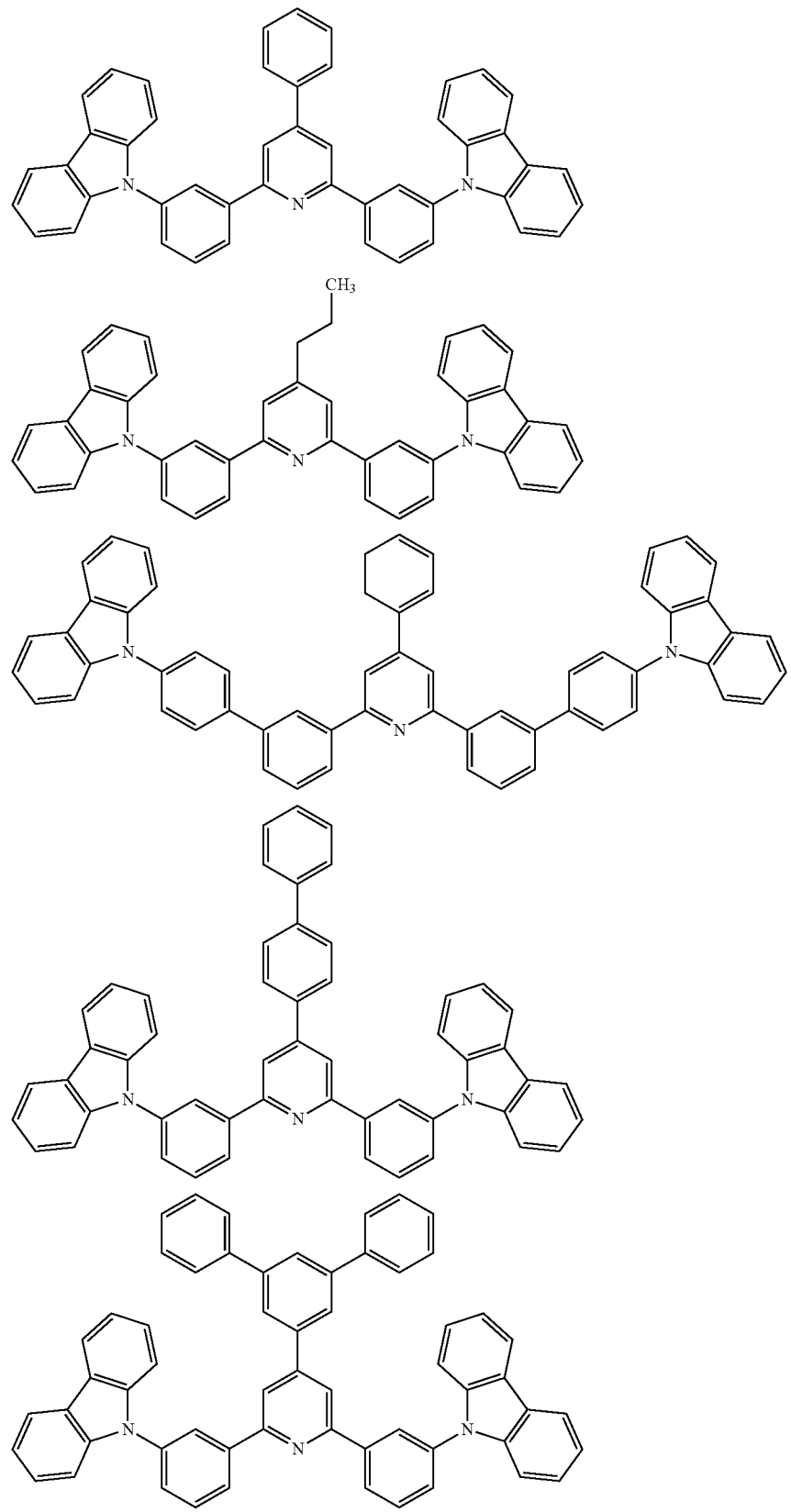

-continued
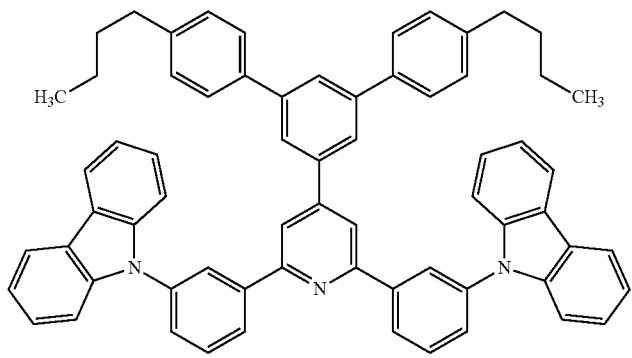
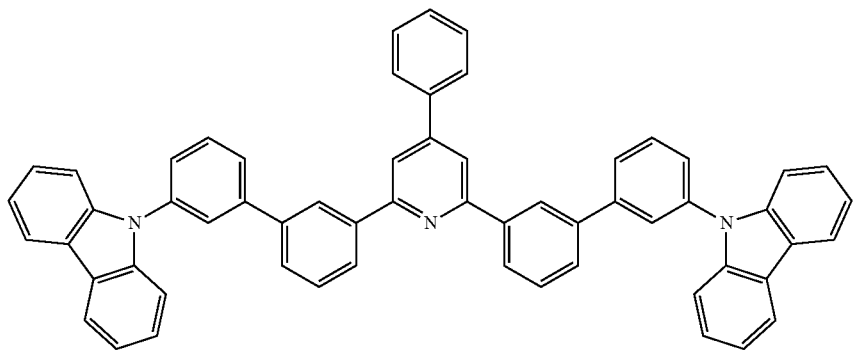
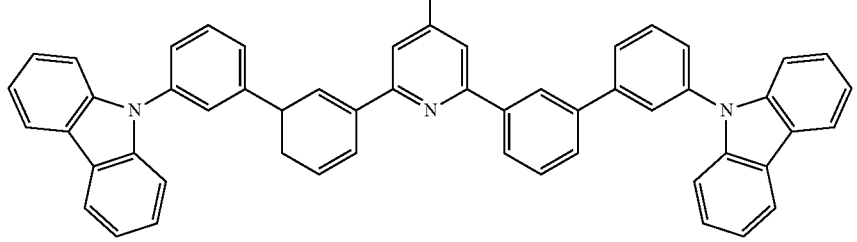
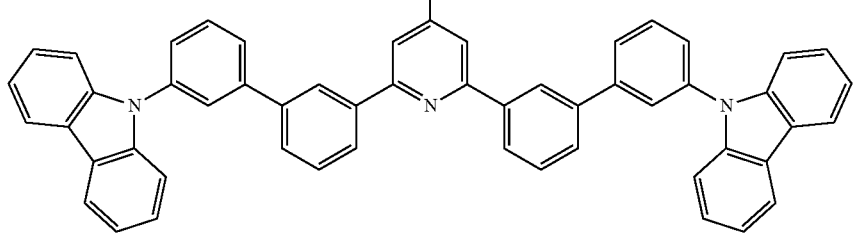

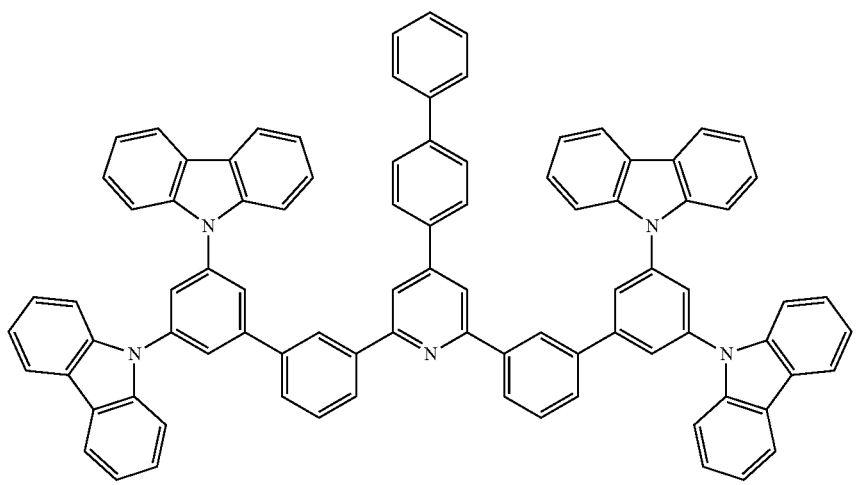
[Chem. 21]
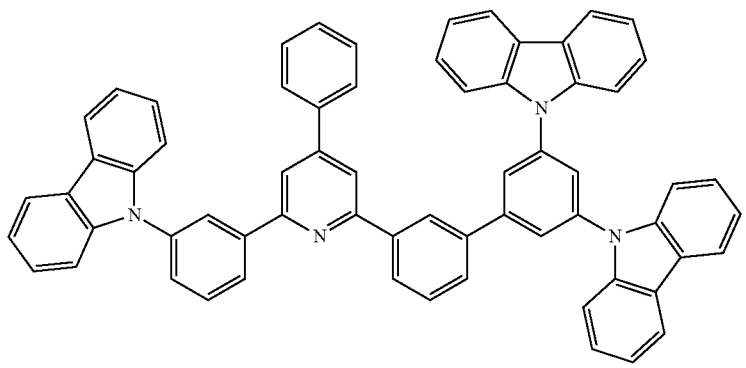
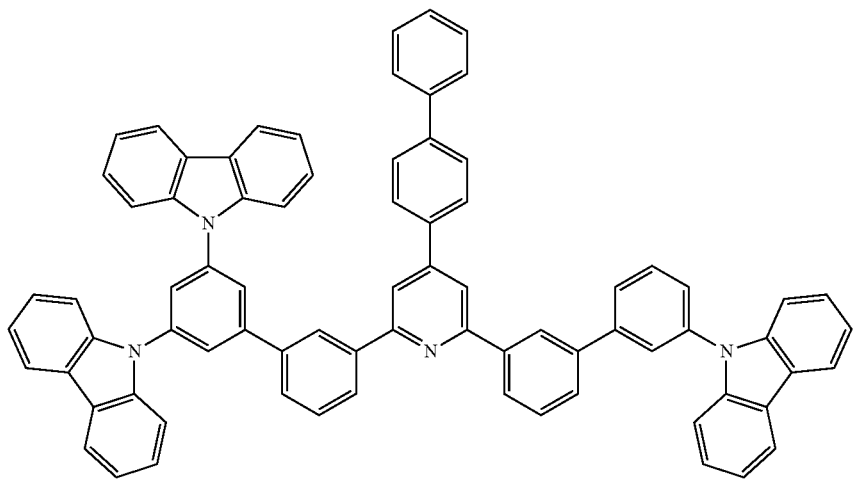

-continued
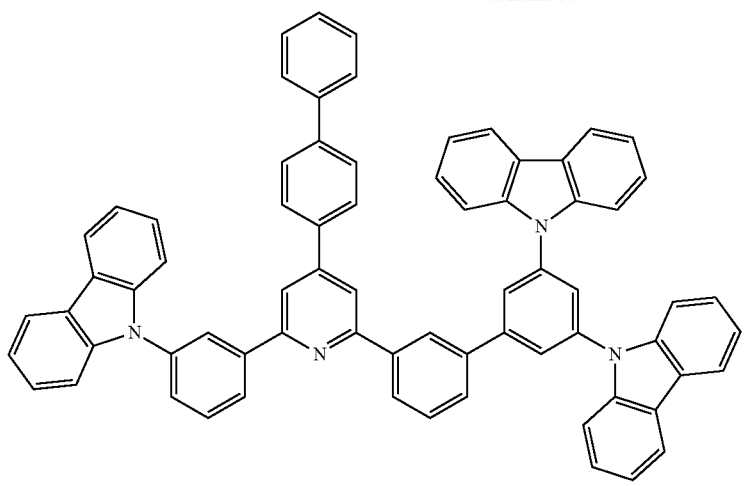
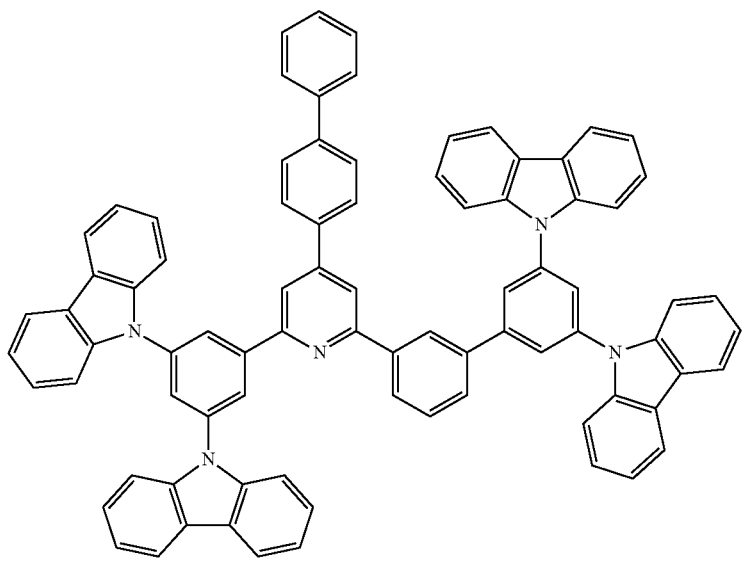
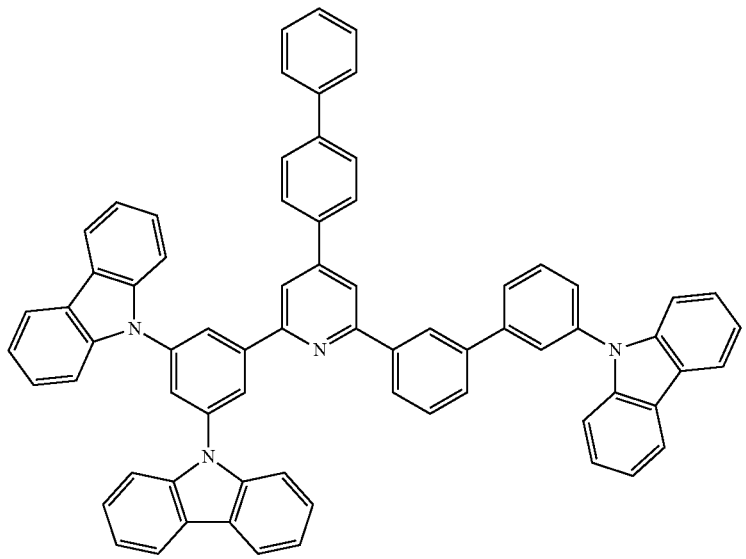

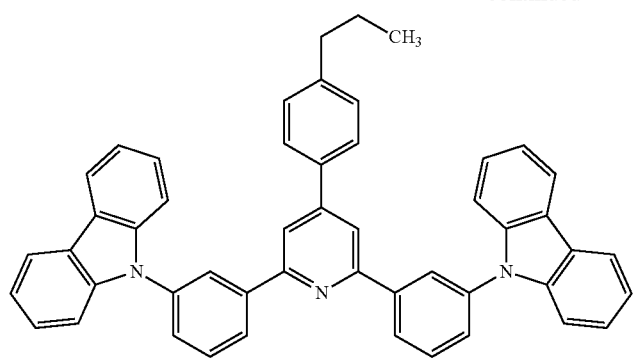
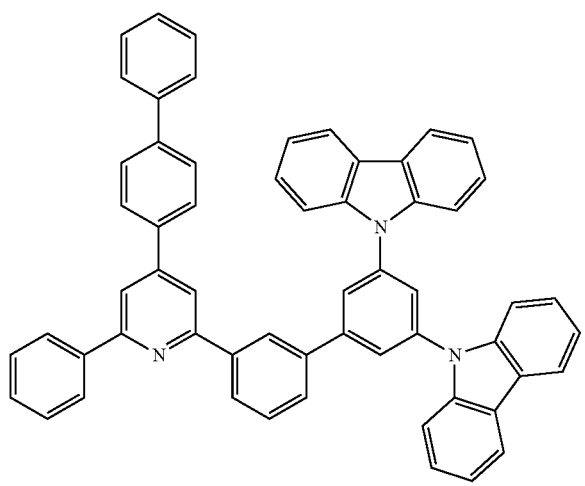
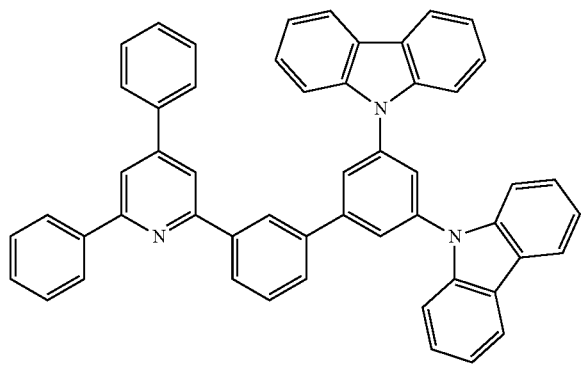

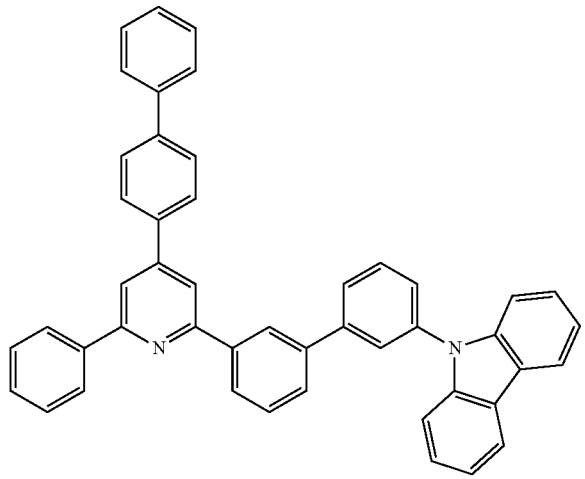
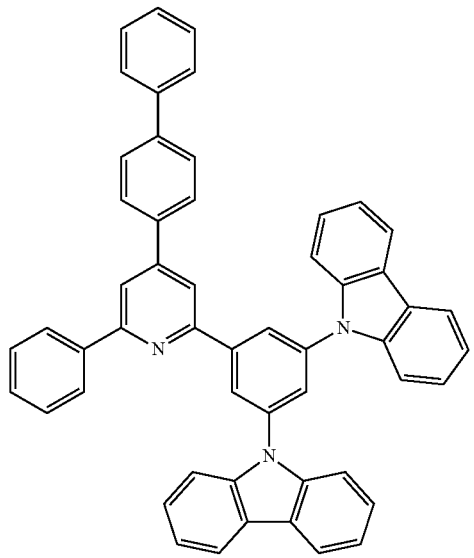
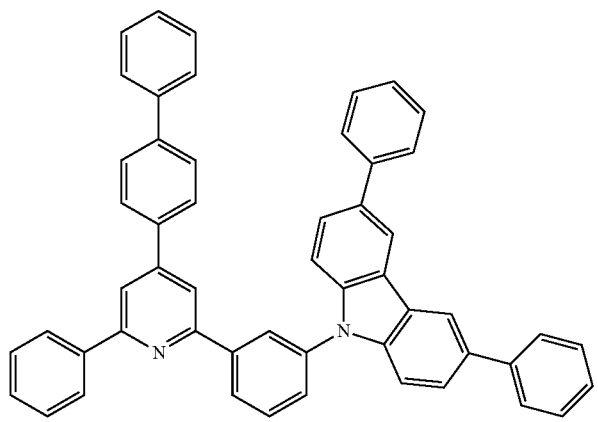
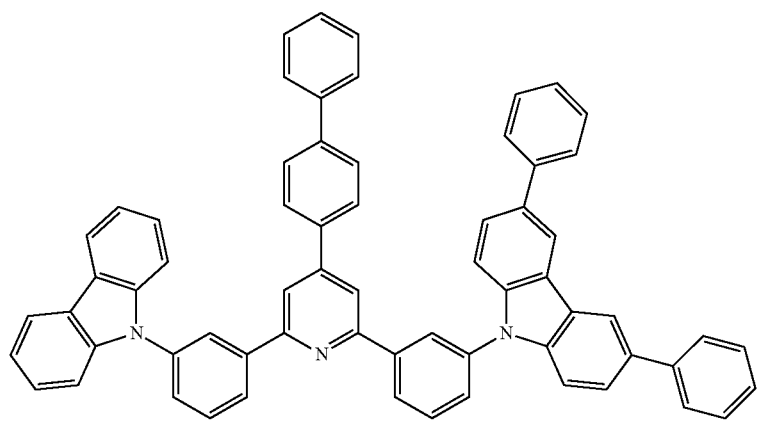

[Chem. 22]
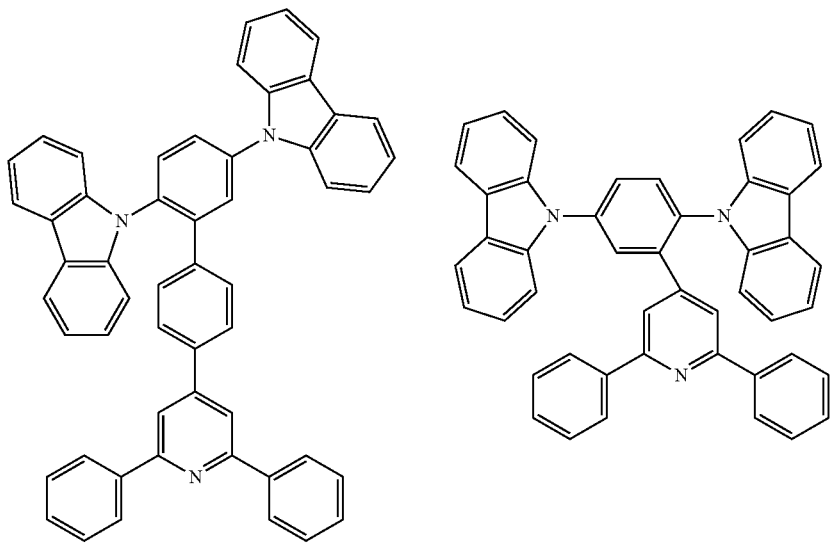
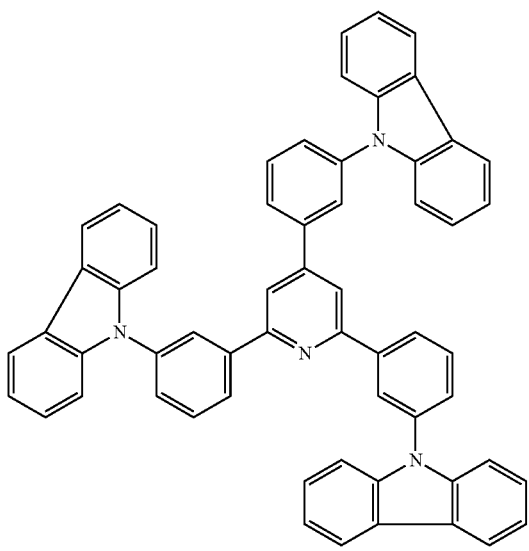
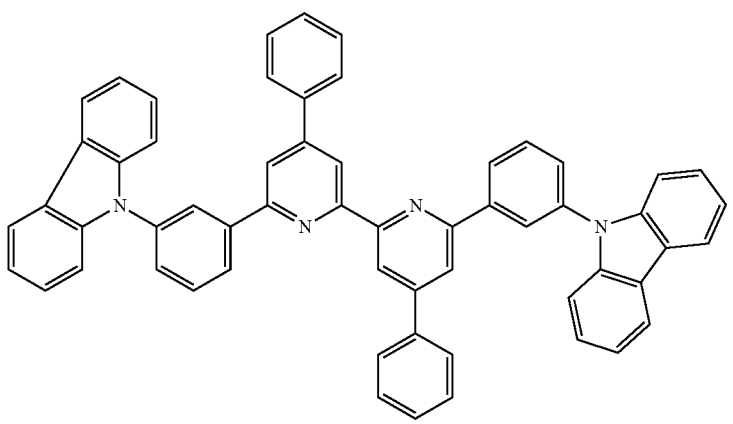

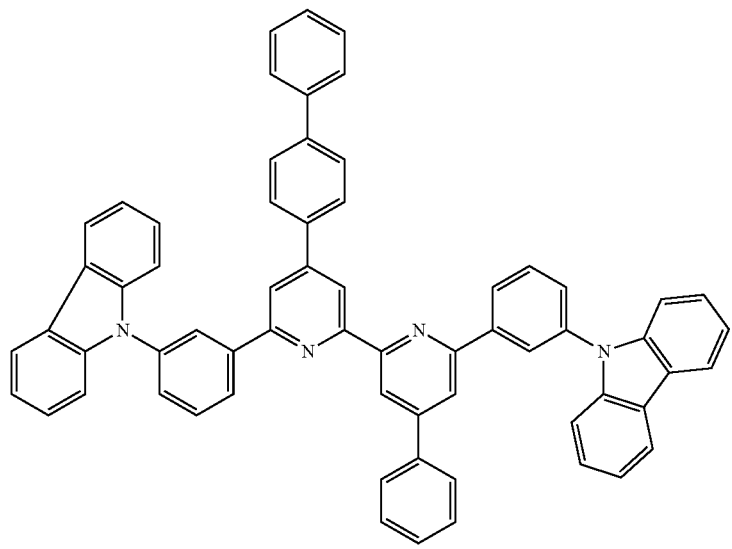
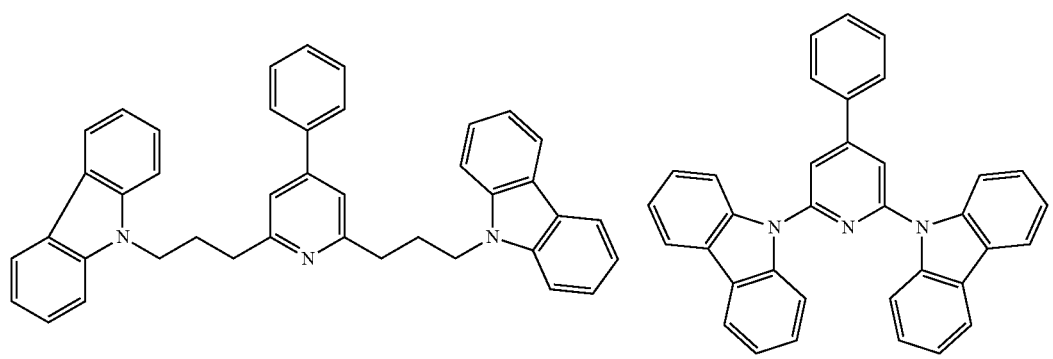
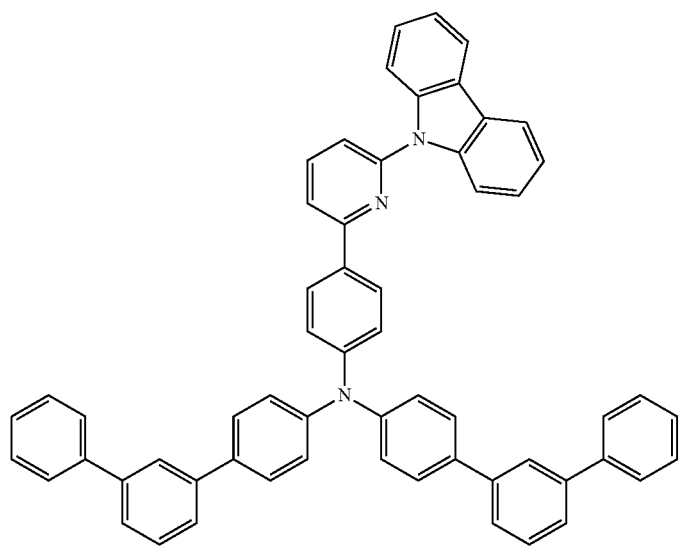

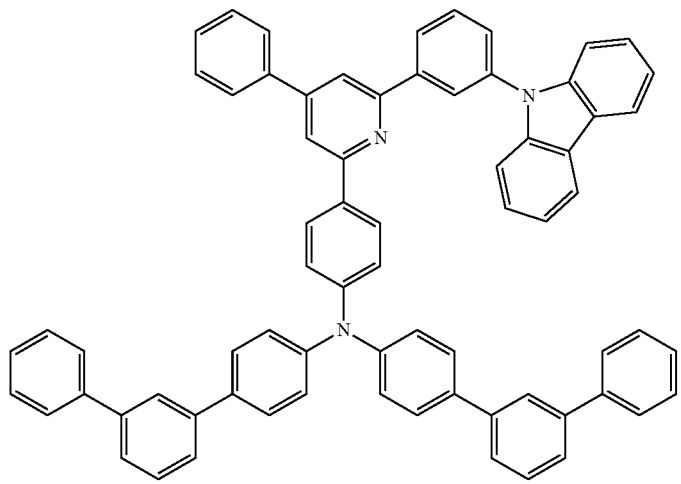
[Chem. 23]
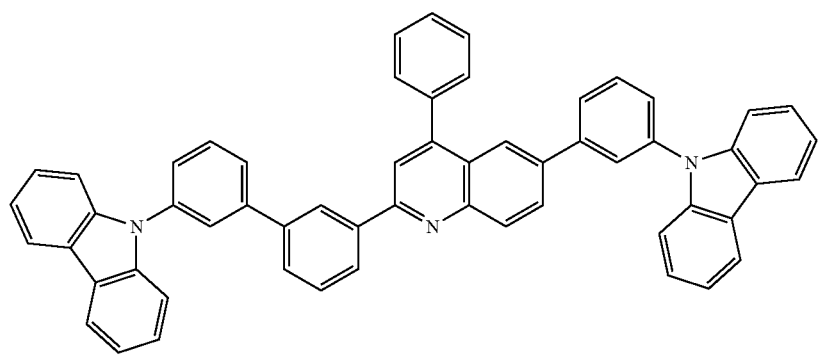
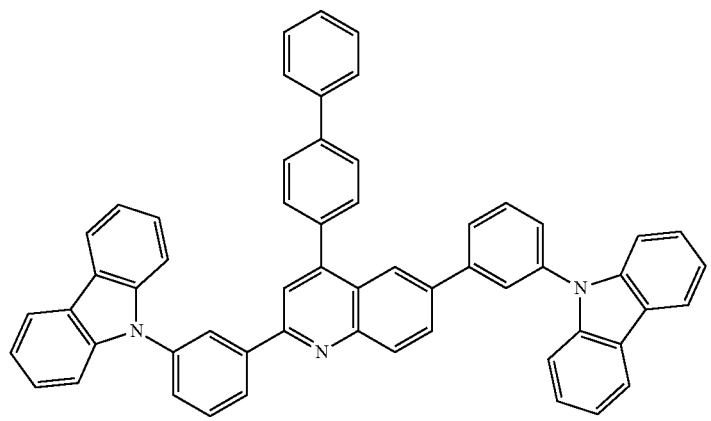

-continued
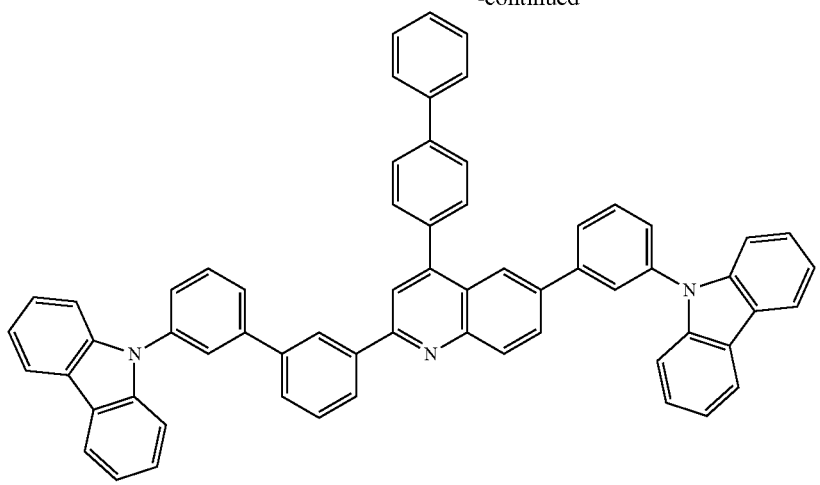
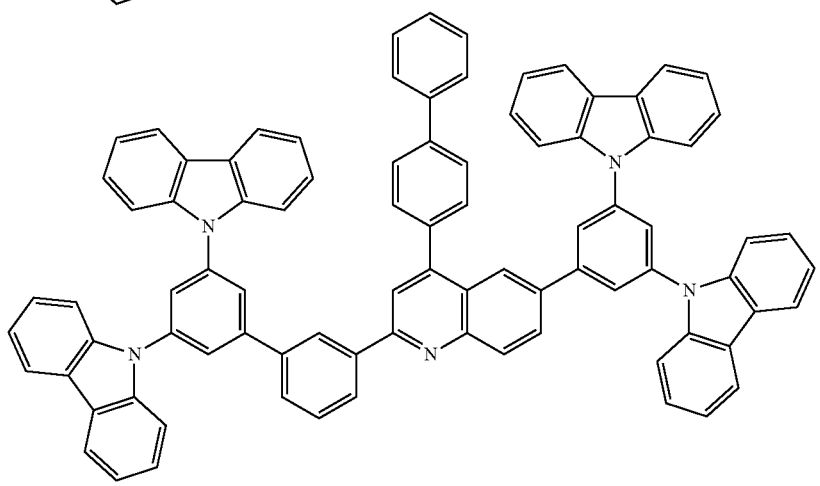
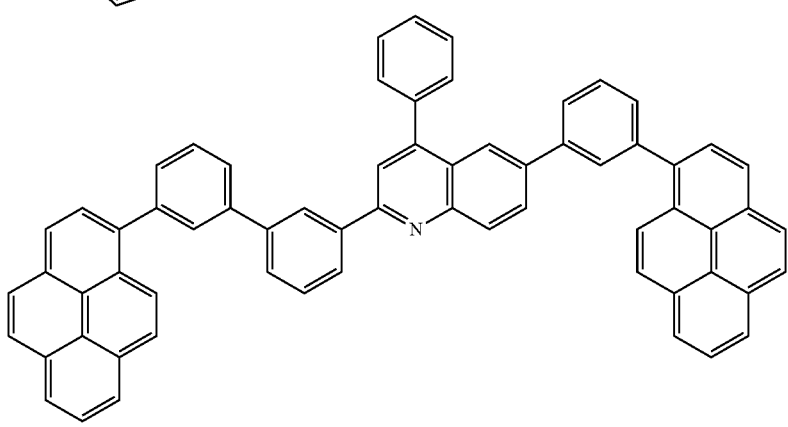
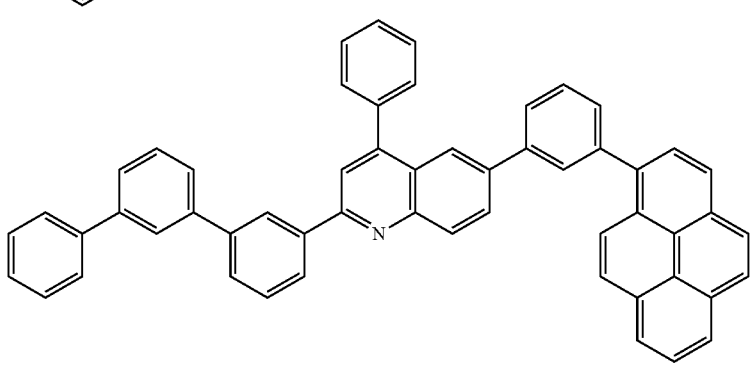

-continued

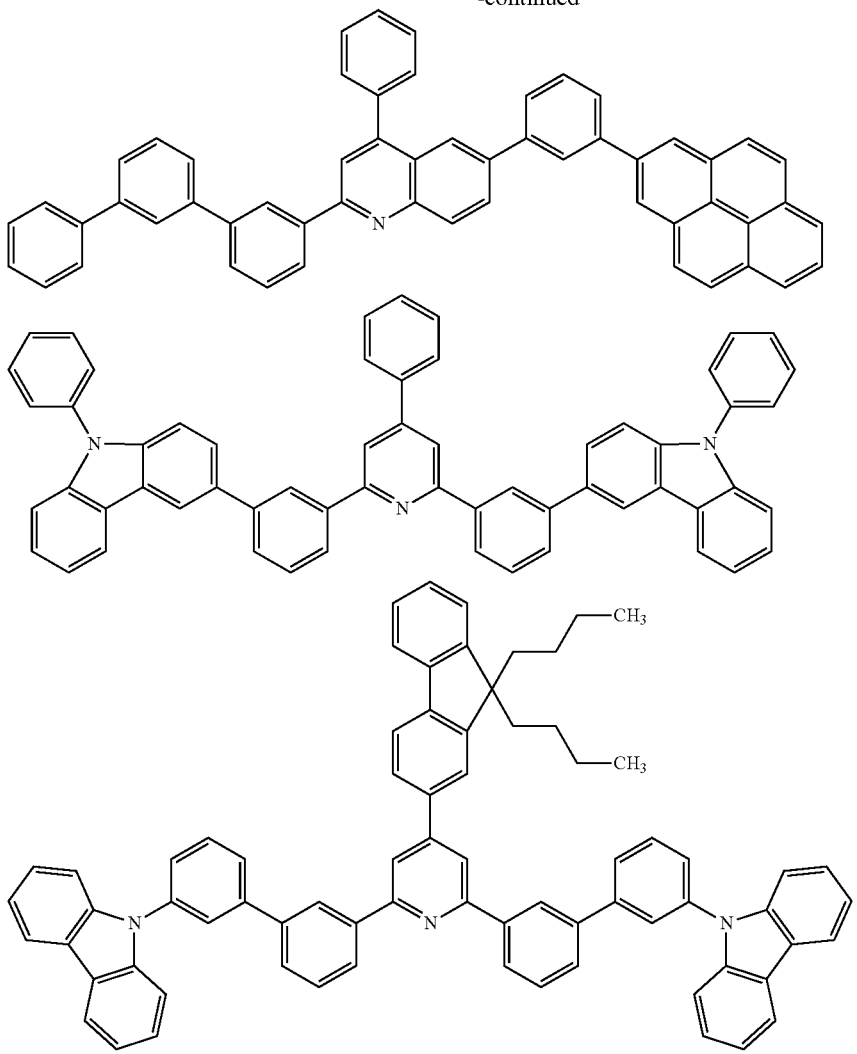

In the adjoining electron transport layer according to the invention, one of the charge transport materials described above may be contained alone or any desired two or more thereof may be contained in combination in any desired proportion.

<Molecular Weight>

It is preferred that the organic compound to be used as the charge transport material for forming the adjoining electron transport layer should have a molecular weight within the following range, from the standpoints that the organic compound having such a molecular weight has satisfactory heat resistance and is rarely causative of gas evolution and that this organic compound is easy to purify to a high purity. Specifically, it is desirable that the molecular weight thereof should be generally 10,000 or less, preferably 5,000 or less, more preferably 4,000 or less, even more preferably 3,000 or less, and be generally 100 or higher, preferably 200 or higher, more preferably 300 or higher, even more preferably 400 or higher.

<Electron Affinity (EA)>

The adjoining electron transport layer may contain one charge transport material, such as any of those described above, as the only charge transport material, or may contain two or more charge transport materials. In the case where the adjoining electron transport layer has two or more charge transport materials, it is desirable that the EA of the charge transport material which serves to mainly transport electrons (electron transport material) should be higher than the EA of the charge transport material which serves to mainly transport holes (hole transport material). The reason for this is as follows. In general, when a plurality of charge transport materials are contained in the same layer, electrons are apt to be carried by a material having a large value of EA. Consequently, use of a charge transport material having a large value of EA as an electron transport material makes it possible to produce an element which has a high luminescent efficiency and a long life.

It is preferred that the absolute value of the EA of a charge transport material, |EA|, which is contained in the adjoining electron transport layer according to the invention should be large from the standpoint that this compound is apt to be in a stable state when electrons are present at an energy level for electron transport. Meanwhile, it is preferred that the value of |EA| should be small from the standpoint that troubles such as the inhibition of charge transport or transfer and of exciton generation by the formation of stable radical anions are less apt to arise. Specifically, the absolute value, |EA2|, of the EA of the charge transport material which is the highest in the absolute value of EA among the charge transport materials contained in the adjoining electron transport layer (when the adjoining electron transport layer contains only one charge transport material, the EA of this charge transport material; when the layer contains two or more charge transport materials, the EA of the charge transport material which is the highest in the absolute value of EA among the plurality of charge transport materials) is preferably 2.30 eV or higher, more preferably 2.40 eV or higher, and is preferably 3.20 eV or less, more preferably 3.10 eV or less.

There frequently are cases where charge transport materials tend to have the correlations described above between chemical structure and |EA|.

[Relationship Between EA1 and EA2]

The organic electroluminescence element of the invention is characterized in that the electron affinity EA1 of the charge transport material which serves to transport electrons, among the charge transport materials contained in the luminescent layer, and the electron affinity EA2 of the charge transport material which is the highest in the absolute value of electron affinity, among the charge transport materials contained in the adjoining electron transport layer, satisfy the relationship represented by the following expression (1), preferably the following expression (3).

$$0.00 \text{ eV} \leq |EA1-|EA2| \leq 0.20 \text{ eV} \quad \text{Expression (1)}$$

$$0.00 \text{ eV} < |EA1|-|EA2| \leq 0.20 \text{ eV} \quad \text{Expression (3)}$$

Namely, the organic electroluminescence element of the invention is characterized in that the |EA1| of the charge transport material contained in the luminescent layer is equal to or larger than the |EA2| of the charge transport material contained in the adjoining electron transport layer, preferably, the |EA1| is larger than the |EA2|.

The mechanism by which this configuration brings about effects is presumed to be as described hereinabove. Consequently, it is desirable that the value of |EA1|−|EA2| in the invention should be 0.00 eV or higher, preferably 0.01 eV or higher, especially preferably 0.04 eV or higher. It is desirable that the value of |EA1|−|EA2| in the invention should be 0.20 eV or less, preferably 0.19 eV or less, more preferably 0.17 eV or less.

In the invention, the charge transport materials contained in the luminescent layer may be the same as or different from the charge transport materials contained in the adjoining electron transport layer. It is, however, preferred that the adjoining electron transport layer should contain a charge transport material which is different from any of the charge transport materials contained in the luminescent layer. The reason for this is as follows. The charge transport materials contained in the luminescent layer are required to have the property of causing the luminescent material to luminesce efficiently, whereas the adjoining electron transport layer generally is intended to efficiently transport electrons and to block or relax holes. The two layers thus differ in required material property.

Especially when the luminescent layer and/or the adjoining electron transport layer contains two or more charge transport materials, it is preferred that the charge transport materials which are the highest in EA in the respective layers should differ from each other. The reason for this is that although the charge transport material which is the highest in EA in each layer mainly serves to transport electrons, the two layers differ in the performance required of the charge transport material(s) as described above and, hence, differ in optimal material as a matter of course.

The organic electroluminescence element of the invention, in which a charge transport material contained in the luminescent layer and a charge transport material contained in the adjoining electron transport layer satisfy expression (1), preferably expression (3), may be produced in the following manner. A combination of charge transport materials is temporarily selected while taking account of the correlations between chemical structure and |EA| in charge transport materials described above, and each charge transport material is examined for EA by the method described above. A combination of charge transport materials for use in the luminescent layer with charge transport materials for use in the adjoining electron transport layer is selected so that the charge transport materials for use in the luminescent layer and the charge transport materials for use in the adjoining electron transport layer satisfy expression (1), preferably expression (3).

[Cathode]

The cathode is an electrode which serves to inject electrons into the layer located on the luminescent-layer side.

With respect to the material of the cathode, the cathode is usually constituted of a metal, e.g., aluminum, gold, silver, nickel, palladium, or platinum, a metal oxide, e.g., an oxide of indium and/or tin, a metal halide, e.g., copper iodide, carbon black, an electrically conductive polymer, e.g., poly(3-methylthiophene), polypyrrole, or polyaniline, or the like. Preferred of these are metals having a low work function, from the standpoint of efficiently injecting electrons. For example, use is made of an adequate metal such as tin, magnesium, indium, calcium, aluminum, or silver or an alloy thereof. Examples thereof include electrodes of alloys having a low work function, such as magnesium-silver alloys, magnesium-indium alloys, and aluminum-lithium alloys.

One material for the cathode may be used alone, or any desired two or more cathode materials may be used in combination in any desired proportion.

The film thickness of the cathode varies depending on the required degree of transparency. In the case where transparency is required, it is preferred to regulate the cathode so as to have a visible-light transmittance of generally 60% or higher, preferably 80% or higher. In this case, the thickness of the cathode is generally 5 nm or larger, preferably 10 nm or larger, and is generally about 1,000 nm or less, preferably about 500 nm or less. In the case where the cathode may be opaque, this cathode may have any desired thickness and may be identical with a substrate. Furthermore, it is possible to superpose a layer of a different electroconductive material on the cathode.

Moreover, a layer of a metal which has a high work function and is stable to the air may be superposed on a cathode constituted of a metal having a low work function, such as, for example, an alkali metal, e.g., sodium or cesium, or an alkaline earth metal, e.g., barium or calcium, for the purpose of protecting the cathode. This superposition is preferred because the stability of the element is enhanced thereby. For this purpose, use is made of a metal such as, for example, aluminum, silver, copper, nickel, chromium, gold, or platinum. One of these materials may be used alone, or any desired two or more thereof may be used in combination in any desired proportion.

<Work Function (WF)>

It is preferred that the work function (WF) of the cathode should be high, from the standpoint of stability to the air, moisture, etc. Meanwhile, from the standpoint of suitability for electron injection into the cathode-side electron transport layer, it is preferred that the WF thereof should be low. Specifically, the WF thereof is preferably 2.00 eV or higher, more preferably 2.40 eV or higher, and is preferably 4.90 eV or less, more preferably 4.80 eV or less.

[Cathode-Side Electron Transport Layer]

The cathode-side electron transport layer is an electron transport layer disposed between the adjoining electron transport layer and the cathode. In the case where there are a plurality of electron transport layers between the adjoining electron transport layer and the cathode, the electron transport layer which is located on the most cathode side, among these, is the cathode-side electron transport layer.

As electron transport materials for the electron transport layer(s) to be disposed between the adjoining electron transport layer and the cathode, use is usually made of compounds which are high in the efficiency of electron injection thereinto from the cathode or from a cathode-side adjoining layer and which have a high electron mobility and are capable of efficiently transporting injected electrons. Examples of compounds which satisfy such requirements include metal complexes such as an aluminum complex or lithium complex of 8-hydroxyquinoline (JP-A-59-194393), metal complexes of 10-hydroxybenzo[h]quinoline, oxadiazole derivatives, distyrylbiphenyl derivatives, silole derivatives, 3-hydroxyflavone metal complexes, 5-hydroxyflavone metal complexes, benzoxazole metal complexes, benzothiazole metal complexes, trisbenzimidazolylbenzene (U.S. Pat. No. 5,645,948), quinoxaline compounds (JP-A-6-207169), phenanthroline derivatives (JP-A-5-331459), 2-t-butyl-9,10-N,N-dicyanoanthraquinonediimine, triazine compounds, n-type hydrogenated amorphous silicon carbide, n-type zinc sulfide, and n-type zinc selenide.

Also usable as an electron transport material for the electron transport layer is a material obtained by doping an electron-transporting organic compound represented by a nitrogen-containing heterocyclic compound, e.g., bathophenanthroline, or by a metal complex, e.g., an aluminum complex of 8-hydroxyquiunoline, with an alkali metal such as sodium, potassium, cesium, lithium, or rubidium (described in JP-A-10-270171, JP-A-2002-100478, JP-A-2002-100482, etc.). Use of this electron transport material is preferred because the electron transport layer can be made to combine suitability for electron injection/transport and excellent film quality. It is also effective to dope the electron-transporting organic compound with an inorganic salt such as lithium fluoride or cesium carbonate.

One of such materials for the electron transport layer(s) to be disposed between the adjoining electron transport layer and the cathode may be used alone, or any desired two or more thereof may be used in combination in any desired proportion.

There are no limitations on methods for forming the electron transport layer(s) between the adjoining electron transport layer and the cathode. Consequently, the layer(s) can be formed by a wet film formation method, vapor deposition, or another method.

The electron transport layer(s) disposed between the adjoining electron transport layer and the cathode may have any desired thickness unless the effects of the invention are considerably lessened thereby. However, the thickness thereof is generally 1 nm or larger, preferably 5 nm or larger, and is generally 300 nm or less, preferably 100 nm or less.

In the case where the cathode-side electron transport layer contains two or more charge transport materials, the absolute value of the electron affinity of the charge transport material which is the highest in the absolute value of electron affinity is expressed by $|EA3|$.

It is preferred that the absolute value of the EA of a charge transport material, $|EA|$, which is contained in the cathode-side electron transport layer according to the invention should be large from the standpoint that this compound is apt to be in a stable state when electrons are present at an energy level for electron transport. Meanwhile, it is preferred that the value of $|EA|$ should be small from the standpoint that troubles such as the inhibition of charge transport or transfer and of exciton generation by the formation of stable radical anions are less apt to arise. Specifically, the absolute value, $|EA3|$, of the EA of the charge transport material which is the highest in the absolute value of EA among the charge transport materials contained in the adjoining electron transport layer (when the adjoining electron transport layer contains only one charge transport material, the EA of this charge transport material; when the layer contains two or more charge transport materials, the EA of the charge transport material which is the highest in the absolute value of EA among the plurality of charge transport materials) is preferably 2.60 eV or higher, more preferably 2.70 eV or higher, and is preferably 3.30 eV or less, more preferably 3.20 eV or less. There frequently are cases where charge transport materials tend to have the correlations described above between chemical structure and $|EA|$.

[Relationship Between EA3 and WF]

The organic electroluminescence element of the invention is characterized in that the difference between the absolute value $|WF|$ of the work function of the cathode and the absolute value $|EA (EA3)|$ of the charge transport material which is the highest in the absolute value of electron affinity among the charge transport materials contained in the cathode-side electron transport layer is within a given range and satisfies the relationship represented by the following expression (2).

$$-1.60 \text{ eV} \leq |WF| - |EA3| \leq 1.60 \text{ eV} \qquad \text{Expression (2)}$$

It is more preferred that the difference between the $|WF|$ and the $|EA3|$ should satisfy the relationship represented by the following expression (4).

$$0.00 \text{ eV} \leq |WF| - |EA3| \leq 1.60 \text{ eV} \qquad \text{Expression (4)}$$

The mechanism by which this configuration brings about effects is presumed to be as described hereinabove.

Transfer of electrons from the cathode to the cathode-side electron transport layer occurs from the work function (WF) of the cathode to the energy level which serves to transport electrons in the cathode-side electron transport layer (electron affinity (EA3) of the charge transport material which is the highest in the absolute value of electron affinity). The smaller the difference between the two, the smoother the electrons can move between the energy levels. Consequently, the absolute value of the difference therebetween is 1.60 eV or less, preferably 1.50 eV or less, more preferably 1.40 eV or less. Meanwhile, as the absolute value of the energy level serving to transport electrons in the cathode-side electron transport layer becomes smaller as compared with the absolute value of the work function of the cathode, the cathode-side electron transport layer becomes less apt to be reduced and becomes more stable. Consequently, the value of $|WF|-|EA3|$ is −1.60 eV or higher, preferably −1.00 eV or higher, more preferably −0.5 eV or higher, especially preferably 0.00 eve or higher, most preferably 0.80 eV or higher. The value of $|WF|-|EA3|$ is 1.60 eV or less, preferably 1.50 eV or less, more preferably 1.40 eV or less.

[Layer Configuration of the Organic Electroluminescence Element and Methods for Forming the Layers]

Embodiments of the organic electroluminescence element of the invention, concerning the layer configuration, general methods for forming the layers, etc., are explained below by reference to FIG. 1.

FIG. 1 is a diagrammatic sectional view which illustrates an example of the structure of an organic electroluminescence element 10 of the invention. In FIG. 1, numeral 1 donates a substrate, 2 an anode, 3 a hole injection layer, 4 a hole transport layer, 5 a luminescent layer, 6 a hole blocking layer (adjoining electron transport layer), 7 a cathode-side electron transport layer, 8 an electron injection layer, and 9 a cathode.

[Substrate]

The substrate 1 serves as the support of the organic electroluminescence element. As the substrate 1, use may be made of a plate of quartz or glass, a metal plate, a metal foil, a plastic film or sheet, etc. Especially preferred are glass plates and plates of transparent synthetic resins such as polyesters, polymethacrylates, polycarbonates, and polysulfones. In the case where a synthetic-resin substrate is used, it is preferred to take account of the gas barrier properties thereof. It is preferred that the substrate should have high gas barrier properties because the deterioration of an organic electroluminescence element caused by the ambient atmosphere which has passed through the substrate is less apt to occur. Because of this, one of preferred methods is to form a dense silicon oxide film or the like on at least one surface of the synthetic-resin substrate to ensure gas barrier properties.

[Anode]

The anode 2 serves to inject holes into the layer located on the side facing the luminescent layer 5.

This anode 2 is usually constituted of a metal, e.g., aluminum, gold, silver, nickel, palladium, or platinum, a metal oxide, e.g., an oxide of indium and/or tin, a metal halide, e.g., copper iodide, carbon black, an electrically conductive polymer, e.g., poly(3-methylthiophene), polypyrrole, or polyaniline, or the like.

The anode 2 is frequently formed usually by a technique such as sputtering or vacuum deposition. In the case where fine particles of a metal, e.g., silver, fine particles of copper iodide or the like, carbon black, fine particles of an electrically conductive metal oxide, fine particles of an electrically conductive polymer, or the like is used for forming an anode 2, use can be made of a method in which these fine particles or the like is dispersed in an adequate binder resin solution and this dispersion is applied to a substrate 1 to thereby form the anode 2. Furthermore, in the case of an electrically conductive polymer, a thin film can be directly formed on a substrate 1 by electrolytic polymerization. It is also possible to apply an electrically conductive polymer to a substrate 1 to form an anode 2 (Appl. Phys. Lett., Vol. 60, p. 2711, 1992).

The anode 2 usually has a single-layer structure. However, it is possible, if desired, to configure the anode 2 so as to have a multilayer structure constituted of a plurality of materials.

The thickness of the anode 2 may be suitably selected according to the required degree of transparency, etc. In the case where transparency is required, it is preferred to regulate the visible-light transmittance thereof to generally 60% or higher, preferably 80% or higher. In this case, the thickness of the anode 2 is generally 5 nm or larger, preferably 10 nm or larger. Furthermore, the thickness of the anode 2 in this case is generally about 1,000 nm or less, preferably about 500 nm or less. In the case where the anode 2 may be opaque, this anode 2 may have any desired thickness. A substrate 1 which functions also as an anode 2 may be used. Furthermore, it is possible to superpose a layer of a different electroconductive material on the anode 2.

It is preferred to subject the surface of the anode 2 to an ultraviolet (UV)/ozone treatment or a treatment with an oxygen plasma or argon plasma for the purpose of removing impurities adherent to the anode 2 to regulate the ionization potential and improve the hole-injecting properties.

[Hole Injection Layer]

The hole injection layer 3 is a layer which transports holes from the anode 2 to the luminescent layer 5. The hole injection layer 3 is not a layer essential to the organic electroluminescence element of the invention. However, when being disposed, the hole injection layer 3 is formed usually on the anode 2.

For forming the hole injection layer 3 according to the invention, either vacuum deposition or a wet film formation method may be used without particular limitations. From the standpoint of diminishing dark spots, it is preferred to form the hole injection layer 3 by a wet film formation method.

The thickness of the hole injection layer 3 is generally 5 nm or larger, preferably 10 nm or larger, and is generally 1,000 nm or less, preferably 500 nm or less.

{Formation of Hole Injection Layer by Wet Film Formation Method}

In the case where the hole injection layer 3 is formed by a wet film formation method, the procedure is usually as follows. Materials for constituting the hole injection layer 3 are mixed with a suitable solvent (solvent for hole injection layer formation) to prepare a composition for film formation (composition for hole injection layer formation). This composition for hole injection layer 3 formation is applied, by a suitable technique, to the layer (usually, the anode 2) which is to underlie the hole injection layer. The resultant coating film is dried to thereby form the hole injection layer 3.

<Hole Transport Material>

The composition for hole injection layer formation usually contains a hole transport material as a constituent material for the hole injection layer 3 and further contains a solvent.

The hole transport material may be either a high-molecular compound such as a polymer or a low-molecular compound such as a monomer, so long as these compounds are compounds which are used in the hole injection layers 3 of organic electroluminescence elements and which have hole-transporting properties. However, it is preferred that the hole transport material should be a high-molecular compound.

The hole transport material preferably is a compound which has an ionization potential of 4.5-6.0 eV, from the standpoint of a barrier to charge injection from the anode 2 into the hole injection layer 3. Examples of the hole transport material include aromatic amine derivatives, phthalocyanine derivatives, porphyrin derivatives, oligothiophene derivatives, polythiophene derivatives, benzylphenyl derivatives, a compound formed by linking tertiary amines with a fluorene group, hydrazone derivatives, silazane derivatives, silanamine derivatives, phosphamine derivatives, quinacridone derivatives, polyaniline derivatives, polypyrrole derivatives, poly(phenylenevinylene) derivatives, poly(thienylenevinylene) derivatives, polyquinoline derivatives, polyquinoxaline derivatives, and carbon.

The term derivatives used in the invention has the following meaning. In the case of aromatic amine derivatives, for example, that term includes both aromatic amines themselves and compounds in which the main frameworks are the aromatic amines, and the derivatives may be either polymers or monomers.

The hole transport material(s) to be used as a material for the hole injection layer 3 may include any one of such compounds alone or may include two or more thereof. In the case where two or more hole transport materials are contained, the combination is not limited. It is, however, preferred that one or more high-molecular aromatic tertiary amine compounds should be used in combination with one or more other hole transport materials.

From the standpoints of amorphousness and visible-light transmittance, aromatic amine compounds are preferred of the examples shown above, and aromatic tertiary amine compounds are especially preferred. The aromatic tertiary amine compounds are compounds each having an aromatic tertiary amine structure, and include compounds each having a group derived from an aromatic tertiary amine.

The aromatic tertiary amine compounds are not particularly limited in the kind thereof. However, a high-molecular compound having a weight-average molecular weight of 1,000-1,000,000 (polymeric compound made up of consecutive repeating units) is more preferred from the standpoint of even luminescence due to the effect of surface smoothing. Preferred examples of such high-molecular aromatic tertiary amine compounds include high-molecular compounds having a repeating unit represented by the following general formula (I).

[Chem. 24]

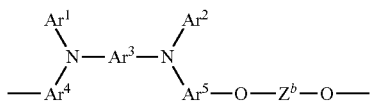

(In formula (I), $Ar^1$ to $Ar^5$ each independently represent an aromatic ring group which may have a substituent. $Z^b$ represents a linking group selected from the following linking groups. The two of $Ar^1$ to $Ar^5$ which are bonded to the same nitrogen atom may be bonded to each other to form a ring.
<Linking Groups>

[Chem. 25]

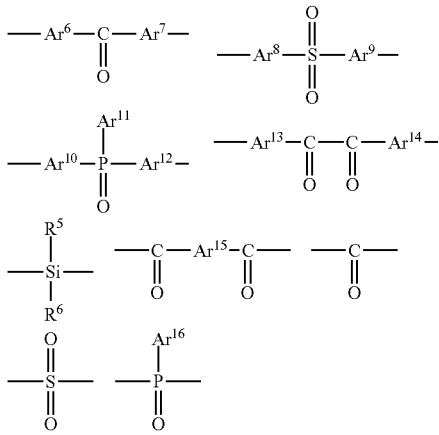

(In the formulae, $Ar^6$ to $Ar^{16}$ each independently represent an aromatic ring group which may have a substituent. $R^5$ and $R^6$ each independently represent a hydrogen atom or any desired substituent.))

The aromatic ring groups of $Ar^1$ to $Ar^{16}$ preferably are groups which are derived from a benzene ring, naphthalene ring, phenanthrene ring, thiophene ring, or pyridine ring and which each have a free valence of 1 or 2, from the standpoint of the solubility, heat resistance, and suitability for hole injection/transport of the high-molecular compounds. More preferred are a benzene ring and a naphthalene ring.

The aromatic ring groups of $Ar^1$ to $Ar^{16}$ may further have substituents. It is preferred that the molecular weight of each substituent should be generally about 400 or lower, in particular, about 250 or lower. Preferred examples of the substituents are alkyl groups, alkenyl groups, alkoxy groups, aromatic ring groups, and the like.

In the case where $R^5$ and $R^6$ are any desired substituents, examples of the substituents include alkyl groups, alkenyl groups, alkoxy groups, silyl, siloxy, and aromatic ring groups.

Specific examples of the high-molecular aromatic tertiary amine compounds having a repeating unit represented by formula (I) include the compounds described in International Publication No. 2005/089024.

Also preferred as the hole transport material is an electrically conductive polymer (PEDOT/PSS) obtained by polymerizing 3,4-ethylenedioxythiophene in high-molecular poly(styrenesulfonic acid), the conductive polymer being a derivative of polythiophene. This polymer may be used after the ends of the polymer are capped with a methacrylate or the like.

The hole transport material may be any of the crosslinkable compounds which will be described later under the section [Hole Transport Layer]. Methods for film formation in the case of using the crosslinkable compound are also the same.

The concentration of the hole transport material in the composition for hole injection layer formation is not limited unless the effects of the invention are considerably lessened thereby. From the standpoint of evenness in film thickness, the concentration of the hole transport material in the composition for hole injection layer formation is generally 0.01% by weight or higher, preferably 0.1% by weight or higher, more preferably 0.5% by weight or higher, and is generally 70% by weight or less, preferably 60% by weight or less, more preferably 50% by weight or less. It is preferred that the concentration thereof should be low from the standpoint that application of such a composition is less apt to result in unevenness in film thickness. Meanwhile, from the standpoint of forming a hole injection layer which is less apt to have defects, it is preferred that the concentration thereof should be high.

<Electron-Accepting Compound>

It is preferred that the composition for hole injection layer formation should contain an electron-accepting compound as a constituent material for the hole injection layer 3.

It is preferred that the electron-accepting compound should be a compound which has oxidizing ability and has the ability to accept one electron from the hole transport material described above. Specifically, the electron-accepting compound preferably is a compound having an electron affinity of 4 eV or higher, and more preferably is a compound having an electron affinity of 5 eV or higher.

Examples of such electron-accepting compound include one or more compounds selected, for example, from the group consisting of triarylboron compounds, metal halides, Lewis acids, organic acids, onium salts, salts of arylamines with metal halides, and salts of arylamines with Lewis acids. More specific examples of the electron-accepting compound include: onium salts substituted with an organic group, such as 4-isopropyl-4'-methyldiphenyliodonium tetrakis(pentafluorophenyl)borate and triphenylsulfonium tetrafluoroborate (International Publication No. 2005/089024); inorganic compounds having a high valence, such as iron(III) chloride (JP-A-11-251067) and ammonium peroxodisulfate; cyano compounds such as tetracyanoethylene and aromatic boron compounds such as tris(pentafluorophenyl)borane (JP-A-2003-31365); fullerene derivatives; iodine; and sulfonic acid ions such as poly(styrenesulfonic acid) ions, alkylbenzenesulfonic acid ions, and camphorsulfonic acid ions.

These electron-accepting compounds serve to oxidize the hole transport material and can thereby improve the electrical conductivity of the hole injection layer 3.

The content of the electron-accepting compound in the hole injection layer 3 or in the composition for hole injection layer formation, based on the hole transport material, is generally 0.1% by mole or higher, preferably 1% by mole or higher, but is generally 100% by mole or less, preferably 40% by mole or less.

<Other Constituent Materials>

Besides the hole transport material and electron-accepting compound described above, other ingredients may be incorporated as materials for the hole injection layer 3, unless the incorporation considerably lessens the effects of the invention. Examples of the other ingredients include various luminescent materials, electron transport materials, binder resins, and applicability improvers. One of such other ingredients may be used alone, or any desired two or more thereof may be used in combination in any desired proportion.

<Solvent>

It is preferred that the solvent contained in the composition for hole injection layer formation to be used in a wet film formation method should include at least one compound in which the constituent materials for the hole injection layer 3 that were described above can dissolve. It is desirable that this solvent should have a boiling point which is generally 110° C. or higher, preferably 140° C. or higher, more preferably 200° C. or higher, and is generally 400° C. or lower, more preferably 300° C. or lower. It is preferred that the boiling point of the solvent should be high, from the standpoints of attaining a drying rate which is not too high and of thereby attaining excellent film quality. Meanwhile, it is preferred that the boiling point of the solvent should be low, from the standpoint that low-temperature drying is possible and thermal influences are less apt to be imposed on the other layers and the substrate.

Examples of the solvent include ether solvents, ester solvents, aromatic hydrocarbon solvents, and amide solvents.

Examples of the ether solvents include: aliphatic ethers such as ethylene glycol dimethyl ether, ethylene glycol diethyl ether, and propylene glycol 1-monomethyl ether acetate (PGMEA); and aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, and 2,4-dimethylanisole.

Examples of the ester solvents include aromatic esters such as phenyl acetate, phenyl propionate, methyl benzoate, ethyl benzoate, propyl benzoate, and n-butyl benzoate.

Examples of the aromatic hydrocarbon solvents include toluene, xylene, cyclohexylbenzene, 3-isopropylbiphenyl, 1,2,3,4-tetramethylbenzene, 1,4-diisopropylbenzene, cyclohexylbenzene, and methylnaphthalene.

Examples of the amide solvents include N,N-dimethylformamide and N,N-dimethylacetamide.

Besides these, dimethyl sulfoxide and the like are also usable.

One of these solvents may be used alone, or any desired two or more thereof may be used in combination in any desired proportion.

<Methods for Film Formation>

When the hole injection layer 3 is formed by a wet process, the procedure is usually as follows. A composition for hole injection layer formation is prepared and then applied, by a wet film formation method, to the layer (usually, the anode 2) which is to underlie the hole injection layer 3. The resultant coating film is dried to thereby form the hole injection layer 3.

The temperature at which the composition is applied is preferably 10-50° C. because film defects due to crystal generation within the composition are less apt to result.

The relative humidity at which the composition is applied is not limited unless the effects of the invention are considerably lessened thereby. However, the relative humidity is generally from 0.01 ppm to 80%.

After the application, the film of the composition for hole injection layer formation usually is dried. This drying may be conducted with heating or without heating. Examples of heating means which are usable when drying by heating is conducted include clean ovens, hot plates, infrared rays, halogen lamp heaters, and microwave irradiation. Preferred of these are clean ovens and hot plates because the whole film is apt to be evenly heated therewith.

In the case where heating is conducted, it is preferred to heat the coating film at a temperature not lower than the boiling point of the solvent used in the composition for hole injection layer formation, unless this heating considerably lessens the effects of the invention. In the case where the solvent used for the hole injection layer is a mixed solvent including two or more solvents, it is preferred that at least one of these should be heated at a temperature not lower than the boiling point of the solvent. When an increase in the boiling point of the solvent is taken into account, it is preferred that in the heating step, the coating film should be heated preferably at 120-410° C.

When heating is conducted, heating temperature is not particularly limited. However, in the case where the layer in contact with the cathode-side surface of the hole injection layer is to be formed by a wet film formation method, it is preferred to conduct the heating at a temperature at which the coating film is sufficiently insolubilized. The heating period, when heating is conducted, is preferably 10 seconds or longer but is generally 180 minutes or shorter. It is preferred that the heating period should be short, from the standpoint that components of the other layers are less apt to diffuse. However, from the standpoint that a homogeneous hole injection layer is easy to form, long drying periods are preferred. The heating may be conducted in two or more portions.

{Formation of Hole Injection Layer 3 by Vacuum Deposition}

In the case where the hole injection layer 3 is formed by vacuum deposition, the hole injection layer 3 can be formed, for example, in the following manner. One or more constituent materials for the hole injection layer 3 (e.g., the hole transport material and electron-accepting compound described above) are placed in one or more crucibles disposed in a vacuum vessel (when two or more materials are used, the materials are placed in respective crucibles), and the vacuum vessel is evacuated to about $10^{-4}$ Pa with an adequate vacuum pump. Thereafter, the crucible is heated (when two or more materials are used, each crucible is heated) to vaporize the material while regulating the vaporization amount (when two or more materials are used, the materials are vaporized while independently regulating the vaporization amounts of the respective materials) to form a hole injection layer 3 on the anode 2 formed on the substrate 1 which has been placed so as to face the crucible(s). Incidentally, in the case where two or more materials are used, it is possible to use a method in which a mixture of these materials is placed in a crucible and is heated and vaporized to form a hole injection layer 3.

The degree of vacuum during the deposition is not limited unless the effects of the invention are considerably lessened thereby. The degree of vacuum during the deposition is generally $0.1 \times 10^{-6}$ Torr ($0.13 \times 10^{-4}$ Pa) to $9.0 \times 10^{-6}$ Torr ($12.0 \times 10^{-4}$ Pa). The rate of deposition is not limited unless the effects of the invention are considerably lessened thereby. The rate of deposition is generally 0.1-5.0 Å/sec. The film deposition temperature during the deposition is not limited unless the effects of the invention are considerably lessened. The deposition is conducted at a film deposition temperature of preferably 10-50° C.

[Hole Transport Layer]

The hole transport layer 4 is a layer which transports holes from the anode 2 to the luminescent layer 5. The hole transport layer 4 is not a layer which is essential to the organic electroluminescence element of the invention. However, when being disposed, the hole transport layer 4 is formed on the hole injection layer 3 when there is the hole injection layer 3. When there is no hole injection layer 3, the hole transport layer 4 can be formed on the anode 2.

For forming the hole transport layer 4, either vacuum deposition or a wet film formation method may be used without particular limitations. From the standpoint of diminishing dark spots, it is preferred to form the hole transport layer 4 by a wet film formation method.

For forming the hole transport layer 4, it is preferred to use a material which has high hole-transporting properties and which can efficiently transport injected holes. Consequently, it is preferred that the material for forming the hole transport layer 4 should have a low ionization potential, be highly transparent to visible light, have a high hole mobility and excellent stability, and be less apt to generate impurities serving as a trap, during production or use. Furthermore, since the hole transport layer 4 is in contact with the luminescent layer 5 in many cases, it is preferred that the material should neither quench the luminescence from the luminescent layer 5 nor form an exciplex with the luminescent layer 5 to reduce the efficiency.

Such a material for the hole transport layer 4 may be any of the materials which have hitherto been used as constituent materials for hole transport layers 4. Examples of the material for the hole transport layer 4 include the materials enumerated above as examples of the hole transport material to be used in the hole injection layer 3 described above. Examples thereof further include arylamine derivatives, fluorene derivatives, spiro derivatives, carbazole derivatives, pyridine derivatives, pyrazine derivatives, pyrimidine derivatives, triazine derivatives, quinoline derivatives, phenanthroline derivatives, phthalocyanine derivatives, porphyrin derivatives, silole derivatives, oligothiophene derivatives, fused polycyclic aromatic derivatives, and metal complexes.

Examples thereof furthermore include polyvinylcarbazole derivatives, polyarylamine derivatives, polyvinyltriphenylamine derivatives, polyfluorene derivatives, polyarylene derivatives, poly(arylene ether sulfone) derivatives containing tetraphenylbenzidine, poly(arylenevinylene) derivatives, polysiloxane derivatives, polythiophene derivatives, and poly(p-phenylenevinylene) derivatives. These derivatives may be any of alternating copolymers, random polymers, block polymers, and graft copolymers. Furthermore, the derivatives each may be a polymer in which the main chain has one or more branches and which has three or more ends, or may be a so-called dendrimer.

Of these, polyarylamine derivatives and polyarylene derivatives are preferred as the material for the hole transport layer 4.

It is preferred that the polyarylamine derivatives should be polymers which contain a repeating unit represented by the following formula (II). Especially preferred is a polymer which is made up of repeating units each represented by the following formula (II). In this case, the repeating units may differ from each other in $Ar^a$ or $Ar^b$.

[Chem. 26]

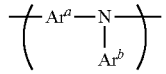

(II)

(In formula (II), $Ar^a$ and $Ar^b$ each independently represent an aromatic ring group which may have a substituent.)

Examples of the aromatic hydrocarbon ring groups of $Ar^a$ and $Ar^b$, which each may have a substituent, include a 6-membered monocycle having a free valence of 1 or 2, a fused ring which is composed of two to five 6-membered rings fused together and which has a free valence of 1 or 2, and a group which is composed of two or more such rings linked to each other through a direct bond and which has a free valence of 1 or 2, such as a benzene ring, naphthalene ring, anthracene ring, phenanthrene ring, perylene ring, tetracene ring, pyrene ring, benzpyrene ring, chrysene ring, triphenylene ring, acenaphthene ring, fluoranthene ring, and fluorene ring which each have a free valence of 1 or 2.

Examples of the heteroaromatic ring groups which each may have a substituent include a 5- or 6-membered monocycle having a free valence of 1 or 2, a fused ring which is composed of two to four 5- or 6-membered rings fused together and which has a free valence of 1 or 2, and a group which is composed of two or more such rings linked to each other through a direct bond and which has a free valence of 1 or 2, such as a furan ring, benzofuran ring, thiophene ring, benzothiophene ring, pyrrole ring, pyrazole ring, imidazole ring, oxadiazole ring, indole ring, carbazole ring, pyrroloimidazole ring, pyrrolopyrazole ring, pyrrolopyrrole ring, thienopyrrole ring, thienothiophene ring, furopyrrole ring, furofuran ring, thienofuran ring, benzisooxazole ring, benzisothiazole ring, benzimidazole ring, pyridine ring, pyrazine ring, pyridazine ring, pyrimidine ring, triazine ring, quinoline ring, isoquinoline ring, cinnoline ring, quinoxaline ring, phenanthridine ring, perimidine ring, quinazoline ring, quinazolinone ring, and azulene ring which each have a free valence of 1 or 2.

From the standpoints of solubility and heat resistance, it is preferred that $Ar^a$ and $Ar^b$ should each independently be a ring selected from the group consisting of a benzene ring, naphthalene ring, anthracene ring, phenanthrene ring, triphenylene ring, pyrene ring, thiophene ring, pyridine ring, and fluorene ring which each have a free valence of 1 or 2, or be a group which is composed of two or more benzene rings liked to each other and which has a free valence of 1 or 2 (e.g., biphenyl (biphenyl) or terphenylene (terphenylene)).

Preferred of these are the group derived from a benzene ring and having a free valence of 1 (phenyl), the group which is composed of two benzene rings linked to each other and which has a free valence of 1 (biphenyl), and the group derived from fluorene and having a free valence of 1 (fluorenyl).

Examples of the substituents which may be possessed by the aromatic ring groups represented by $Ar^a$ and $Ar^b$ include alkyl groups, alkenyl groups, alkynyl groups, alkoxy groups, aryloxy groups, alkoxycarbonyl groups, dialkylamino groups, diarylamino groups, acyl groups, halogen atoms, haloalkyl groups, alkylthio groups, arylthio groups, silyl, siloxy, cyano, and aromatic ring groups.

Examples of the polyarylene derivatives include polymers which have, as repeating units, arylene groups such as the aromatic ring groups optionally having a substituent which were enumerated above as examples of $Ar^a$ and $Ar^b$ contained in formula (II).

It is preferred that the polyarylene derivatives should be polymers which have repeating units of the following formula (V-1) and/or the following formula (V-2).

[Chem. 27]

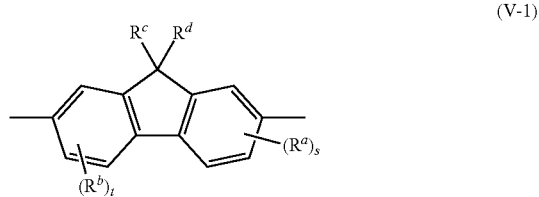

(V-1)

(In formula (V-1), $R^a$, $R^b$, $R^c$, and $R^d$ each independently represent an alkyl, alkoxy, phenylalkyl, phenylalkoxy, phenyl, phenoxy, alkylphenyl, alkoxyphenyl, alkylcarbonyl, alkoxycarbonyl, or carboxy group. Symbols t and s each independently represent an integer of 0-3. When t or s is 2 or larger, the plurality of $R^a$ or $R^b$ groups contained in one molecule may be the same or different, and adjacent $R^a$ or $R^b$ groups in cooperation may have formed a ring.)

[Chem. 28]

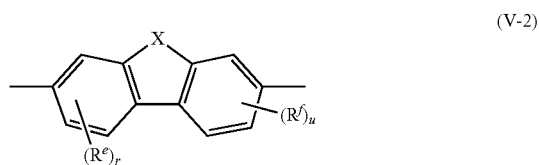

(V-2)

(In formula (V-2), $R^e$ and $R^f$ each independently have the same meaning as $R^a$, $R^b$, $R^c$, or $R^d$ contained in formula (V-1). Symbols r and u each independently represent an integer of 0-3. When r or u is 2 or larger, the plurality of $R^e$ and $R^f$ groups contained in one molecule may be the same or different, and adjacent $R^e$ or $R^f$ groups in cooperation may have formed a ring. X represents an atom or group of atoms which is a component of the 5-membered or 6-membered ring.

Examples of X include —O—, —BR—, —NR—, —SiR$_2$—, —PR—, —SR—, —CR$_2$—, or a group composed of the atom and groups bonded to each other. R represents a hydrogen atom or any desired organic group. The term organic group as used in the invention means a group which contains at least one carbon atom.

It is preferred that the polyarylene derivatives should have a repeating unit represented by the following formula (V-3) besides the repeating units of formula (V-1) and/or formula (V-2).

[Chem. 29]

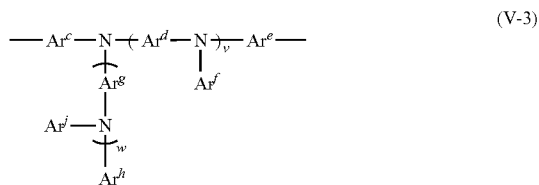

(V-3)

(In formula (V-3), $Ar^c$ to $Ar^j$ each independently represent an aromatic ring group which may have a substituent. Symbols v and w each independently represent 0 or 1.)

Examples of $Ar^c$ to $Ar^j$ are the same as the examples of $Ar^a$ and $Ar^b$ which are contained in formula (II).

Examples of formulae (V-1) to (V-3), examples of the polyarylene derivatives, etc. include the examples shown in JP-A-2008-98619.

In the case where the hole transport layer 4 is formed by a wet film formation method, a composition for hole transport layer formation is prepared and subsequently applied to form a film by a wet process and the resultant film is dried, in the same manner as for forming the hole injection layer 3.

The composition for hole transport layer formation contains a solvent besides the hole transport material described above. The solvent to be used may be the same as the solvent used in the composition for hole injection layer formation. Furthermore, film formation conditions, drying conditions, etc. may also be the same as in the case of forming the hole injection layer 3.

Also in the case where the hole transport layer 4 is formed by vacuum deposition, the film deposition conditions and other conditions to be used may be the same as in the case of forming the hole injection layer 3.

The hole transport layer 4 may contain various luminescent materials, electron transport materials, binder resins, applicability improvers, etc., besides the hole transport material.

The hole transport layer 4 may be a layer formed through crosslinking of a crosslinkable compound. The crosslinkable compound is a compound which has crosslinkable groups, and forms a high-molecular network compound upon crosslinking.

Examples of the crosslinkable groups include: cyclic ethers, such as oxetane and epoxy, that have a free valence of 1; groups derived from an unsaturated double bond, such as vinyl, trifluorovinyl, styryl, acryloyl, methacryloyl, and cinnamoyl; and benzocyclobutene having a free valence of 1.

The crosslinkable compound may be any of a monomer, oligomer, and polymer. The composition may have one crosslinkable compound alone, or contain any desired two or more crosslinkable compounds in combination in any desired proportion.

It is preferred that the crosslinkable compound to be used should be a hole transport material having crosslinkable groups. Examples of this hole transport material include the hole transport materials shown above as examples, and examples of the hole transport material having crosslinkable groups include those hole transport materials which each have crosslinkable groups bonded to the main chain or side chains thereof. It is especially preferred that the crosslinkable groups each should have been bonded to the main chain through a linking group, e.g., alkylene. Furthermore, an especially preferred hole transport material is a polymer which contains repeating units having a crosslinkable group. In particular, it is preferred that the hole transport material should be a polymer that has repeating units represented by any of formulae (II) and (V-1) to (V-3) to which a crosslinkable group has been bonded directly or through a linking group.

It is preferred that the crosslinkable compound to be used should be a hole transport material having crosslinkable groups. Examples of the hole transport material include: nitrogen-containing aromatic compound derivatives such as pyridine derivatives, pyrazine derivatives, pyrimidine derivatives, triazine derivatives, quinoline derivatives, phenanthroline derivatives, carbazole derivatives, phthalocyanine derivatives, and porphyrin derivatives; triphenylamine derivatives; silole derivatives; and oligothiophene derivatives, fused polycyclic aromatic derivatives, and metal complexes. Of these, more preferred examples of the hole transport material are: nitrogen-containing aromatic derivatives such as pyridine derivatives, pyrazine derivatives, pyrimidine derivatives, triazine derivatives, quinoline derivatives, phenanthroline derivatives, and carbazole derivatives; and triphenylamine derivatives, silole derivatives, fused polycyclic aromatic derivatives, metal complexes, and the like. In particular, triphenylamine derivatives are more preferred.

For crosslinking the crosslinkable compound to form a hole transport layer 4, use is usually made of a method in which a composition for hole transport layer formation is prepared by dissolving or dispersing the crosslinkable compound in a solvent and is applied to form a film by a wet process and the crosslinkable compound is crosslinked.

The composition for hole transport layer formation may contain an additive for accelerating the crosslinking reaction, besides the crosslinkable compound. Examples of the additive for accelerating the crosslinking reaction include: polymerization initiators and polymerization accelerators, such as alkylphenone compounds, acylphosphine oxide compounds, metallocene compounds, oxime ester compounds, azo compounds, and onium salts; and photosensitizers such as fused polycyclic hydrocarbons, porphyrin compounds, and diaryl ketone compounds.

The composition for hole transport layer formation may contain an applicability improver such as a leveling agent or an antifoamer, an electron-accepting compound, a binder resin, and the like.

The composition for hole transport layer formation contains the crosslinkable compound in an amount of generally 0.01% by weight or more, preferably 0.05% by weight or more, more preferably 0.1% by weight or more. The composition for hole transport layer formation contains the crosslinkable compound in an amount of generally 50% by weight or less, preferably 20% by weight or less, more preferably 10% by weight or less.

The high-molecular network compound is formed usually by forming a film of this composition for hole transport layer formation, which contains the crosslinkable compound in such a concentration, on the underlying layer (usually, the hole injection layer 3) and then crosslinking the crosslinkable compound by heating and/or irradiation with actinic energy, e.g., light.

Conditions for the film formation, including temperature and humidity, may be the same as for the wet-process formation of the hole injection layer.

Methods for the heating to be conducted after the film formation are not particularly limited. Heating temperature conditions include a temperature of generally 120° C. or higher and preferably 400° C. or lower.

The heating period is generally 1 minute or longer and is preferably 24 hours or shorter. Heating means are not particularly limited. For the heating, use may be made, for example, of a means in which the multilayer structure having the layer formed is placed on a hot plate or is heated in an oven. Specifically, in such a heating method, use can be made of conditions in which the multilayer structure is heated on a hot plate at 120° C. or higher for 1 minute or longer.

In the case of crosslinking by irradiation with actinic energy such as light, examples of methods for the irradiation with actinic energy include a method in which an ultraviolet, visible, or infrared light source, e.g., an ultrahigh-pressure mercury lamp, high-pressure mercury lamp, halogen lamp, or infrared lamp, is directly used to conduct the irradiation and a method in which a mask aligner or conveyor type light irradiator having the light source built therein is used to conduct the irradiation. With respect to irradiation with actinic energy other than light, examples of irradiation methods include a method in which an apparatus for irradiation with microwaves generated by a magnetron, i.e., the so-called electronic oven, is used to conduct the irradiation. With respect to irradiation period, it is preferred to set conditions necessary for reducing the solubility of the film. However, the layer is irradiated for a period which is generally 0.1 second or longer and is preferably 10 hours or shorter.

For the heating and the irradiation with actinic energy such as light, those methods and conditions may be used alone or in combination. When a combination is used, the sequence of performing the methods is not limited.

The thickness of the hole transport layer 4 thus formed is generally 5 nm or larger, preferably 10 nm or larger, and is generally 300 nm or less, preferably 100 nm or less.

[Luminescent Layer]

The luminescent layer 5 is a layer which is excited by recombination of holes injected from the anode 2 with electrons injected from the cathode 9, between the electrodes to which an electric field is being applied, and which serves as the main luminescence source. Usually, the luminescent layer 5 can be formed on the hole transport layer 4 when there is the hole transport layer 4. When there is no hole transport layer 4 and there is the hole injection layer 3, the luminescent layer 5 can be formed on the hole injection layer 3. When there is neither the hole transport layer 4 nor the hole injection layer 3, the luminescent layer 5 can be formed on the anode 2.

Constituent materials for the luminescent layer, methods for forming the layer, etc. are as described above.

[Hole Blocking Layer]

A hole blocking layer 6 may be disposed between the luminescent layer 5 and the electron injection layer 8 which will be described later. The hole blocking layer 6 is an electron transport layer which has the additional function of preventing the holes that have moved from the anode 2 from reaching the cathode 9. The hole blocking layer 6 is a layer to be disposed on the luminescent layer 5 so as to be in contact with the cathode 9 side interface of the luminescent layer 5. In the organic electroluminescence element of the invention, a hole blocking layer is not an essential constituent layer. However, in the case where a hole blocking layer is disposed so as to adjoin the luminescent layer, this hole blocking layer is the adjoining electron transport layer.

This hole blocking layer 6 has both the function of preventing the holes which have moved from the anode 2 from reaching the cathode 9 and the function of efficiently transporting, toward the luminescent layer 5, the electrons injected from the cathode 9.

Examples of the properties required of the material which constitutes the hole blocking layer 6 include: to have a high electron mobility and a low hole mobility; to have a large energy gap (difference between HOMO and LUMO); and to have a high excited triplet energy level (T1). Examples of materials for the hole blocking layer 6 which satisfy such requirements include metal complexes such as mixed-ligand complexes, e.g., bis(2-methyl-8-quinolinolato)(phenolato) aluminum and bis(2-methyl-8-quinolinolato)(triphenylsilanolato)aluminum, and dinuclear metal complexes, e.g., bis (2-methyl-8-quinolato)aluminum-μ-oxobis(2-methyl-8-quinolilato)aluminum, styryl compounds such as distyrylbiphenyl derivatives (JP-A-11-242996), triazole derivatives such as 3-(4-biphenylyl)-4-phenyl-5-(4-tert-butylphenyl)-1,2,4-triazole (JP-A-7-41759), and phenanthroline derivatives such as bathocuproine (JP-A-10-79297). Furthermore, the compound having at least one pyridine ring substituted at the 2-, 4-, and 6-positions which is described at International Publication No. 2005/022962 is also preferred as a material for the hole blocking layer 6.

One material for the hole blocking layer 6 may be used alone, or any desired two or more materials therefor may be used in combination in any desired proportion.

There are no limitations on methods for forming the hole blocking layer 6. Consequently, the hole blocking layer 6 can be formed by a wet film formation method, vapor deposition, or another method.

The hole blocking layer 6 may have any desired thickness unless the effects of the invention are considerably lessened thereby. The thickness of the hole blocking layer 6 is generally 0.3 nm or larger, preferably 0.5 nm or larger, and is generally 100 nm or less, preferably 50 nm or less.

[Electron Transport Layer]

The electron transport layer 7 is a layer to be disposed between the luminescent layer 5 and the cathode 9 which will be described later. In the case where the organic electroluminescence element of the invention includes two or more electron transport layers 7, the layer among these which is located on the most cathode side is the cathode-side electron transport layer. When the hole blocking layer 6 is omitted and two or more electron transport layers are disposed, then the layer among these which adjoins the luminescent layer is the adjoining electron transport layer.

Constituent materials for the electron transport layer 7, methods for forming the layer, etc. are as described above with regard to the cathode-side electron transport layer.

[Electron Injection Layer]

An electron injection layer 8 may be disposed between the electron transport layer 7 and the cathode 9 which will be described later. The electron injection layer 8 is a layer which injects electrons from the cathode 9 into the electron transport layer 7 (i.e., which helps transfer of electrons). The electron injection layer 8 is constituted of an insulator (having no electron-transporting properties) such as an inorganic salt.

Examples of the electron injection layer 8 include lithium fluoride (LiF), magnesium fluoride ($MgF_2$), lithium oxide ($Li_2O$), and cesium(II) carbonate ($CsCO_3$) (see, for example, *Applied Physics Letters*, Vol. 70, p. 152, 1997; JP-A-10-74586; *IEEE Transactions on Electron Devices*, Vol. 44, p. 1245, 1997; and *SID 04 Digest*, p. 154).

Since the electron injection layer 8 is an inorganic insulator, it is preferred that this layer should be an ultrathin film, from the standpoint of efficiently injecting electrons. The thickness thereof is generally 0.1 nm or larger and preferably 5 nm or less.

One material for the electron injection layer 8 may be used alone, or any desired two or more materials therefor may be used in combination in any desired proportion.

There are no limitations on methods for forming the electron injection layer 8. Consequently, the electron injection layer 8 can be formed by a wet film formation method, vapor deposition, or another method.

[Cathode 9]

The cathode 9 is an electrode which serves to inject electrons into the layer located on the luminescent layer 5 side (e.g., the electron injection layer 8 or the luminescent layer 5). The cathode 9 serves to constitute electrical connection to a circuit for feeding electricity from an electric power supply to the organic electroluminescence element.

Constituent materials for the cathode 9, methods for forming the cathode 9, etc. are as described above in the explanation which was given hereinabove on the cathode.

[Other Layers]

The organic electroluminescence element of the invention may have another configuration unless this configuration departs from the spirit of the invention. Specifically, the element may, for example, have any desired layer, besides the layers explained above, between the anode 2 and the cathode 9 unless this layer lessens the performance of the element, or some of the layers explained above may have been omitted. In either case, however, the electron transport layer disposed between the luminescent layer and the cathode so as to adjoin the luminescent layer is the adjoining electron transport layer, and the electron transport layer disposed between the cathode and the luminescent layer so as to adjoin the cathode is the cathode-side electron transport layer.

Examples of the layer which may be possessed besides the layers explained above include an electron blocking layer.

In the case where an electron blocking layer is to be disposed, this layer usually is disposed between the hole injection layer 3 or hole transport layer 4 and the luminescent layer 5. The electron blocking layer has both the function of preventing the electrons which have moved from the luminescent layer 5 from reaching the hole injection layer 3 to thereby heighten the probability of hole/electron recombination within the luminescent layer 5 and confine generated excitons in the luminescent layer 5 and the function of efficiently transporting, toward the luminescent layer 5, the holes which have been injected from the hole injection layer 3. To dispose the electron blocking layer is effective especially when a phosphorescent material or a blue luminescent material is used as a luminescent material.

Examples of the properties required of the electron blocking layer include to have high hole-transporting properties, to have a large energy gap (difference between HOMO and LUMO), and to have a high excited triplet energy level (T1). Furthermore, in the invention, when the luminescent layer 5 is formed as an organic layer according to the invention by a wet film formation method, the electron blocking layer also is required to have suitability for the wet-process film formation. Examples of materials for use in such an electron blocking layer include copolymers of dioctylfluorene and triphenylamine which are represented by F8-TFB (International Publication No. 2004/084260).

One material for the electron blocking layer may be used alone, or any desired two or more materials therefor may be used in combination in any desired proportion.

There are no limitations on methods for forming the electron blocking layer. Consequently, the electron blocking layer can be formed by a wet film formation method, vapor deposition, or another method.

It is possible to modify the layer configurations explained above so that the constituent elements other than the substrate are superposed in the reverse order. For example, in the case of the layer configuration shown in FIG. 1, the constituent elements other than the substrate 1 may be disposed on the substrate 1 in the order of: the cathode 9, electron injection layer 8, cathode-side electron transport layer 7, hole blocking layer 6 (adjoining electron transport layer), luminescent layer 5, hole transport layer 4, hole injection layer 3, and anode 2.

Furthermore, the constituent elements other than the substrate can be superposed between two substrates, at least one of which has transparency, to thereby configure an organic electroluminescence element according to the invention.

A structure composed of a stack of stages each composed of constituent elements other than substrates (luminescent units) (i.e., a structure composed of a plurality of stacked luminescent units) is also possible. In this case, when a carrier generation layer (CGL) made of, for example, vanadium pentoxide ($V_2O_5$) is disposed in place of the interfacial layers located between the stages (i.e., between the luminescent units) (when the anode is ITO and the cathode is aluminum, the interfacial layers are these two layers), then the barrier between the stages is reduced. This configuration is more preferred from the standpoints of luminescent efficiency and operating voltage.

Furthermore, the organic electroluminescence element according to the invention may be configured so as to be a single organic electroluminescence element, or may be applied to a configuration in which a plurality of organic electroluminescence elements have been disposed in an array arrangement. The organic electroluminescence element may be applied also to a configuration in which anodes and cathodes have been disposed in an X-Y matrix arrangement.

Each of the layers described above may contain ingredients other than those described above as materials for the layers, unless the effects of the invention are considerably lessened thereby.

[Organic Electroluminescence Device]

The organic electroluminescence device of the invention is an organic electroluminescence device which includes a substrate and, disposed thereon, two or more organic electroluminescence elements that differ from each other in the color of luminescence, and is characterized in that at least one of the organic electroluminescence elements is the organic electroluminescence element in which a charge transport material contained in the luminescent layer and a charge transport material contained in the adjoining electron transport layer satisfy the expression (1), preferably the expression (3), described above and the work function of the cathode material and a charge transport material contained in the cathode-side electron transport layer satisfy the expression (2) described above.

It is preferred that in this organic electroluminescence device, all the organic electroluminescence elements each should be the organic electroluminescence element of the invention. It is also preferred that in at least two of the organic electroluminescence elements, the adjoining electron transport layers should have the same material configuration. It is more preferred that these adjoining electron transport layers should have the same material configuration and the same film thickness. The reason for this is that the configuration described above is expected to bring about a cost reduction in producing the organic electroluminescence device as compared with the case in which the adjoining electron transport layer in each organic electroluminescence element is formed so as to be suitable for the element. Especially when the adjoining electron transport layers are formed by vapor deposition, there is no need of disposing a mask for forming the adjoining electron transport layer of each organic electroluminescence element so as to be suitable for the element, and this leads to a considerable cost reduction when the organic electroluminescence device is produced.

[Organic EL Display Device]

The organic EL display device of the invention employs the organic electroluminescence element of the invention. There are no particular limitations on the type and structure of the organic EL display device of the invention, and the display device can be fabricated in accordance with ordinary methods using the organic electroluminescence element of the invention.

For example, the organic EL display device of the invention can be formed by the method described in *Yuki EL Dispurei* (Ohmsha, Ltd., published on Aug. 20, 2004, written by TOKITO Shizuo, ADACHI Chihaya, and MURATA Hideyuki).

[Organic EL Lighting]

The organic EL lighting of the invention employs the organic electroluminescence element of the invention described above. There are no particular limitations on the type and structure of the organic EL lighting of the invention, and the lighting can be fabricated in accordance with ordinary methods using the organic electroluminescence element of the invention.

EXAMPLES

The invention will be explained below in more detail by reference to Examples, but the invention should not be construed as being limited to the following Examples unless the invention departs from the spirit thereof.

Materials used for element production were synthesized respectively in the following manners.

P1 and H1 were synthesized in accordance with the method described in JP-A-2009-287000.

eH-3 and eH-7 were synthesized in accordance with the method described in JP-A-2006-188493.

hH-1 was synthesized in accordance with the method described in JP-A-2011-26237.

D-1 was synthesized in accordance with the method described in JP-A-2010-202644.

D-2 was synthesized in accordance with the method described in Japanese Patent Application No. 2010-225230.

eH-11 was synthesized in accordance with the method described in JP-A-2005-268199.

eH-4 was synthesized in accordance with the method described in JP-A-2010-235708.

The other materials each were synthesized by combining the following reaction schemes [A] to [H].

[A] Cz—Ar Coupling (Reference Document: EP 1820801 A1)

[Chem. 30]

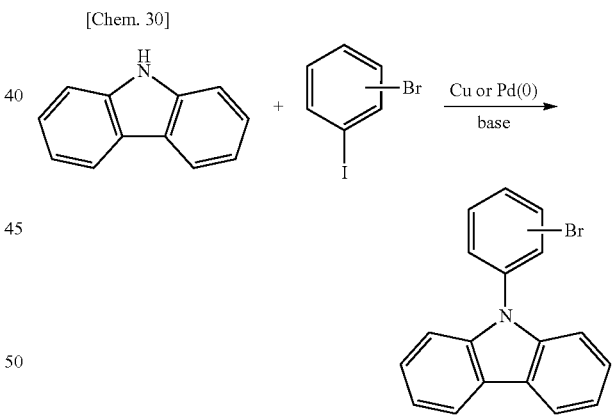

[8] NH—Ar Coupling (Reference Document: *J. Org. Chem.*, Vol. 64, No. 15, 1999)

[Chem. 31]

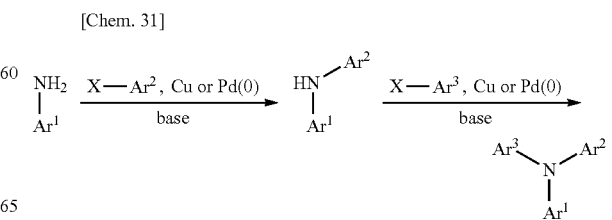

[C] Ar—Ar Coupling (Reference Document: *Chemical Reviews*, 95 (7), 2457-2483.)

[Chem. 32]

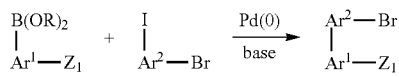

[D] Boronic Acid Synthesis (Reference Document: *Journal of the American Chemical Society*, 112(22), 8024-34 (1990))

[Chem. 33]

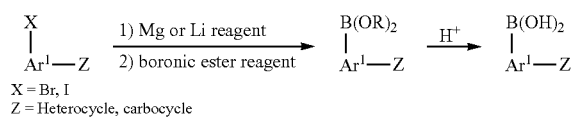

X = Br, I
Z = Heterocycle, carbocycle

[E] Ar—B Coupling (Reference Document: *J. Org. Chem.*, 60(23), 7508-10 (1995))

[Chem. 34]

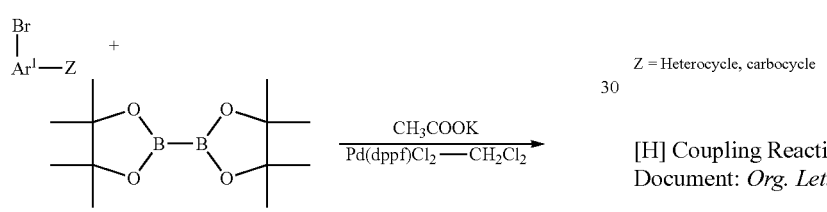

Z = Heterocycle, carbocycle

[F] Coupling Reaction with Pyrimidine Framework (Reference Document: *J. Org. Chem.*, 66, 7125-7128 (2001))

[Chem. 35]

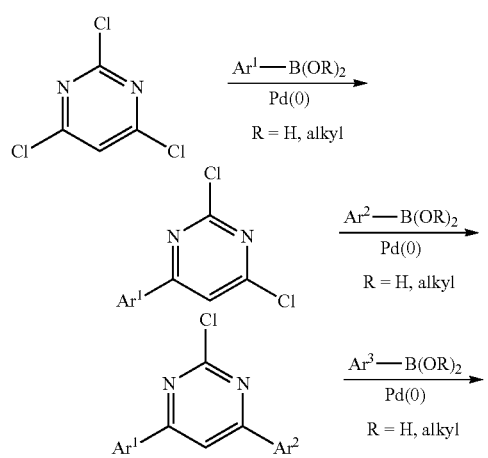

[G] Pyridine Ring Formation Reaction (Reference Document: *J. Chem. Soc., Perkin Trans.* 1, 3258-3264 (2001))

[Chem. 36]

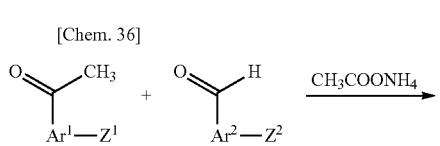

Z = Heterocycle, carbocycle

[H] Coupling Reaction with Triazine Framework (Reference Document: *Org. Lett.*, Vol. 10, No. 5, 2008)

[Chem. 37]

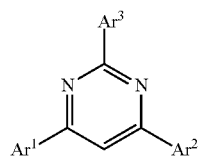

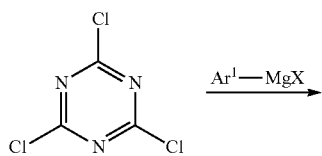

Specifically, eH-8 can be synthesized in accordance with the following reaction scheme. eH-1, eH-2, eH-5, and eH-6 can be obtained by the same method.

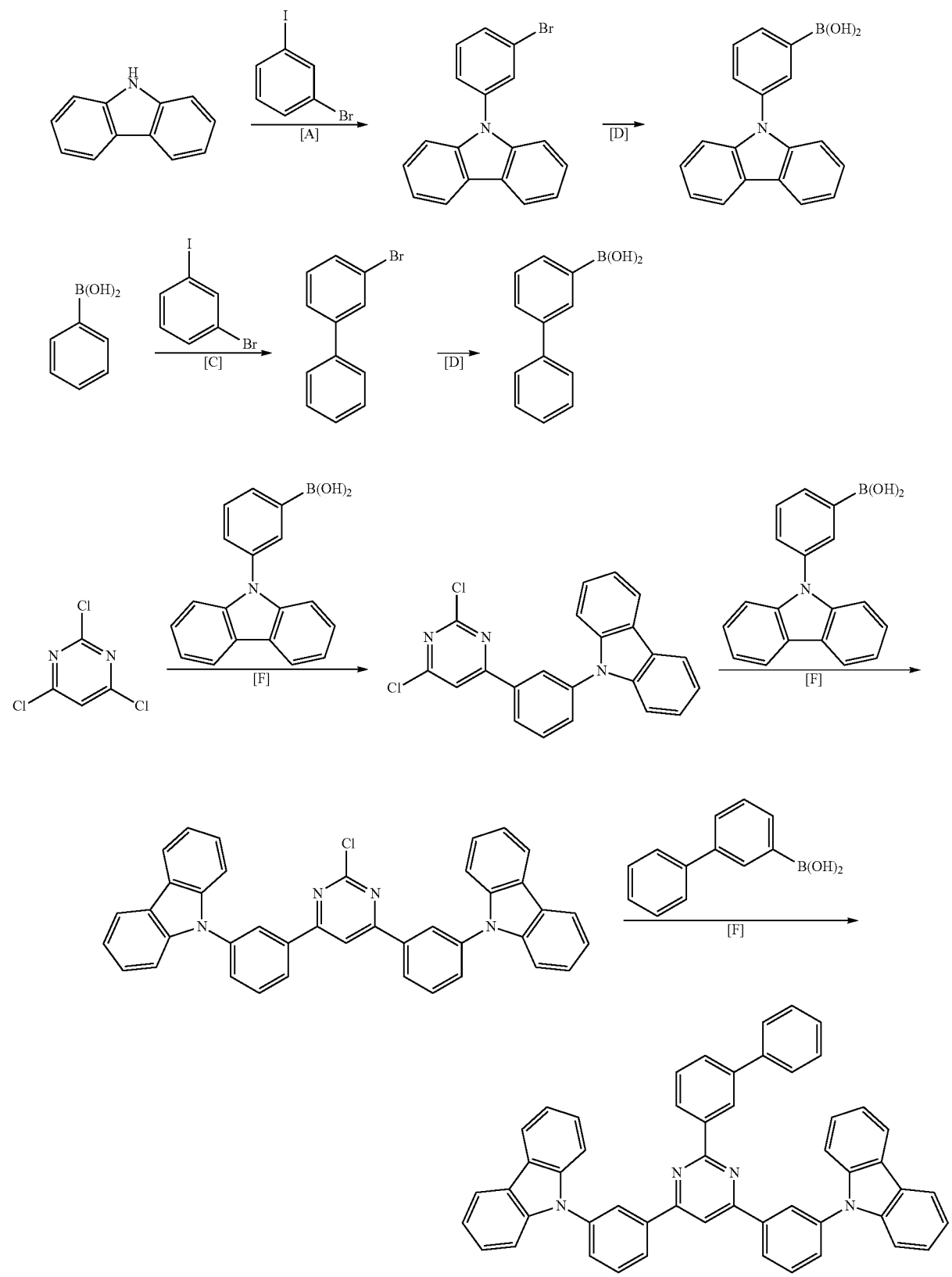

hH-2 can be synthesized in accordance with the following reaction scheme. hH-3 can be obtained by the same method.
HB-1 can be synthesized in accordance with the following reaction scheme.
[Chem. 39]
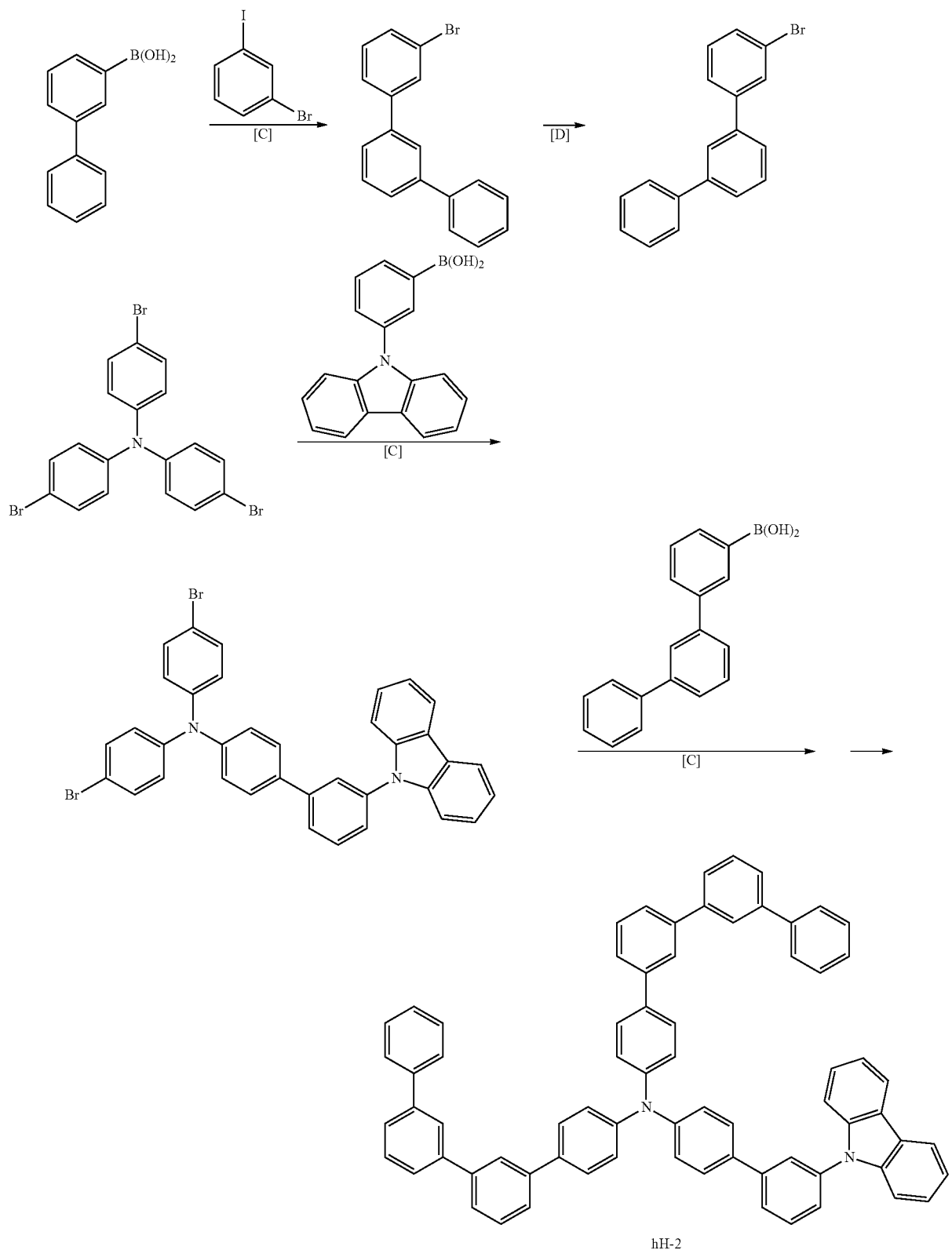
hH-2

[Chem. 40]
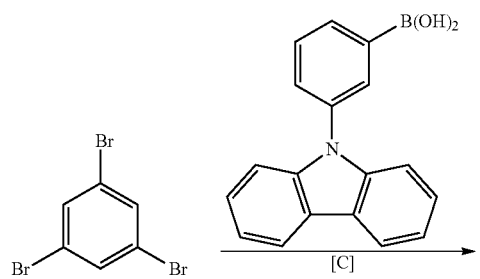
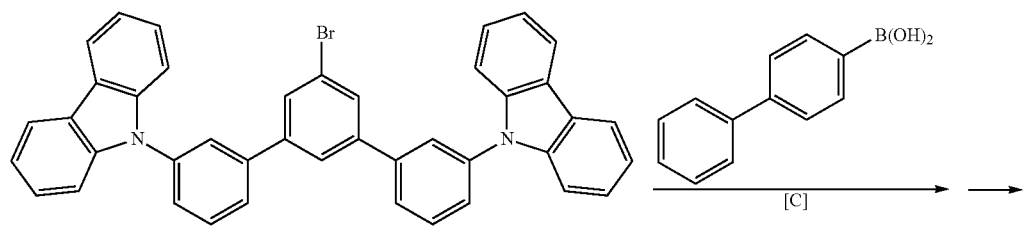
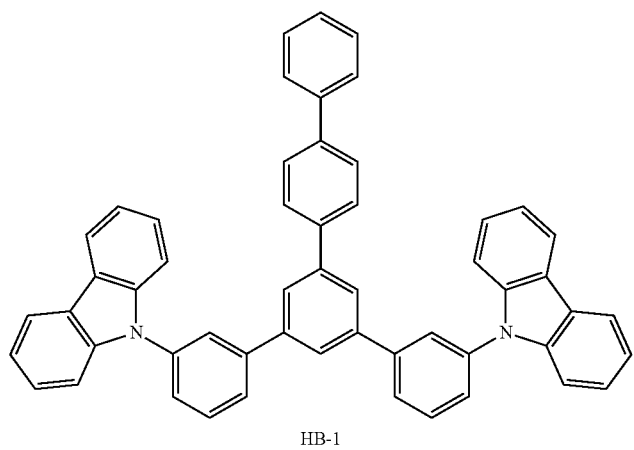
HB-1
HB-2 can be synthesized in accordance with the following reaction scheme.
[Chem. 41]
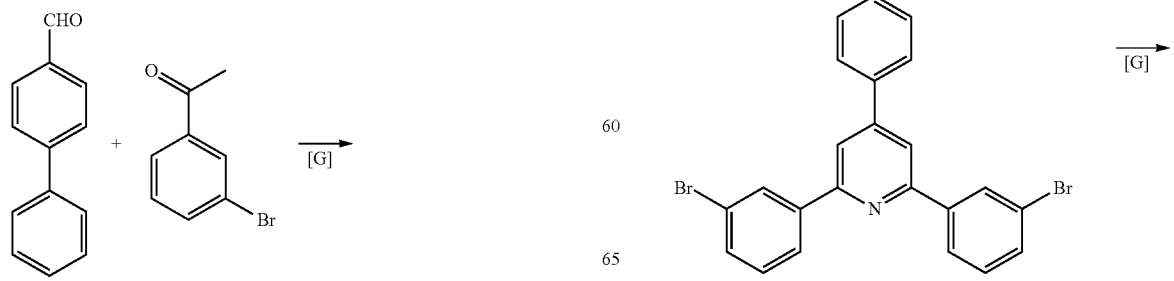

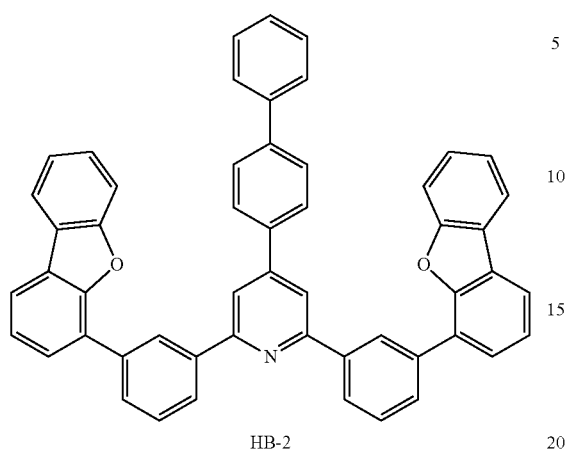
HB-2
HB-4 can be synthesized in accordance with the following reaction scheme.
[Chem. 42]
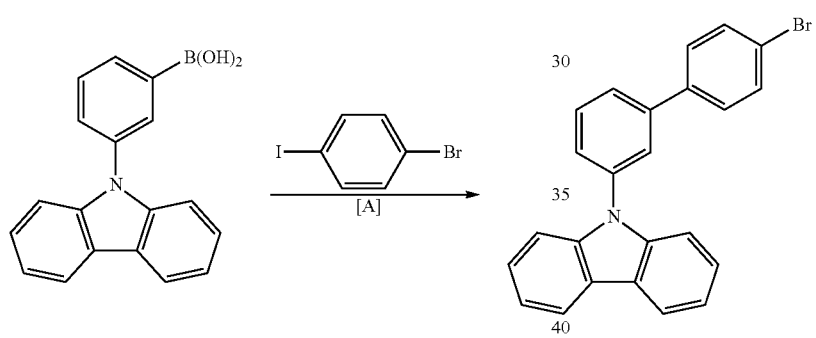
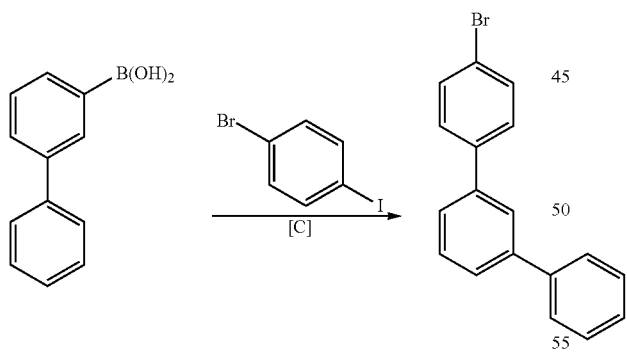
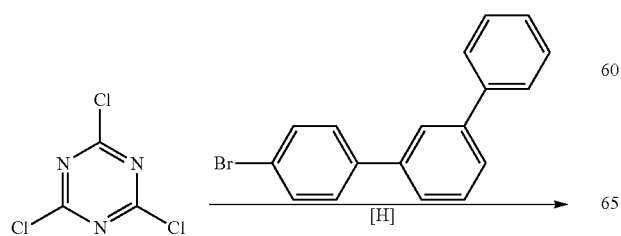

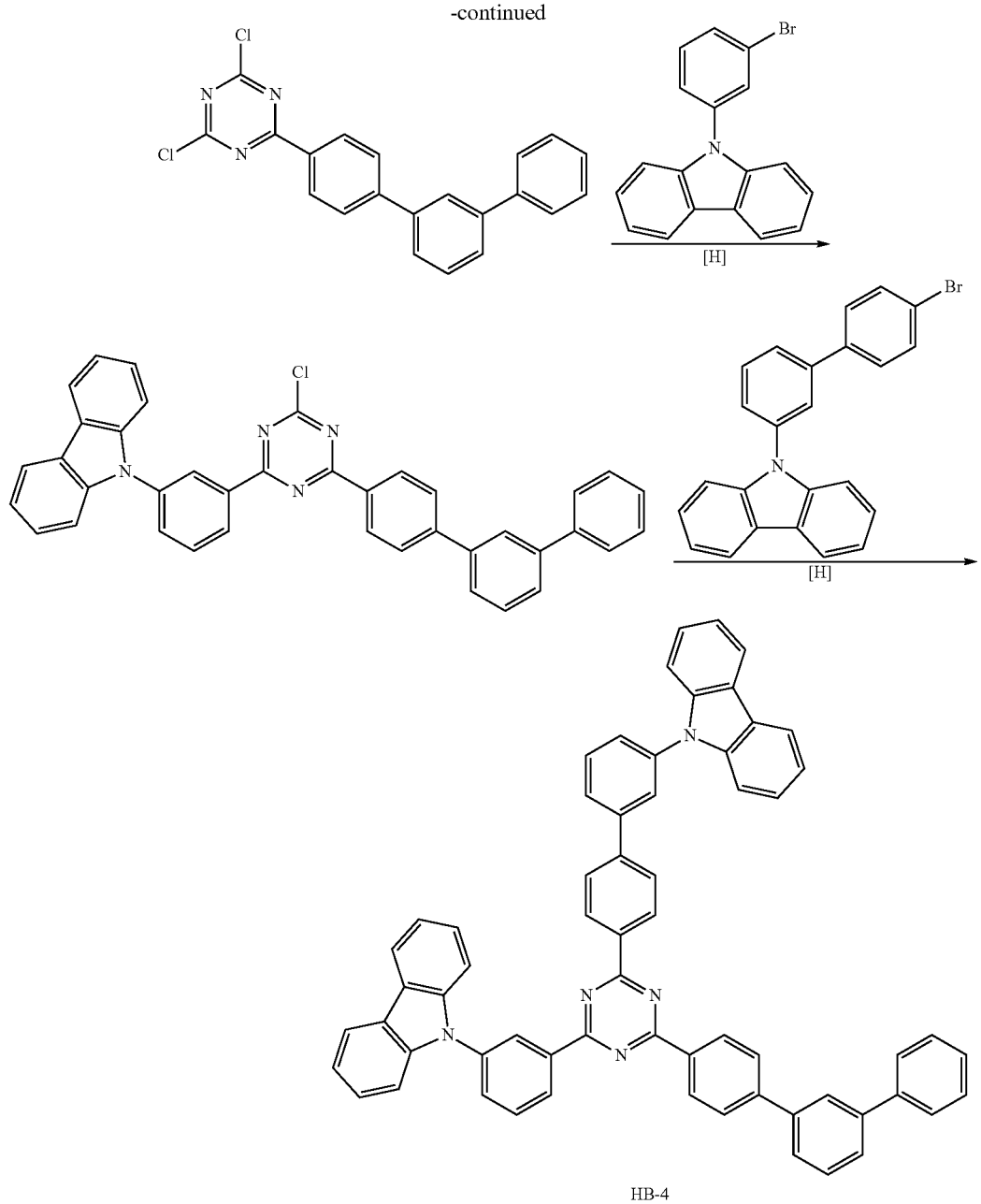
HB-4
eH-9 can be synthesized in accordance with the following reaction scheme. eH-10 and eH-11 can be obtained by the same method.
[Chem. 43]
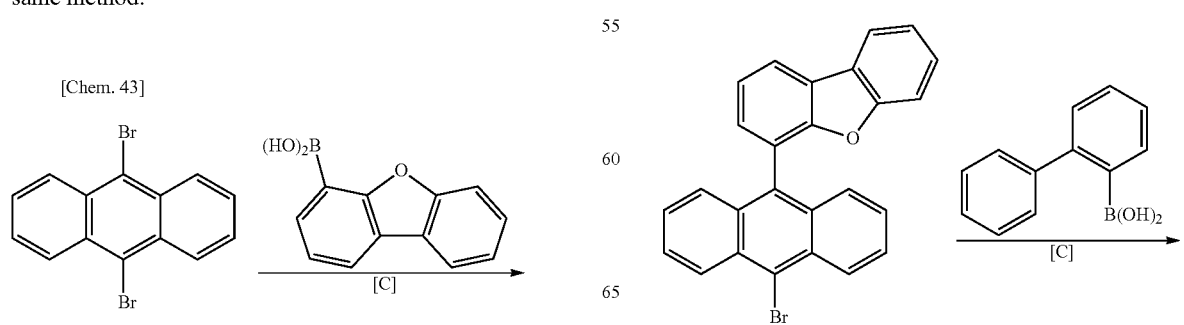

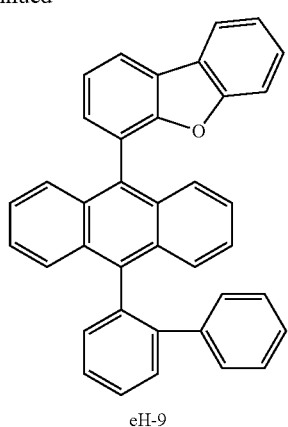
eH-9
HB-3 can be synthesized in accordance with the following reaction scheme.
[Chem. 44]
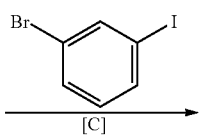
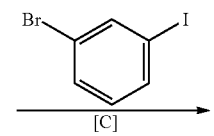
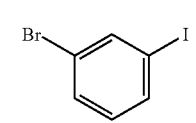
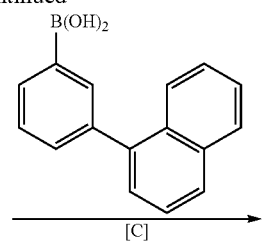
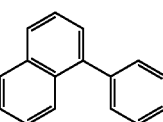
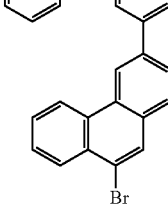
HB-3
D-3 can be synthesized in accordance with the following reaction scheme.
[Chem. 45]
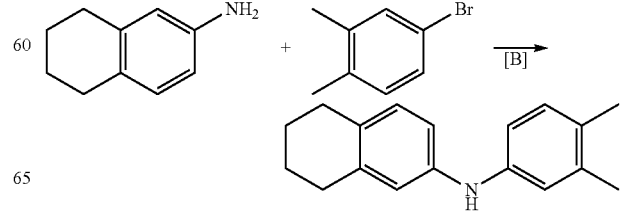

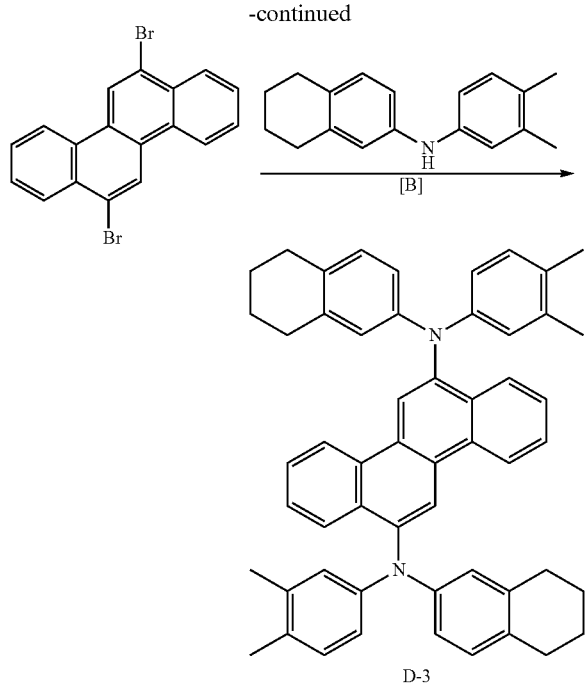

D-3

[Measurement of Electron Affinity (EA) of Charge Transport Materials]

The charge transport materials used in luminescent layers, hole blocking layers which were adjoining electron transport layers, and electron transport layers which were cathode-side electron transport layers, in the following Examples and Comparative Examples, were examined for electron affinity (EA) by the following method.

First, a substrate constituted of a glass substrate and, formed thereon, a transparent conductive film of ITO deposited in a thickness of 70 nm (deposited by sputtering; manufactured by Sanyo Vacuum Industries Co., Ltd.) was cleaned by subjecting the substrate to ultrasonic cleaning with an aqueous surfactant solution, rinsing with ultrapure water, ultrasonic cleaning with ultrapure water, and rinsing with ultrapure water in this order, subsequently dried with compressed air, and then subjected to ultraviolet/ozone cleaning.

A 1% by weight toluene solution of each of charge transport materials (hH-1 to hH-3, eH-1, eH-2, eH-4 to eH-10, HB-1 to HB-4, and $Alq_3$) was prepared and was applied to the cleaned substrate by spin coating to form a film thereof under the following conditions. Thus, a 50 nm-thick film of each charge transport material was obtained. With respect to some materials (eH-3 and eH-11), the cleaned substrate described above was placed in a vacuum deposition apparatus, and the apparatus was roughly evacuated and then further evacuated using a cryopump until the degree of vacuum within the apparatus became at least $3.0 \times 10^{-4}$ Pa. Each of these charge transport materials was deposited on the substrate by vacuum deposition to obtain a thin film of the charge transport material. The degree of vacuum during the deposition was kept at at least $2.2 \times 10^{-4}$ Pa, and the rate of deposition was regulated so as to be in the range of 0.6-1.2 Å/sec. Thus, a film having a thickness of 50 nm was formed on the substrate.

These samples were examined for ionization potential IP using "PCR-101", manufactured by OPTEL Co., Ltd., while keeping the apparatus evacuated to 10 Torr or lower.

Samples obtained by film deposition in the same step were examined for transmitted-light spectrum, i.e., thin-film absorption spectrum, using fluorescence spectrophotometer "F-4500", manufactured by Hitachi, Ltd. Tangents to the absorption spectrum were drawn from the base line in the shorter-wavelength-side rising part of the absorption spectrum, and the wavelength W (nm) corresponding to the intersection of the two tangents was determined. The band gap (Eg) was calculated from the wavelength (W) using the following equation.

$$Eg = 1240/W$$

The absolute value EA of the electron affinity was calculated from the sum of the ionization potential IP and the band gap Eg. The results were as shown in the following Table 1.

TABLE 1

| Compound No. | |EA| (eV) |
|---|---|
| hH-1 | 2.49 |
| hH-2 | 2.58 |
| hH-3 | 2.55 |
| eH-1 | 2.79 |
| eH-2 | 2.83 |
| eH-3 | 2.58 |
| eH-4 | 3.04 |
| eH-5 | 2.69 |
| eH-6 | 2.75 |
| eH-7 | 2.56 |
| eH-8 | 2.66 |
| eH-9 | 2.96 |
| eH-10 | 3.00 |
| eH-11 | 3.25 |
| HB-1 | 2.63 |
| HB-2 | 2.77 |
| HB-3 | 2.85 |
| HB-4 | 2.97 |
| $Alq_3$ | 3.22 |

When two or more charge transport materials were used in the luminescent layer of each of the Examples and Comparative Examples which will be given later, the charge transport material which was the highest in electron affinity was regarded as an electron transport material (e-host) and the charge transport material which was the lowest in electron affinity was regarded as a hole transport material (h-host).

When only one charge transport material was used in the luminescent layer, this material was referred to as an electron transport material.

[Determination of Detected-Charge Amount Ratio Q(e)/Q(h)]

The detected-charge amount ratio "Q(e)/Q(h)" of each of charge transport materials used in the luminescent layers was determined in the following manner.

The substrate (having a film deposited by sputtering; manufactured by Sanyo Vacuum Industries Co., Ltd.) was cleaned in the same manner as in the measurement of electron affinity (EA) described above. A 10% by weight chloroform solution of each of charge transport materials (hH-1 to hH-3 and eH-1 to eH-8) was produced and was applied to the cleaned substrate by spin coating to form a film thereof under the following conditions. Thus, a 2 μm-thick film of each charge transport material was obtained. While an electric field having a strength of 160 kV/cm was being applied to each of the samples so that the ITO electrode served as an anode and the counter electrode as a cathode, the samples were irradiated with light from the ITO electrode side using "Brio (Nd: YAG pulsed laser)", manufactured by Japan Laser Corp. (excitation wavelength, 355 nm; pulse duration, 4 ns), for hH-1 to hH-3, eH-1, eH-2, and eH-4 to eH-8 and "VSL-337ND-S (nitrogen laser)", manufactured by Spectra-Physics K.K. (excitation wavelength, 337 nm; pulse duration <4 ns) for eH-3 as light sources and using an ND filter to regulate the quantity of light per pulse to 20 µJ. The value of electric current which flowed during the irradiation was measured with an oscilloscope ("TDS 2022", manufactured by Tektronix Company) to thereby calculate the hole charge amount Q(h). Meanwhile, the same operation was conducted so that the ITO electrode served as a cathode and the counter electrode as an anode, and the electron charge amount Q(e) was thus calculated. From the two amounts, the ratio between the detected-charge amounts, Q(e)/Q(h), was determined. The results were as shown in the following Table 2.

TABLE 2

| Compound No. | Q(e)/Q(h) |
|---|---|
| hH-1 | 0.01 |
| hH-2 | 0.02 |
| hH-3 | 0.04 |
| eH-1 | 0.64 |
| eH-2 | 0.72 |
| eH-3 | 0.17 |
| eH-4 | 0.24 |
| eH-5 | 0.65 |
| eH-6 | 0.51 |
| eH-7 | 0.90 |
| eH-8 | 0.61 |

Production of Elements for Property Evaluation, and Evaluation Thereof

Example 1

The organic electroluminescence element shown in FIG. 1 was produced.

First, a substrate obtained by depositing a transparent conductive film of ITO in a thickness of 70 nm on a glass substrate 1 and patterning the transparent conductive film into stripes having a width of 2 mm to form an ITO anode 2 (deposited by sputtering; manufactured by Sanyo Vacuum Industries Co., Ltd.) was cleaned by subjecting the substrate to ultrasonic cleaning with an aqueous surfactant solution, rinsing with ultrapure water, ultrasonic cleaning with ultrapure water, and rinsing with ultrapure water in this order, subsequently dried with compressed air, and then subjected to ultraviolet/ozone cleaning.

Next, an ethyl benzoate solution (composition for hole injection layer formation) containing 2.0% by weight the hole-transporting high-molecular compound represented by the following (P1), which had the repeating structures, and 0.8% by weight 4-isopropyl-4'-methyldiphenyliodonium tetrakis(pentafluorophenyl)borate, which is represented by the following (A1), was prepared.

[Chem. 46]

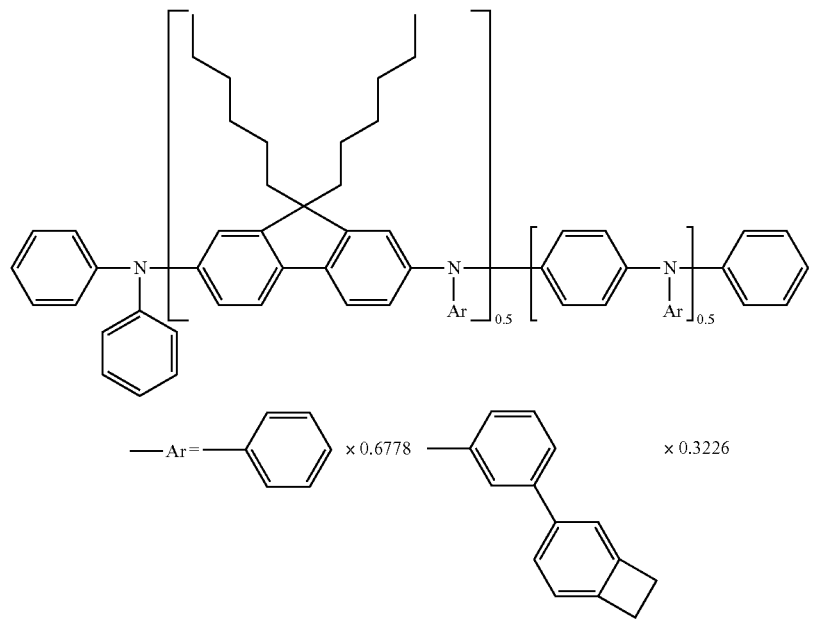

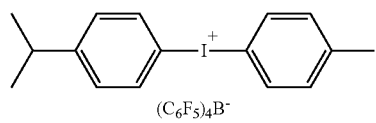

This composition for hole injection layer formation was applied to the ITO substrate by spin coating under the film formation conditions shown below to form a film thereof on the substrate, and the resultant film was baked under the baking conditions shown below. Thus, a hole injection layer 3 having a thickness of 30 nm was obtained.

<Film Formation Conditions>

| | |
|---|---|
| Spinner rotation speed | 2,250 rpm |
| Spinner rotation period | 30 sec |
| Spin coating atmosphere | in the air |
| Baking conditions | in the air; 230° C.; 1 hr |

Thereafter, a 1% by weight cyclohexylbenzene solution of the hole-transporting high-molecular compound represented by the following (H1) (composition for hole transport layer formation) was prepared. This composition was applied to the hole injection layer 3 by spin coating under the film formation conditions shown below to form a film thereof on the layer 3, and the high-molecular compound was crosslinked by baking. Thus, a hole transport layer 4 having a thickness of 15 nm was formed.

[Chem. 47]

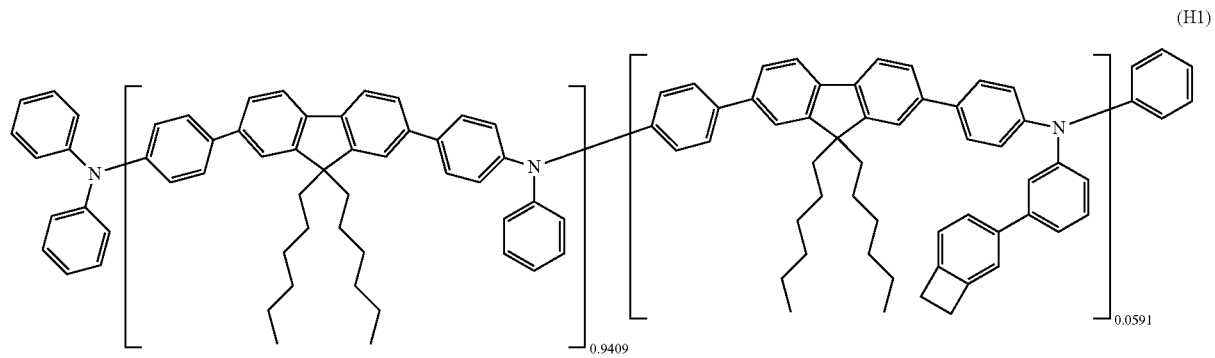

(H1)

<Film Formation Conditions>

| | |
|---|---|
| Spinner rotation speed | 1,500 rpm |
| Spinner rotation period | 120 sec |
| Spin coating atmosphere | in nitrogen atmosphere |
| Baking conditions | in nitrogen atmosphere; 230° C.; 1 hr |

Subsequently, in preparation for the formation of a luminescent layer 5, a composition for luminescent-layer formation having the following makeup was prepared using the luminescent materials (D-1) and (D-2), electron transport material (eH-1) (charge transport material serving to transport electrons), and hole transport material (hH-1) shown below.

[Chem. 48]
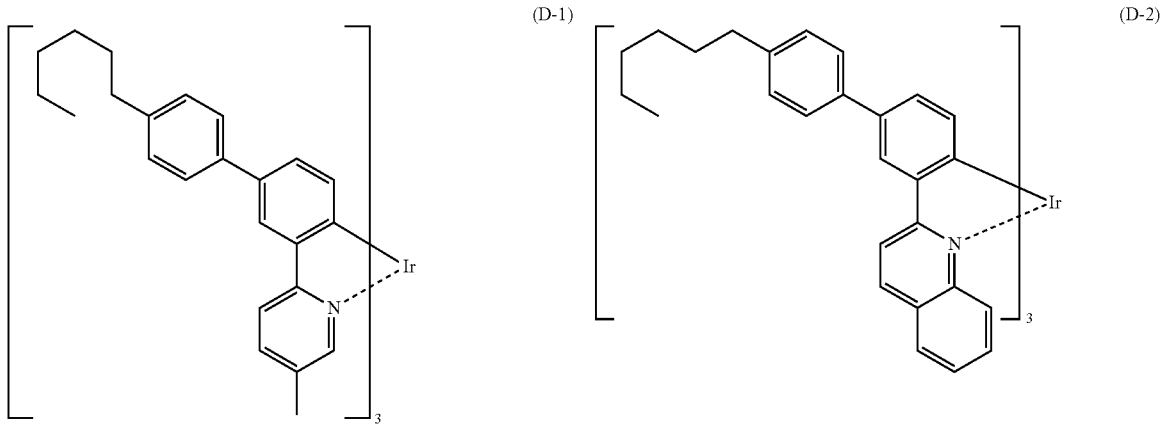
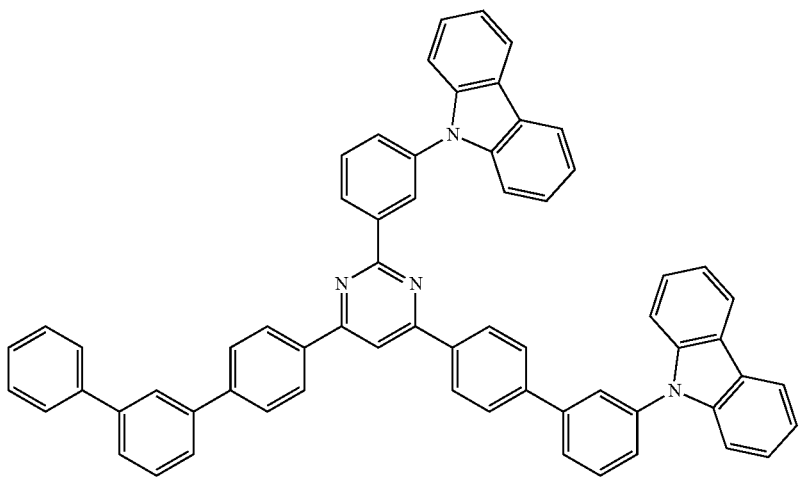
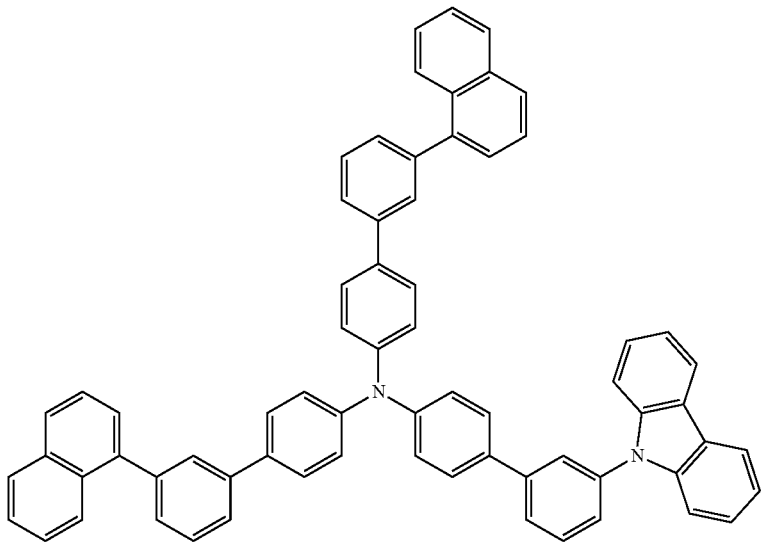

<Makeup of Composition for Luminescent-Layer Formation>

| | |
|---|---|
| Solvent | cyclohexylbenzene |

Component Concentrations
(D-1): 0.25 wt %
(D-2): 0.35 wt %
(eH-1): 1.25 wt %
(hH-1): 3.75 wt %

This composition for luminescent-layer formation was applied to the hole transport layer 4 by spin coating under the conditions shown below to form a film thereof on the layer 4, and the resultant film was baked under the baking conditions shown below. Thus, a luminescent layer 5 having a thickness of 60 nm was formed.

<Film Formation Conditions>

| | |
|---|---|
| Spinner rotation speed | 1,500 rpm |
| Spinner rotation period | 120 sec |
| Spin coating atmosphere | in nitrogen atmosphere |
| Baking conditions | in nitrogen atmosphere; 230° C.; 10 min |

Next, the substrate on which the hole injection layer 3, hole transport layer 4, and luminescent layer 5 had been formed by a wet process was placed in a vacuum deposition apparatus, which was roughly evacuated. Thereafter, a cryopump was used to evacuate the apparatus to a degree of vacuum within the apparatus of at least $3.0 \times 10^{-4}$ Pa. The compound represented by structural formula (eH-1) was deposited in a thickness of 10 nm on the luminescent layer 5 at a deposition rate of 0.6-1.2 Å/sec while keeping the degree of vacuum at at least $2.2 \times 10^{-4}$ Pa. Thus, a hole blocking layer 6 (adjoining electron transport layer) was formed.

Subsequently, while keeping the degree of vacuum at at least $2.2 \times 10^{-4}$ Pa, tris(8-hydroxyquinolinato)aluminum ($Alq_3$) was heated and deposited in a thickness of 20 nm on the hole blocking layer 6 at a deposition rate of 0.7-1.3 Å/sec. Thus, an electron transport layer 7 (cathode-side electron transport layer) was formed.

Here, the element in which the electron transport layer 7 had been formed by deposition was transferred from the chamber for organic-layer deposition to a chamber for metal deposition. A shadow mask in the form of stripes with a width of 2 mm was disposed, as a mask for cathode deposition, so that the mask was in close contact with the element and that these stripes were perpendicular to the ITO stripes of the anode 2. The apparatus was evacuated to a degree of vacuum within the apparatus of at least $1.1 \times 10^{-4}$ Pa in the same manner as in the deposition of the organic layer.

Thereafter, while keeping the degree of vacuum at at least $1.0 \times 10^{-4}$ Pa, lithium fluoride (LiF) was heated using a molybdenum boat to thereby deposit a lithium fluoride film having a thickness of 0.5 nm on the electron transport layer 7 at a deposition rate of 0.07-0.15 Å/sec. Thus, an electron injection layer 8 was formed. Subsequently, in the same manner as described above, aluminum was heated using a molybdenum boat, while keeping the degree of vacuum at $2.0 \times 10^{-4}$ Pa, to thereby deposit an aluminum film having a thickness of 80 nm at a deposition rate of 0.6-10.0 Å/sec. Thus, a cathode 9 was formed. During the deposition of the electron injection layer 8 and cathode 9, the temperature of the substrate was kept at room temperature. Incidentally, the WF of aluminum is 4.28 eV (see *J. Appl. Phys.*, 48. 4729 (1977)).

Subsequently, sealing was conducted in the following manner in order to prevent the element from being deteriorated by the action of atmospheric moisture, etc. during storage.

In a gloved nitrogen box, photocurable resin 30Y-437 (manufactured by ThreeBond Co., Ltd.) was applied in a width of 1 mm to the periphery of a glass plate having a size of 23 mm×23 mm, and a moisture getter sheet (manufactured by Dynic Corp.) was disposed in a central part. The substrate on which the cathode had been formed was placed thereon and laminated to the getter sheet so that the side having the deposited layers faced the desiccant sheet. Thereafter, only the region where the photocurable resin had been applied was irradiated with ultraviolet light to cure the resin.

Thus, an organic electroluminescence element which had a luminescent area with a size of 2 mm×2 mm was obtained.

The element obtained was examined for current-voltage-luminance (IVL) characteristics, and the operating voltage at 1,000 cd/m² (V1k; unit, V), luminance efficiency (L/J1k; unit, cd/A), and luminescent efficiency (η1k; unit, lm/w) were calculated. Furthermore, a constant-current operation test was conducted, and the period required for the luminance to decrease to 70% of the initial luminance value was measured. The initial luminance was set at 1,000 cd/m², and the life to a luminance decrease to 70% (τ70) was determined. The measured values are summarized in Tables 3 and 4 together with the value of |EA1|−|EA2| and the value of |WF|−|EA3|.

Example 2

An organic electroluminescence element was produced by the same method as in Example 1, except that the electron transport material (eH-2) shown below was used in the luminescent layer in place of the electron transport material (eH-1) used in Example 1. This element was evaluated in the same manner as in Example 1. The results thereof are summarized in Tables 3 and 4 together with the value of |EA1|−|EA2| and the value of |WF|−|EA3|.

[Chem. 49]

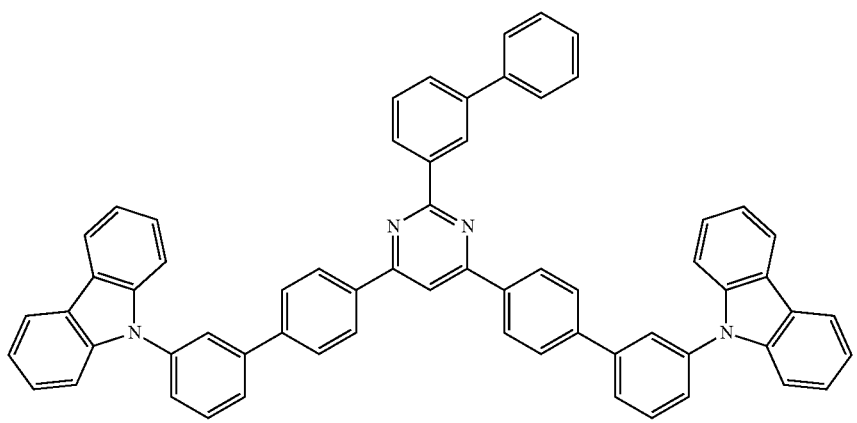

(eH-2)

Example 3

An organic electroluminescence element was produced by the same method as in Example 1, except that the electron transport material (eH-5) shown below was used in the hole blocking layer in place of the electron transport material (eH-1) used in Example 1. This element was evaluated in the same manner as in Example 1. The results thereof are summarized in Tables 3 and 4 together with the value of |EA1|−|EA2| and the value of |WF|−|EA3|.

[Chem. 50]

eH-5

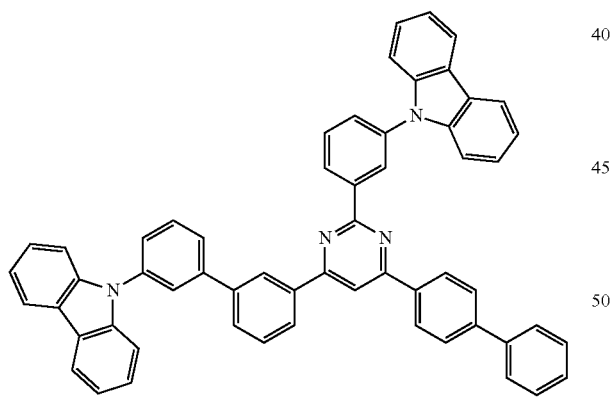

Comparative Example 1

An organic electroluminescence element was produced by the same method as in Example 1, except that the electron transport material (eH-3) shown below was used in the luminescent layer in place of the electron transport material (eH-1) used in Example 1. This element was evaluated in the same manner as in Example 1. The results thereof are summarized in Tables 3 and 4 together with the value of |EA1|−|EA2| and the value of |WF|−|EA3|.

[Chem. 51]

(eH-3)

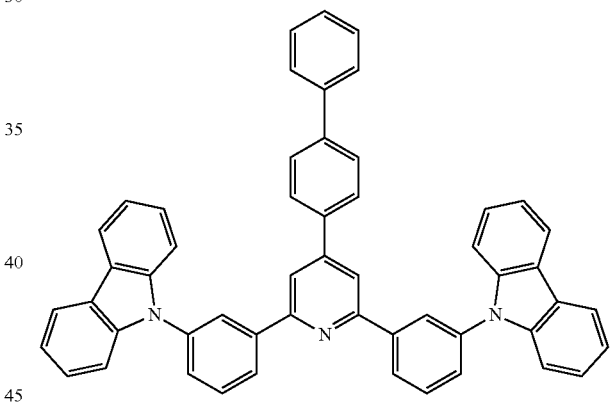

Comparative Example 2

An organic electroluminescence element was produced by the same method as in Example 1, except that the electron transport material (eH-3) and the hole transport material (hH-3) shown below were used in the luminescent layer respectively in place of the electron transport material (eH-1) and hole transport material (hH-1) used in Example 1, and that the electron transport material (HB-1) shown below was used in place of the electron transport material (eH-1) used in the hole blocking layer. This element was evaluated in the same manner as in Example 1. The results thereof are summarized in Tables 3 and 4 together with the value of |EA1|−|EA2| and the value of |WF|−|EA3|.

[Chem. 52]

hH-3

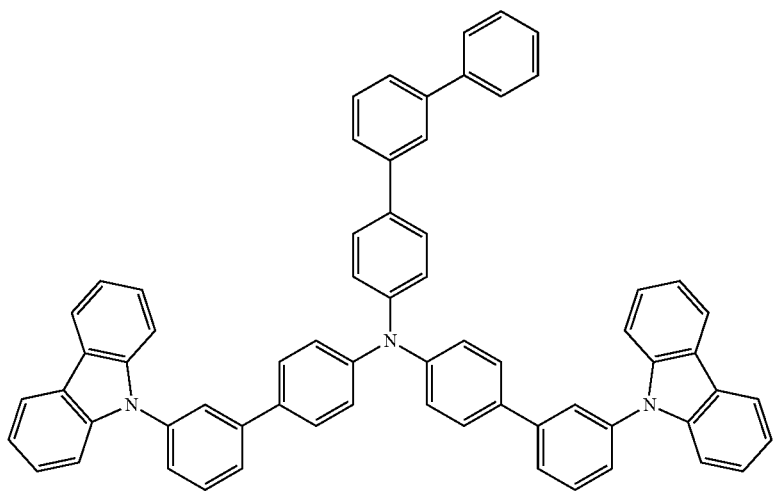

HB-1

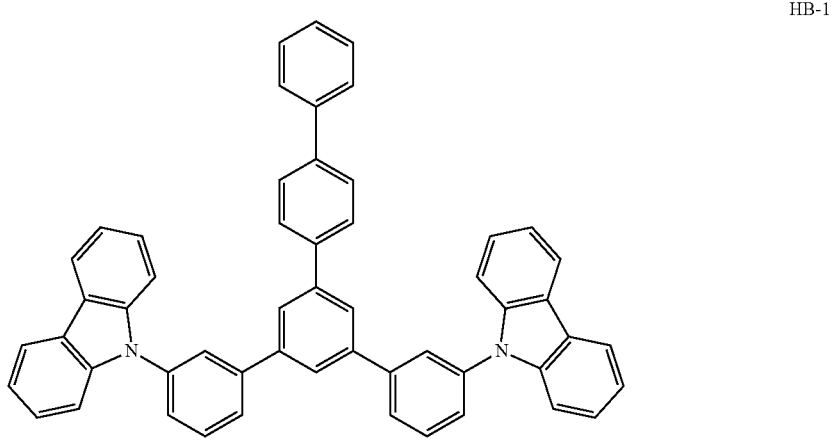

Comparative Example 3

An organic electroluminescence element was produced by the same method as in Example 1, except that the electron transport material (eH-6) shown below and the hole transport material (hH-3) were used in the luminescent layer respectively in place of the electron transport material (eH-1) and hole transport material (hH-1) used in Example 1, and that the electron transport material (HB-2) shown below was used in place of the electron transport material (eH-1) used in the hole blocking layer. This element was evaluated in the same manner as in Example 1. The results thereof are summarized in Tables 3 and 4 together with the value of |EA1|−|EA2| and the value of |WF|−|EA3|.

[Chem. 53]

(eH-6)

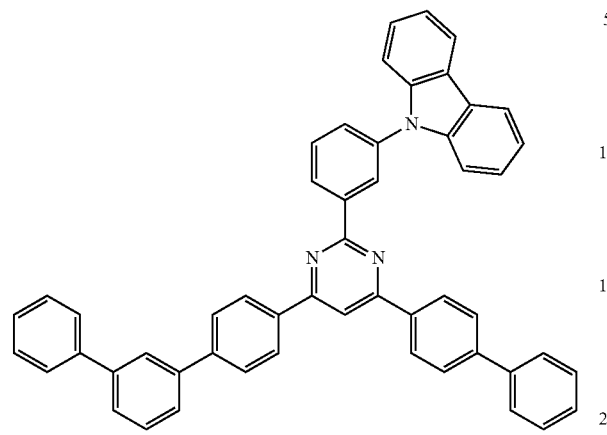

HB-2

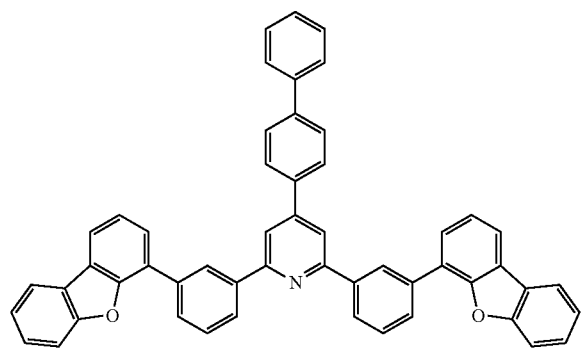

Comparative Example 4

An organic electroluminescence element was produced by the same method as in Example 1, except that the electron transport material (eH-8) shown below and the hole transport material (hH-3) were used in the luminescent layer respectively in place of the electron transport material (eH-1) and hole transport material (hH-1) used in Example 1, and that the electron transport material (eH-5) was used in place of the electron transport material (eH-1) used in the hole blocking layer. This element was evaluated in the same manner as in Example 1. The results thereof are summarized in Tables 3 and 4 together with the value of |EA1|−|EA2| and the value of |WF|−|EA3|.

[Chem. 54]

(eH-8)

Comparative Example 5

An organic electroluminescence element was produced by the same method as in Example 1, except that the electron transport material (eH-6) and the hole transport material (hH-3) were used in the luminescent layer respectively in place of the electron transport material (eH-1) and hole transport material (hH-1) used in Example 1, and that the electron transport material (HB-3) shown below was used in place of the electron transport material (eH-1) used in the hole blocking layer. This element was evaluated in the same manner as in Example 1. The results thereof are summarized in Tables 3 and 4 together with the value of |EA1|−|EA2| and the value of |WF|−|EA3|.

[Chem. 55]

HB-3

Comparative Example 6

An organic electroluminescence element was produced by the same method as in Example 1, except that the electron transport material (eH-4) shown below was used in the luminescent layer in place of the electron transport material (eH-1) used in Example 1. This element was evaluated in the same manner as in Example 1. The results thereof are summarized in Tables 3 and 4 together with the value of |EA1|−|EA2| and the value of |WF|−|EA3|.

[Chem. 56]

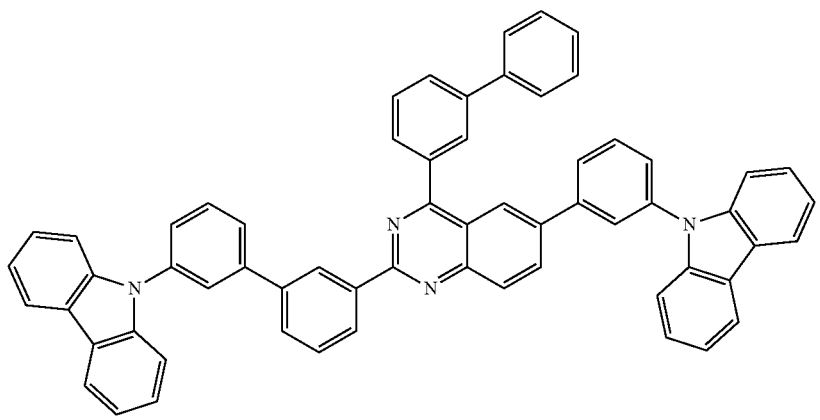

(eH-4)

As apparent from Tables 3 and 4, the results obtained show that no considerable decrease in luminescent characteristics was observed and satisfactory life characteristics were attained, so long as the relationship between the absolute value |EA1| of the electron affinity of the charge transport material, among the charge transport materials contained in the luminescent layer, that served to transport electrons and the absolute value |EA2| of the electron affinity of the charge transport material that was the highest in the absolute value of electron affinity and was contained in the hole blocking layer, which corresponded to the adjoining electron transport layer, satisfied expression (1) and as the relationship between the absolute value |EA3| of the electron affinity of the charge transport material that was the highest in the absolute value of electron affinity and was contained in the cathode-side electron transport layer and the absolute value |WF| of the work function of the cathode satisfied expression (2).

Example 4

An organic electroluminescence element was produced by the same method as in Example 1, except that in the luminescent layer, the luminescent material (D-1) only was used in place of the luminescent materials (D-1) and (D-2) used in Example 1, the electron transport material (eH-5) was used in place of the electron transport material (eH-1) used in Example 1, and the (hH-2) shown below was used in place of the hole transport material (hH-1) used in Example 1, and that the electron transport material (eH-5) was used in the hole blocking layer in place of the electron transport material (eH-1). This element was evaluated in the same manner as in Example 1. The results thereof are summarized in Tables 3 and 4 together with the value of |EA1|−|EA2| and the value of |WF|−|EA3|.

[Chem. 57]

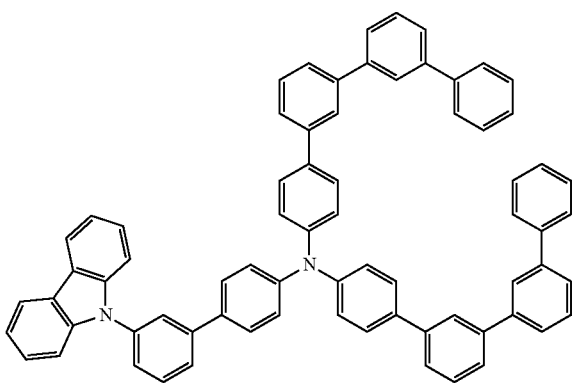

hH-2

Example 5

An organic electroluminescence element was produced by the same method as in Example 4, except that the electron transport material (eH-6) was used in the luminescent layer in place of the electron transport material (eH-5) used in Example 4. This element was evaluated in the same manner as in Example 4. The results thereof are summarized in Tables 3 and 4 together with the value of |EA1|−|EA2| and the value of |WF|−|EA3|.

Example 6

An organic electroluminescence element was produced by the same method as in Example 4, except that the electron transport material (eH-2) was used in the luminescent layer in place of the electron transport material (eH-5) used in Example 4. This element was evaluated in the same manner as in Example 4. The results thereof are summarized in Tables 3 and 4 together with the value of |EA1|−|EA2| and the value of |WF|−|EA3|.

Comparative Example 7

An organic electroluminescence element was produced by the same method as in Example 4, except that the electron transport material (eH-7) and the hole transport material (hH-3) shown below were used in the luminescent layer respectively in place of the electron transport material (eH-5) and hole transport material (hH-2) used in Example 4, and that the electron transport material (eH-1) was used in place of the electron transport material (eH-5) used in the hole blocking layer. This element was evaluated in the same manner as in Example 4. The results thereof are summarized in Tables 3 and 4 together with the value of |EA1|−|EA2| and the value of |WF|−|EA3|.

port material (eH-1) used in the hole blocking layer. This element was evaluated in the same manner as in Comparative Example 7. The results thereof are summarized in Tables 3 and 4 together with the value of |EA1|−|EA2| and the value of |WF|−|EA3|.

Comparative Example 10

An organic electroluminescence element was produced by the same method as in Comparative Example 7, except that

[Chem. 58]

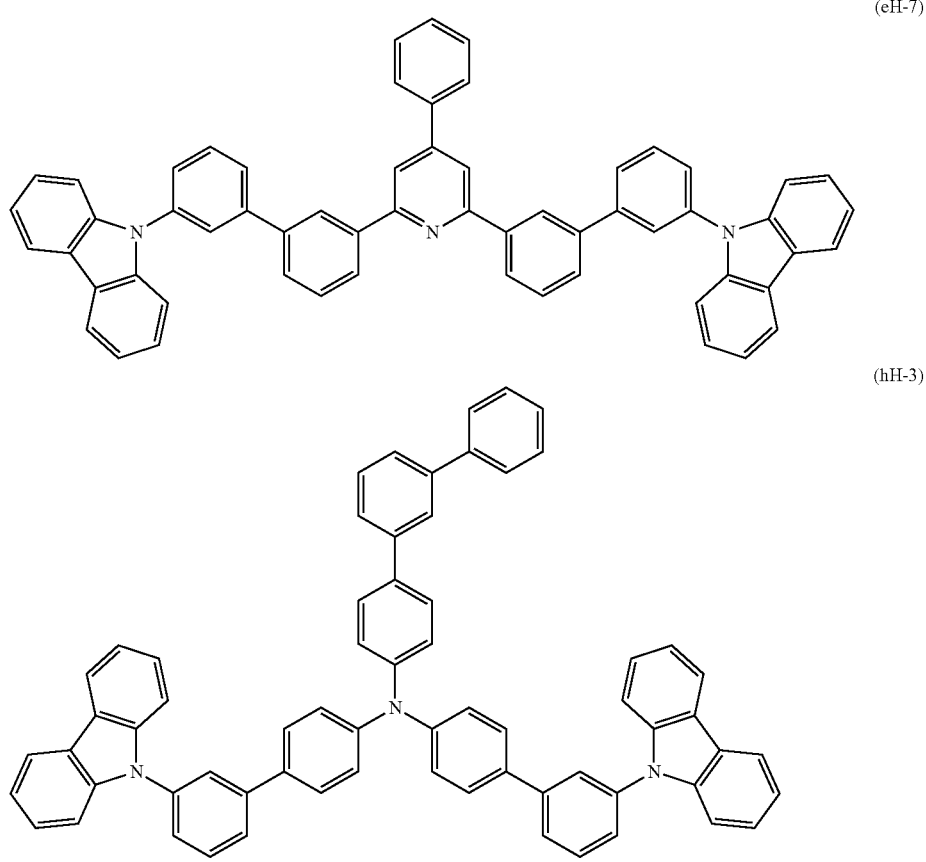

Comparative Example 8

An organic electroluminescence element was produced by the same method as in Comparative Example 7, except that the electron transport material (eH-8) was used in the luminescent layer in place of the electron transport material (eH-7) used in Comparative Example 7. This element was evaluated in the same manner as in Comparative Example 7. The results thereof are summarized in Tables 3 and 4 together with the value of |EA1|−|EA2| and the value of |WF|−|EA3|.

Comparative Example 9

An organic electroluminescence element was produced by the same method as in Comparative Example 7, except that the electron transport material (eH-6) was used in the luminescent layer in place of the electron transport material (eH-7) used in Comparative Example 7, and that the electron transport material (HB-3) was used in place of the electron transthe electron transport material (eH-4) was used in the luminescent layer in place of the electron transport material (eH-7) used in Comparative Example 7. This element was evaluated in the same manner as in Comparative Example 7. The results thereof are summarized in Tables 3 and 4 together with the value of |EA1|−|EA2| and the value of |WF|−|EA3|.

As apparent from Tables 3 and 4, the results obtained show that a clear decrease in operating voltage and an improvement in luminance efficiency were observed and life characteristics were improved, so long as the relationship between the absolute value |EA1| of the electron affinity of the charge transport material, among the charge transport materials contained in the luminescent layer, that served to transport electrons and the absolute value |EA2| of the electron affinity of the charge transport material that was the highest in the absolute value of electron affinity and was contained in the hole blocking layer, which corresponded to the adjoining electron transport layer, satisfied expression (1) and as the relationship between the absolute value |EA3| of the electron affinity of the charge transport material that was the highest in the absolute value of electron affinity and was contained in the cathode-side electron transport layer and the absolute value |WF| of the work function of the cathode satisfied expression (2).

Example 7

An organic electroluminescence element was produced by the same method as in Example 1, except that in the luminescent layer, the (D-3) shown below was used alone in place of the luminescent materials (D-1) and (D-2) used in Example 1, the electron transport material (eH-9) shown below was used alone in place of the electron transport material (eH-1) used in Example 1, and no hole transport material was used, and that the electron transport material (eH-9) shown below was used in the hole blocking layer in place of the (eH-1). This element was evaluated in the same manner as in Example 1. The results thereof are summarized in Tables 3 and 4 together with the value of |EA1|−|EA2| and the value of |WF|−|EA3|.

[Chem. 59]

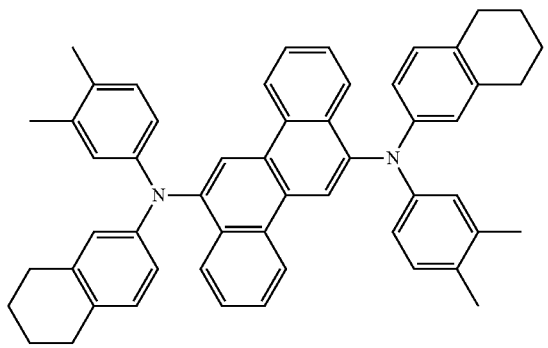

(D-3)

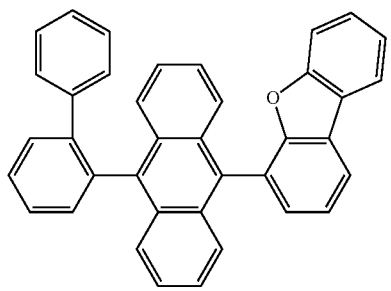

(eH-9)

Example 8

An organic electroluminescence element was produced by the same method as in Example 7, except that the electron transport material (eH-10) shown below was used in the luminescent layer in place of the electron transport material (eH-9) used in Example 7. This element was evaluated in the same manner as in Example 7. The results thereof are summarized in Tables 3 and 4 together with the value of |EA1|−|EA2| and the value of |WF|−|EA3|.

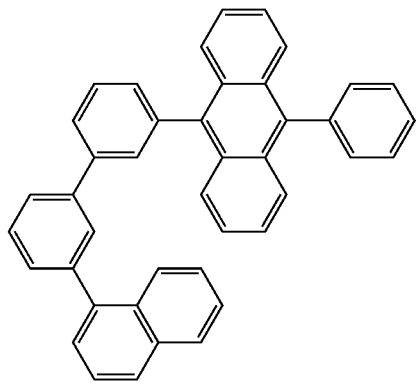

(eH-10)

Example 9

An organic electroluminescence element was produced by the same method as in Example 7, except that the charge transport material (eH-1) was used in the hole blocking layer in place of the charge transport material (eH-9) used in Example 7. This element was evaluated in the same manner as in Example 7. The results thereof are summarized in Tables 3 and 4 together with the value of |EA1|−|EA2| and the value of |WF|−|EA3|.

Comparative Example 11

An organic electroluminescence element was produced by the same method as in Example 7, except that the charge transport material (eH-11) shown below was used in the hole blocking layer in place of the charge transport material (eH-9) used in Example 7. This element was evaluated in the same manner as in Example 7. The results thereof are summarized in Tables 3 and 4 together with the value of |EA1|−|EA2| and the value of |WF|−|EA3|.

[Chem. 61]

(eH-11)

Comparative Example 12

An organic electroluminescence element was produced by the same method as in Example 7, except that the charge transport material (HB-4) shown below was used in the hole blocking layer in place of the charge transport material (eH-9) used in Example 7. This element was evaluated in the same manner as in Example 7. The results thereof are summarized in Tables 3 and 4 together with the value of |EA1|−|EA2| and the value of |WF|−|EA3|.

[Chem. 62]

HB-4

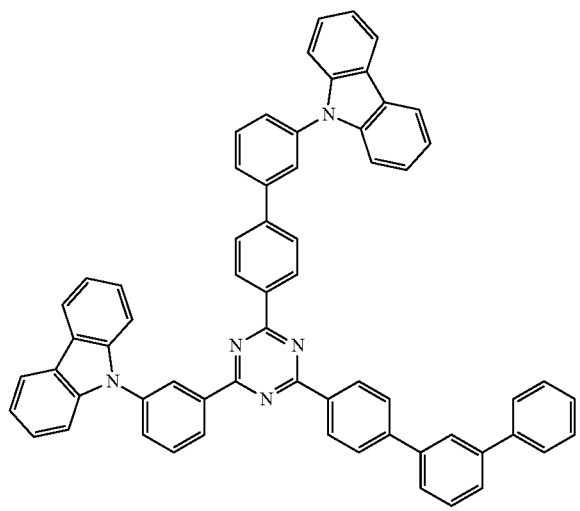

Comparative Example 13

An organic electroluminescence element was produced by the same method as in Example 7, except that the charge transport material (eH-6) was used in the hole blocking layer in place of the charge transport material (eH-9) used in Example 7. This element was evaluated in the same manner as in Example 7. The results thereof are summarized in Tables 3 and 4 together with the value of |EA1|−|EA2| and the value of |WF|−|EA3|.

As apparent from Tables 3 and 4, the results obtained show that satisfactory life characteristics were attained while maintaining a luminescent efficiency, so long as the relationship between the absolute value |EA1| of the electron affinity of the charge transport material, among the charge transport materials contained in the luminescent layer, that served to transport electrons and the absolute value |EA2| of the electron affinity of the charge transport material that was the highest in the absolute value of electron affinity and was contained in the hole blocking layer, which corresponded to the adjoining electron transport layer, satisfied expression (1) and as the relationship between the absolute value |EA3| of the electron affinity of the charge transport material that was the highest in the absolute value of electron affinity and was contained in the cathode-side electron transport layer and the absolute value |WF| of the work function of the cathode satisfied expression (2).

Comparative Example 14

An organic electroluminescence element was produced by the same method as in Example 1, except that the electron transport material (eH-5) was used in the luminescent layer in place of the electron transport material (eH-1) used in Example 1 and the hole transport material (hH-3) was used in the luminescent layer in place of the hole transport material (hH-1), that the electron transport material (eH-3) was used in the hole blocking layer in place of the electron transport material (eH-1), and that the electron transport material (eH-3) was used in the electron transport layer in place of the Alq$_3$. This element was evaluated in the same manner as in Example 1. The results thereof are summarized in Tables 3 and 4 together with the value of |EA1|−|EA2| and the value of |WF|−|EA3|.

Comparative Example 15

An organic electroluminescence element was produced by the same method as in Example 4, except that the hole transport material (hH-3) was used in the luminescent layer in place of the hole transport material (hH-2) used in Example 4, that the electron transport material (eH-3) was used in place of the hole blocking material (eH-5), and that the electron transport material (eH-3) was used in the electron transport layer in place of the electron transport material Alq$_3$. This element was evaluated in the same manner as in Example 4. The results thereof are summarized in Tables 3 and 4 together with the value of |EA1|−|EA2| and the value of |WF|−|EA3|.

Comparative Example 16

An organic electroluminescence element was produced by the same method as in Example 1, except that the hole transport material (hH-3) and the electron transport material (eH-5) were used respectively in place of the hole transport material (hH-1) and electron transport material (eH-1) used in Example 1 to thereby form a luminescent layer, that the electron transport material (eH-3) was used in place of the electron transport material (eH-1) to form a hole blocking layer, and that the electron transport material (eH-3) and LiF were used, in place of the electron transport material Alq$_3$, and simultaneously vapor-deposited in an eH-3/LiF volume ratio of 94/6 to form a layer as an electron transport layer. This element was evaluated in the same manner as in Example 1. The results thereof are summarized in Tables 3 and 4 together with the value of |EA1|−|EA2| and the value of |WF|−|EA3|.

Comparative Example 17

An organic electroluminescence element was produced by the same method as in Example 4, except that the hole transport material (hH-3) was used in place of the hole transport material (hH-2) used in Example 4 to thereby form a luminescent layer, that the electron transport material (eH-3) was used in place of the electron transport material (eH-5) to form a hole blocking layer as described above, and that the electron transport material (eH-3) and LiF were used, in place of the electron transport material Alq$_3$, and simultaneously vapor-deposited in an eH-3/LiF volume ratio of 94/6 to form a layer as an electron transport layer. This element was evaluated in the same manner as in Example 4. The results thereof are summarized in Tables 3 and 4 together with the value of |EA1|−|EA2| and the value of |WF|−|EA3|.

As apparent from Tables 3 and 4, the results obtained show that satisfactory life characteristics were attained while maintaining a luminescent efficiency, so long as the relationship between the absolute value |EA1| of the electron affinity of the charge transport material, among the charge transport materials contained in the luminescent layer, that served to transport electrons and the absolute value |EA2| of the electron affinity of the charge transport material that was the highest in the absolute value of electron affinity and was contained in the hole blocking layer, which corresponded to the adjoining electron transport layer, satisfied expression (1) and as the relationship between the absolute value |EA3| of the electron affinity of the charge transport material that was the highest in the absolute value of electron affinity and was contained in the cathode-side electron transport layer and the absolute value |WF| of the work function of the cathode satisfied expression (2).

While the invention has been described in detail and with reference to specific embodiments thereof, it will be apparent to one skilled in the art that various changes and modifications can be made therein without departing from the spirit and scope thereof. This application is based on a Japanese patent application filed on Jul. 8, 2010 (Application No. 2010-

TABLE 3

| Layer Configuration | Luminescent layer | | | | | Cathode | |EA1| [eV] | |EA2| [eV] | |EA3| [eV] | |WF| [eV] |
|---|---|---|---|---|---|---|---|---|---|---|
| | Luminescent material | Hole transport material | Electron transport material | Hole blocking layer | Electron transport layer | | | | | |
| Example 1 | D-1, D-2 | hH-1 | eH-1 | eH-1 | Alq3 | Al | 2.79 | 2.79 | 3.22 | 4.28 |
| Example 2 | D-1, D-2 | hH-1 | eH-2 | eH-1 | Alq3 | Al | 2.83 | 2.79 | 3.22 | 4.28 |
| Example 3 | D-1, D-2 | hH-1 | eH-1 | eH-5 | Alq3 | Al | 2.79 | 2.69 | 3.22 | 4.28 |
| Comparative Example 1 | D-1, D-2 | hH-1 | eH-3 | eH-1 | Alq3 | Al | 2.58 | 2.79 | 3.22 | 4.28 |
| Comparative Example 2 | D-1, D-2 | hH-3 | eH-3 | HB-1 | Alq3 | Al | 2.58 | 2.63 | 3.22 | 4.28 |
| Comparative Example 3 | D-1, D-2 | hH-3 | eH-6 | HB-2 | Alq3 | Al | 2.75 | 2.77 | 3.22 | 4.28 |
| Comparative Example 4 | D-1, D-2 | hH-3 | eH-8 | eH-5 | Alq3 | Al | 2.66 | 2.69 | 3.22 | 4.28 |
| Comparative Example 5 | D-1, D-2 | hH-3 | eH-6 | HB-3 | Alq3 | Al | 2.75 | 2.85 | 3.22 | 4.28 |
| Comparative Example 6 | D-1, D-2 | hH-1 | eH-4 | eH-1 | Alq3 | Al | 3.04 | 2.79 | 3.22 | 4.28 |
| Example 4 | D-1 | hH-2 | eH-5 | eH-5 | Alq3 | Al | 2.69 | 2.69 | 3.22 | 4.28 |
| Example 5 | D-1 | hH-2 | eH-6 | eH-5 | Alq3 | Al | 2.75 | 2.69 | 3.22 | 4.28 |
| Example 6 | D-1 | hH-2 | eH-2 | eH-5 | Alq3 | Al | 2.83 | 2.69 | 3.22 | 4.28 |
| Comparative Example 7 | D-1 | hH-3 | eH-7 | eH-1 | Alq3 | Al | 2.56 | 2.79 | 3.22 | 4.28 |
| Comparative Example 8 | D-1 | hH-3 | eH-8 | eH-1 | Alq3 | Al | 2.66 | 2.79 | 3.22 | 4.28 |
| Comparative Example 9 | D-1 | hH-3 | eH-6 | HB-3 | Alq3 | Al | 2.75 | 2.85 | 3.22 | 4.28 |
| Comparative Example 10 | D-1 | hH-3 | eH-4 | eH-1 | Alq3 | Al | 3.04 | 2.79 | 3.22 | 4.28 |
| Example 7 | D-3 | none | eH-9 | eH-9 | Alq3 | Al | 2.96 | 2.96 | 3.22 | 4.28 |
| Example 8 | D-3 | none | eH-10 | eH-9 | Alq3 | Al | 3.00 | 2.96 | 3.22 | 4.28 |
| Example 9 | D-3 | none | eH-9 | eH-1 | Alq3 | Al | 2.96 | 2.79 | 3.22 | 4.28 |
| Comparative Example 11 | D-3 | none | eH-9 | eH-11 | Alq3 | Al | 2.96 | 3.25 | 3.22 | 4.28 |
| Comparative Example 12 | D-3 | none | eH-9 | HB-4 | Alq3 | Al | 2.96 | 2.97 | 3.22 | 4.28 |
| Comparative Example 13 | D-3 | none | eH-9 | eH-6 | Alq3 | Al | 2.96 | 2.75 | 3.22 | 4.28 |
| Comparative Example 14 | D-1, D-2 | hH-3 | eH-5 | eH-3 | eH-3 | Al | 2.69 | 2.58 | 2.58 | 4.28 |
| Comparative Example 15 | D-1 | hH-3 | eH-5 | eH-3 | eH-3 | Al | 2.69 | 2.58 | 2.58 | 4.28 |
| Comparative Example 16 | D-1, D-2 | hH-3 | eH-5 | eH-3 | eH-3:LiF | Al | 2.69 | 2.58 | 2.58 | 4.28 |
| Comparative Example 17 | D-1 | hH-3 | eH-5 | eH-3 | eH-3:LiF | Al | 2.69 | 2.58 | 2.58 | 4.28 |

TABLE 4

| Layer configuration | |EA1| − |EA2| [eV] | |WF| − |EA3| [eV] | V1k [V] | L/J1k [cd/A] | η1K [lm/W] | τ70 [kh] |
|---|---|---|---|---|---|---|
| Example 1 | 0.00 | 1.06 | 7.6 | 28.1 | 11.7 | 26.6 |
| Example 2 | 0.04 | 1.06 | 7.7 | 28.4 | 11.6 | 26.6 |
| Example 3 | 0.10 | 1.06 | 7.2 | 27.2 | 11.9 | 33.2 |
| Comparative Example 1 | −0.21 | 1.06 | 7.6 | 25.6 | 10.6 | 15.8 |
| Comparative Example 2 | −0.05 | 1.06 | 7.6 | 23.3 | 8.1 | 16.0 |
| Comparative Example 3 | −0.02 | 1.06 | 7.6 | 27.7 | 11.7 | 15.6 |
| Comparative Example 4 | −0.03 | 1.06 | 7.6 | 29.6 | 11.9 | 15.6 |
| Comparative Example 5 | −0.10 | 1.06 | 7.6 | 23.4 | 9.4 | 14.9 |
| Comparative Example 6 | 0.25 | 1.06 | 7.6 | 28.3 | 12.0 | 16.6 |
| Example 4 | 0.00 | 1.06 | 7.6 | 47.9 | 19.3 | 10.1 |
| Example 5 | 0.06 | 1.06 | 7.6 | 45.2 | 19.4 | 12.6 |
| Example 6 | 0.14 | 1.06 | 7.6 | 45.3 | 18.3 | 10.8 |
| Comparative Example 7 | −0.23 | 1.06 | 7.6 | 25.1 | 8.4 | 0.5 |
| Comparative Example 8 | −0.13 | 1.06 | 7.6 | 40.6 | 14.9 | 5.3 |
| Comparative Example 9 | −0.10 | 1.06 | 7.6 | 38.3 | 16.0 | 7.4 |
| Comparative Example 10 | 0.25 | 1.06 | 7.6 | 27.1 | 9.6 | 0.6 |
| Example 7 | 0.00 | 1.06 | 7.6 | 6.0 | 2.5 | 2.2 |
| Example 8 | 0.04 | 1.06 | 7.6 | 6.1 | 2.4 | 2.2 |
| Example 9 | 0.17 | 1.06 | 7.6 | 6.3 | 2.4 | 1.3 |
| Comparative Example 11 | −0.29 | 1.06 | 7.6 | 5.9 | 2.5 | 0.7 |
| Comparative Example 12 | −0.01 | 1.06 | 7.6 | 5.1 | 1.7 | 1.0 |
| Comparative Example 13 | 0.21 | 1.06 | 7.6 | 5.6 | 2.2 | 0.8 |
| Comparative Example 14 | 0.11 | 1.70 | 7.6 | 22.9 | 5.9 | <0.1 |
| Comparative Example 15 | 0.11 | 1.70 | 7.6 | 41.3 | 11.4 | 0.1 |
| Comparative Example 16 | 0.11 | 1.70 | 7.6 | 6.9 | 1.5 | <0.1 |
| Comparative Example 17 | 0.11 | 1.70 | 7.6 | 24.9 | 5.1 | <0.1 |

155918), the contents thereof being incorporated herein by reference.

DESCRIPTION OF THE REFERENCE NUMERALS

1 Substrate
2 Anode
3 Hole injection layer
4 Hole transport layer
5 Luminescent layer
6 Hole blocking layer
7 Electron transport layer
8 Electron injection layer
9 Cathode
10 Organic electroluminescence element

The invention claimed is:

1. An organic electroluminescence element which comprises an anode, a luminescent layer, two or more electron transport layers and a cathode, in this order, wherein
at least one of the two or more electron transport layers adjoins the luminescent layer,
the luminescent layer contains a luminescent material and a charge transport material,
the electron transport layer which adjoins the luminescent layer contains a charge transport material,
the charge transport material contained in the luminescent layer and the charge transport material contained in the electron transport layer which adjoins the luminescent layer may be the same material or may be different material,
when an electron affinity of the charge transport material which serves to transport electrons, among the charge transport materials contained in the luminescent layer, is expressed by EA1, and an electron affinity of the charge transport material which is the highest in an absolute value of electron affinity, among the charge transport materials contained in the electron transport layer that adjoins the luminescent layer, is expressed by EA2, then EA1 and EA2 satisfy the relationship represented by the following expression (1), and
when an electron affinity of the charge transport material which is the highest in an absolute value of electron affinity, among the charge transport materials contained in the electron transport layer located on the most cathode side among the two or more electron transport layers, is expressed by EA3, and a work function of the cathode is expressed by WF, then EA3 and WF satisfy the relationship represented by the following expression (2):

$$0.00\ eV \leq |EA1| - |EA2| \leq 0.20\ eV \quad \text{Expression (1)}$$

$$-1.60\ eV \leq |WF| - |EA3| \leq 1.60\ eV \quad \text{Expression (2)}.$$

2. The organic electroluminescence element according to claim 1, wherein the electron affinity EA1 and the electron affinity EA2 satisfy the relationship represented by the following expression (3):

$$0.00\ eV < |EA1| - |EA2| \leq 0.20\ eV \quad \text{Expression (3)}.$$

3. The organic electroluminescence element according to claim 1 or 2, wherein the electron affinity EA3 and the work function WF satisfy the relationship represented by the following expression (4):

$$0.00\ eV \leq |WF| - |EA3| \leq 1.60\ eV \quad \text{Expression (4)}.$$

4. The organic electroluminescence element according to claim 1 or 2, wherein the electron transport layer which adjoins the luminescent layer contains a charge transport material that is different from the charge transport material contained in the luminescent layer.

5. The organic electroluminescence element according to claim 1 or 2, wherein the luminescent layer is a layer formed by a wet film formation method.

6. An organic electroluminescence device which comprises a substrate and, disposed thereon, two or more organic electroluminescence elements that have a different color of luminescence from each other, wherein
at least one of the organic electroluminescence elements is the organic electroluminescence element according to claim 1 or 2.

7. The organic electroluminescence device according to claim 6, wherein all of the organic electroluminescence elements are the organic electroluminescence element according to claim 1 or 2.

8. The organic electroluminescence device according to claim 6, wherein the electron transport layers adjoining the luminescent layer in at least two of the organic electroluminescence elements are identical.

9. An organic EL display which comprises the organic electroluminescence element according to claim 1 or 2.

10. An organic EL lighting which comprises the organic electroluminescence element according to claim 1 or 2.

* * * * *